United States Patent
Yamazaki et al.

(10) Patent No.: US 9,929,281 B2
(45) Date of Patent: *Mar. 27, 2018

(54) TRANSISITOR COMPRISING OXIDE SEMICONDUCTOR

(71) Applicant: Semiconductor Energy Laboratory Co., Ltd., Atsugi-shi, Kanagawa-ken (JP)

(72) Inventors: Shunpei Yamazaki, Tokyo (JP); Hiroyuki Miyake, Kanagawa (JP); Masashi Tsubuku, Kanagawa (JP); Kosei Noda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/249,570

(22) Filed: Aug. 29, 2016

(65) Prior Publication Data

US 2017/0054034 A1  Feb. 23, 2017

Related U.S. Application Data

(63) Continuation of application No. 14/628,439, filed on Feb. 23, 2015, now Pat. No. 9,431,546, which is a
(Continued)

(30) Foreign Application Priority Data

Oct. 21, 2009  (JP) ................... 2009-242758
Jan. 22, 2010  (JP) ................... 2010-012617

(51) Int. Cl.
*H01L 29/786* (2006.01)
*H01L 21/84* (2006.01)
(Continued)

(52) U.S. Cl.
CPC ........ *H01L 29/78696* (2013.01); *H01L 21/84* (2013.01); *H01L 27/105* (2013.01);
(Continued)

(58) Field of Classification Search
CPC ....... H01L 29/789; H01L 29/66; H01L 27/12; H01L 29/24; H01L 27/105; H01L 21/84; H02M 3/158

See application file for complete search history.

(56) References Cited

U.S. PATENT DOCUMENTS 3,790,935 A   2/1974  Luff
5,124,768 A   6/1992  Mano et al.
(Continued)

FOREIGN PATENT DOCUMENTS

EP   1737044 A   12/2006
EP   2226847 A    9/2010
(Continued)

OTHER PUBLICATIONS

International Search Report (Application No. PCT/JP2010/068787) dated Jan. 11, 2011.
(Continued)

*Primary Examiner* — Emily P Pham
(74) *Attorney, Agent, or Firm* — Fish & Richardson P.C.

(57) ABSTRACT

A transistor includes a gate, a source, and a drain, the gate is electrically connected to the source or the drain, a first signal is input to one of the source and the drain, and an oxide semiconductor layer whose carrier concentration is $5 \times 10^{14}/cm^3$ or less is used for a channel formation layer. A capacitor includes a first electrode and a second electrode, the first electrode is electrically connected to the other of the source and the drain of the transistor, and a second signal which is a clock signal is input to the second electrode. A voltage of the first signal is stepped up or down to obtain a
(Continued)

third signal which is output as an output signal through the other of the source and the drain of the transistor.

17 Claims, 24 Drawing Sheets

Related U.S. Application Data continuation of application No. 12/909,556, filed on Oct. 21, 2010, now Pat. No. 8,963,517.

(51) Int. Cl.
*H01L 27/105* (2006.01)
*H02M 3/07* (2006.01)
*H01L 27/12* (2006.01)
*H01L 29/24* (2006.01)
*H01L 29/66* (2006.01)
*H02M 3/158* (2006.01)

(52) U.S. Cl.
CPC ........ *H01L 27/124* (2013.01); *H01L 27/1225* (2013.01); *H01L 27/1255* (2013.01); *H01L 29/24* (2013.01); *H01L 29/66969* (2013.01); *H01L 29/7869* (2013.01); *H02M 3/073* (2013.01); *H02M 3/158* (2013.01)

(56) References Cited

U.S. PATENT DOCUMENTS

| | | | |
|---|---|---|---|
| 5,162,901 A | 11/1992 | Shimada et al. | |
| 5,247,375 A | 9/1993 | Mochizuki et al. | |
| 5,294,555 A | 3/1994 | Mano et al. | |
| 5,432,527 A | 7/1995 | Yanai et al. | |
| 5,534,884 A | 7/1996 | Mase et al. | |
| 5,554,861 A | 9/1996 | Mano et al. | |
| 5,698,864 A | 12/1997 | Mano et al. | |
| 5,731,856 A | 3/1998 | Kim et al. | |
| 5,736,751 A | 4/1998 | Mano et al. | |
| 5,744,864 A | 4/1998 | Cillessen et al. | |
| 5,767,832 A | 6/1998 | Koyama et al. | |
| 5,894,151 A | 4/1999 | Yamazaki et al. | |
| 5,982,471 A | 11/1999 | Hirakata et al. | |
| 6,232,195 B1 | 5/2001 | Yang | |
| 6,242,777 B1 | 6/2001 | Mano et al. | |
| 6,294,274 B1 | 9/2001 | Kawazoe et al. | |
| 6,294,796 B1 | 9/2001 | Mano et al. | |
| 6,332,198 B1 | 12/2001 | Simons et al. | |
| 6,400,211 B1 | 6/2002 | Yokomizo et al. | |
| 6,518,557 B1 | 2/2003 | Izumi et al. | |
| 6,563,174 B2 | 5/2003 | Kawasaki et al. | |
| 6,580,127 B1 | 6/2003 | Andry et al. | |
| 6,639,910 B1 | 10/2003 | Provencher et al. | |
| 6,654,903 B1 | 11/2003 | Sullivan, Jr. et al. | |
| 6,658,579 B1 | 12/2003 | Bell et al. | |
| 6,658,580 B1 | 12/2003 | Bell et al. | |
| 6,727,522 B1 | 4/2004 | Kawasaki et al. | |
| 6,760,339 B1 | 7/2004 | Noel et al. | |
| 6,781,109 B2 | 8/2004 | Izumi et al. | |
| 6,868,092 B1 | 3/2005 | Bell et al. | |
| 6,876,652 B1 | 4/2005 | Bell et al. | |
| 6,880,086 B2 | 4/2005 | Kidder et al. | |
| 6,930,890 B1 | 8/2005 | Branscomb | |
| 6,934,749 B1 | 8/2005 | Black et al. | |
| 6,953,951 B2 | 10/2005 | Yamazaki et al. | |
| 7,039,046 B1 | 5/2006 | Simons et al. | |
| 7,049,190 B2 | 5/2006 | Takeda et al. | |
| 7,054,272 B1 | 5/2006 | Noel et al. | |
| 7,061,014 B2 | 6/2006 | Hosono et al. | |
| 7,064,346 B2 | 6/2006 | Kawasaki et al. | |
| 7,072,193 B2 | 7/2006 | Lin | |
| 7,094,640 B2 * | 8/2006 | Hshieh ................ H01L 29/7813 438/212 | |
| 7,105,868 B2 | 9/2006 | Nause et al. | |
| 7,111,053 B1 | 9/2006 | Black et al. | |
| 7,141,835 B2 | 11/2006 | Kihara | |
| 7,142,770 B2 | 11/2006 | Yoshida | |
| 7,143,153 B1 | 11/2006 | Black et al. | |
| 7,211,825 B2 | 5/2007 | Shih et al. | |
| 7,222,147 B1 | 5/2007 | Black et al. | |
| 7,240,364 B1 | 7/2007 | Branscomb et al. | |
| 7,263,597 B2 | 8/2007 | Everdell et al. | |
| 7,265,412 B2 | 9/2007 | Kihara | |
| 7,266,595 B1 | 9/2007 | Black et al. | |
| 7,280,529 B1 | 10/2007 | Black et al. | |
| 7,282,782 B2 | 10/2007 | Hoffman et al. | |
| 7,286,108 B2 | 10/2007 | Tsuda et al. | |
| 7,297,977 B2 | 11/2007 | Hoffman et al. | |
| 7,321,353 B2 | 1/2008 | Tsuda et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,418,173 B2 | 8/2008 | Abe et al. | |
| 7,443,202 B2 | 10/2008 | Kimura et al. | |
| 7,453,065 B2 | 11/2008 | Saito et al. | |
| 7,453,087 B2 | 11/2008 | Iwasaki | |
| 7,459,352 B2 | 12/2008 | Yamazaki et al. | |
| 7,462,862 B2 | 12/2008 | Hoffman et al. | |
| 7,468,304 B2 | 12/2008 | Kaji et al. | |
| 7,495,501 B2 | 2/2009 | Iwabuchi et al. | |
| 7,501,293 B2 | 3/2009 | Ito et al. | |
| 7,505,026 B2 | 3/2009 | Baba et al. | |
| 7,601,984 B2 | 10/2009 | Sano et al. | |
| 7,643,115 B2 | 1/2010 | Sato et al. | |
| 7,663,607 B2 | 2/2010 | Hotelling et al. | |
| 7,674,650 B2 | 3/2010 | Akimoto et al. | |
| 7,692,610 B2 | 4/2010 | Kimura | |
| 7,732,819 B2 | 6/2010 | Akimoto et al. | |
| 7,741,898 B2 | 6/2010 | Hsu | |
| 7,749,825 B2 | 7/2010 | Honda | |
| 7,767,106 B2 | 8/2010 | Chang | |
| 7,791,072 B2 | 9/2010 | Kumomi et al. | |
| 7,791,074 B2 | 9/2010 | Iwasaki | |
| 7,804,088 B2 | 9/2010 | Tanaka et al. | |
| 7,868,326 B2 | 1/2011 | Sano et al. | |
| 7,910,490 B2 | 3/2011 | Akimoto et al. | |
| 7,915,650 B2 | 3/2011 | Lee et al. | |
| 7,924,276 B2 | 4/2011 | Tsuda et al. | |
| 7,932,521 B2 | 4/2011 | Akimoto et al. | |
| 7,998,372 B2 | 8/2011 | Yano et al. | |
| 8,049,210 B2 | 11/2011 | Aoki et al. | |
| 8,143,115 B2 | 3/2012 | Omura et al. | |
| 8,148,721 B2 | 4/2012 | Hayashi et al. | |
| 8,168,974 B2 | 5/2012 | Sano et al. | |
| 8,193,045 B2 | 6/2012 | Omura et al. | |
| 8,202,365 B2 | 6/2012 | Umeda et al. | |
| 8,207,944 B2 | 6/2012 | Geaghan | |
| 8,217,913 B2 | 7/2012 | Hotelling et al. | |
| 8,222,098 B2 | 7/2012 | Honda | |
| 8,243,027 B2 | 8/2012 | Hotelling et al. | |
| 8,274,077 B2 | 9/2012 | Akimoto et al. | |
| 8,294,677 B2 | 10/2012 | Wu et al. | |
| 8,384,077 B2 | 2/2013 | Yano et al. | |
| 8,405,634 B2 | 3/2013 | Lin et al. | |
| 8,415,198 B2 | 4/2013 | Itagaki et al. | |
| 8,421,135 B2 | 4/2013 | Yamazaki et al. | |
| 8,466,463 B2 | 6/2013 | Akimoto et al. | |
| 8,502,217 B2 | 8/2013 | Sato et al. | |
| 8,530,246 B2 | 9/2013 | Ofuji et al. | |
| 8,542,164 B2 | 9/2013 | Kimura | |
| 8,629,069 B2 | 1/2014 | Akimoto et al. | |
| 8,669,550 B2 | 3/2014 | Akimoto et al. | |
| 8,698,717 B2 | 4/2014 | Arasawa et al. | |
| 8,785,240 B2 | 7/2014 | Watanabe | |
| 8,785,990 B2 | 7/2014 | Honda | |
| 8,790,959 B2 | 7/2014 | Akimoto et al. | |
| 8,796,069 B2 | 8/2014 | Akimoto et al. | |
| 8,946,005 B2 | 2/2015 | Lee et al. | |
| 9,269,725 B2 * | 2/2016 | Yamazaki | |
| 9,312,393 B2 | 4/2016 | Honda | |
| 2001/0028060 A1 | 10/2001 | Yamazaki et al. | |
| 2001/0046027 A1 | 11/2001 | Tai et al. | |

(56) References Cited

U.S. PATENT DOCUMENTS

| | | |
|---|---|---|
| 2002/0001307 A1 | 1/2002 | Nguyen et al. |
| 2002/0034082 A1 | 3/2002 | Yokomizo et al. |
| 2002/0047120 A1 | 4/2002 | Inukai |
| 2002/0056838 A1 | 5/2002 | Ogawa |
| 2002/0057018 A1 | 5/2002 | Branscomb et al. |
| 2002/0116485 A1 | 8/2002 | Black et al. |
| 2002/0118031 A1 | 8/2002 | Sweeney et al. |
| 2002/0132454 A1 | 9/2002 | Ohtsu et al. |
| 2002/0165961 A1 | 11/2002 | Everdell et al. |
| 2002/0180673 A1 | 12/2002 | Tsuda et al. |
| 2003/0053791 A1 | 3/2003 | Yoshida |
| 2003/0120822 A1 | 6/2003 | Langrind et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0056832 A1 | 3/2004 | Abe |
| 2004/0127038 A1 | 7/2004 | Carcia et al. |
| 2005/0017302 A1 | 1/2005 | Hoffman |
| 2005/0140632 A1 | 6/2005 | Tsuda et al. |
| 2005/0168491 A1 | 8/2005 | Takahara et al. |
| 2005/0199959 A1 | 9/2005 | Chiang et al. |
| 2005/0200300 A1 | 9/2005 | Yumoto |
| 2005/0258810 A1 | 11/2005 | Lin |
| 2005/0269961 A1 | 12/2005 | Shibusawa et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1* | 5/2006 | Saito ............... H01L 27/14601 250/338.4 |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0001958 A1 | 1/2007 | Lee et al. |
| 2007/0024187 A1 | 2/2007 | Shin et al. |
| 2007/0024547 A1 | 2/2007 | Jang et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0058418 A1 | 3/2007 | Kihara |
| 2007/0080905 A1 | 4/2007 | Takahara |
| 2007/0087492 A1 | 4/2007 | Yamanaka |
| 2007/0090365 A1 | 4/2007 | Hayashi et al. |
| 2007/0108446 A1 | 5/2007 | Akimoto |
| 2007/0120785 A1 | 5/2007 | Kimura |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0001857 A1 | 1/2008 | Yoo |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0055218 A1 | 3/2008 | Tsuda et al. |
| 2008/0062140 A1 | 3/2008 | Hotelling et al. |
| 2008/0062148 A1 | 3/2008 | Hotelling et al. |
| 2008/0068359 A1 | 3/2008 | Yoshida et al. |
| 2008/0073653 A1 | 3/2008 | Iwasaki |
| 2008/0083950 A1 | 4/2008 | Pan et al. |
| 2008/0099803 A1 | 5/2008 | Li et al. |
| 2008/0106191 A1 | 5/2008 | Kawase |
| 2008/0122783 A1 | 5/2008 | Jung et al. |
| 2008/0128689 A1 | 6/2008 | Lee et al. |
| 2008/0129195 A1 | 6/2008 | Ishizaki et al. |
| 2008/0166475 A1* | 7/2008 | Jeong ............... H01L 29/7869 427/126.3 |
| 2008/0166834 A1 | 7/2008 | Kim et al. |
| 2008/0174360 A1* | 7/2008 | Hsu ............... H02M 3/073 327/536 |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0277663 A1 | 11/2008 | Kang et al. |
| 2008/0284710 A1 | 11/2008 | Kimura et al. |
| 2008/0284970 A1 | 11/2008 | Ishitani |
| 2008/0296568 A1 | 12/2008 | Ryu et al. |
| 2008/0308805 A1 | 12/2008 | Akimoto et al. |
| 2009/0015536 A1 | 1/2009 | Takeoka et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0085891 A1 | 4/2009 | Yang et al. |
| 2009/0086511 A1 | 4/2009 | Lin |
| 2009/0109143 A1 | 4/2009 | Yamazaki et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0155940 A1 | 6/2009 | Lee et al. |
| 2009/0201231 A1 | 8/2009 | Takahara et al. |
| 2009/0206332 A1 | 8/2009 | Son et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2009/0305461 A1* | 12/2009 | Akimoto ............... H01L 27/1225 438/104 |
| 2010/0001259 A1 | 1/2010 | Saitho et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0134452 A1 | 6/2010 | Katoh et al. |
| 2010/0140609 A1 | 6/2010 | Yano et al. |
| 2010/0149138 A1 | 6/2010 | Lee et al. |
| 2010/0163860 A1 | 7/2010 | Yano et al. |
| 2010/0214261 A1 | 8/2010 | Yamanaka et al. |
| 2010/0276689 A1 | 11/2010 | Iwasaki |
| 2010/0279462 A1 | 11/2010 | Iwasaki |
| 2010/0309183 A1 | 12/2010 | Mizusako |
| 2011/0037747 A1 | 2/2011 | Lee |
| 2011/0076790 A1 | 3/2011 | Ofuji et al. |
| 2011/0090183 A1 | 4/2011 | Yamazaki et al. |
| 2011/0101351 A1 | 5/2011 | Yamazaki |
| 2011/0101942 A1 | 5/2011 | Yamazaki et al. |
| 2011/0104851 A1 | 5/2011 | Akimoto et al. |
| 2011/0121290 A1 | 5/2011 | Akimoto et al. |
| 2011/0140108 A1 | 6/2011 | Kimura et al. |
| 2011/0148455 A1 | 6/2011 | Kato et al. |
| 2011/0148826 A1 | 6/2011 | Koyama et al. |
| 2011/0148846 A1 | 6/2011 | Arasawa et al. |
| 2011/0149185 A1 | 6/2011 | Yamazaki |
| 2011/0157216 A1 | 6/2011 | Yamazaki et al. |
| 2011/0175883 A1 | 7/2011 | Toyotaka et al. |
| 2011/0175894 A1 | 7/2011 | Wakimoto et al. |
| 2011/0180794 A1 | 7/2011 | Yamazaki |
| 2011/0181806 A1 | 7/2011 | Yamazaki |
| 2011/0267303 A1 | 11/2011 | Chen et al. |
| 2011/0290631 A1 | 12/2011 | Kuriki |
| 2012/0168750 A1 | 7/2012 | Hayashi et al. |
| 2013/0146452 A1 | 6/2013 | Yano et al. |

(56) References Cited

U.S. PATENT DOCUMENTS

| | | |
|---|---|---|
| 2013/0187165 A1 | 7/2013 | Yamazaki et al. |
| 2015/0084048 A1 | 3/2015 | Hayashi et al. |
| 2016/0155761 A1 | 6/2016 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-156676 A | 6/1990 |
| JP | 05-251705 A | 9/1993 |
| JP | 08-264794 A | 10/1996 |
| JP | 10-133227 A | 5/1998 |
| JP | 11-505377 | 5/1999 |
| JP | 2000-044236 A | 2/2000 |
| JP | 2000-150900 A | 5/2000 |
| JP | 2001-148483 A | 5/2001 |
| JP | 2002-076356 A | 3/2002 |
| JP | 2002-171748 A | 6/2002 |
| JP | 2002-202734 A | 7/2002 |
| JP | 2002-289859 A | 10/2002 |
| JP | 2003-086000 A | 3/2003 |
| JP | 2003-086808 A | 3/2003 |
| JP | 2003-158133 A | 5/2003 |
| JP | 2004-006686 A | 1/2004 |
| JP | 2004-103957 A | 4/2004 |
| JP | 2004-273614 A | 9/2004 |
| JP | 2004-273732 A | 9/2004 |
| JP | 2006-165527 A | 6/2006 |
| JP | 2006-165528 A | 6/2006 |
| JP | 2006-165529 A | 6/2006 |
| JP | 2006-173580 A | 6/2006 |
| JP | 2007-073563 A | 3/2007 |
| JP | 2007-103918 A | 4/2007 |
| JP | 2007-134687 A | 5/2007 |
| JP | 2008-053356 A | 3/2008 |
| JP | 2008-166716 A | 7/2008 |
| JP | 2008-277665 A | 11/2008 |
| JP | 2008-278752 A | 11/2008 |
| JP | 2008-281988 A | 11/2008 |
| JP | 2009-004757 A | 1/2009 |
| JP | 2009-099847 A | 5/2009 |
| JP | 2009-135380 A | 6/2009 |
| JP | 2009-141002 A | 6/2009 |
| JP | 2009-176828 A | 8/2009 |
| JP | 2008/117739 | 7/2010 |
| JP | 5036293 | 9/2012 |
| TW | 200832877 | 8/2008 |
| WO | WO-2004/114391 | 12/2004 |
| WO | WO-2006/051995 | 5/2006 |
| WO | WO-2007/029844 | 3/2007 |
| WO | WO-2007/043493 | 4/2007 |
| WO | WO-2007/148653 | 12/2007 |
| WO | WO-2008/023553 | 2/2008 |
| WO | WO-2008/069056 | 6/2008 |
| WO | WO-2008/069255 | 6/2008 |
| WO | WO-2008/126879 | 10/2008 |
| WO | WO-2009/028394 | 3/2009 |
| WO | WO-2009/072532 | 6/2009 |
| WO | WO-2009/075281 | 6/2009 |

OTHER PUBLICATIONS

Written Opinion (Application No. PCT/JP2010/068787) dated Jan. 11, 2011.

Kim.S et al., "High-Performance oxide thin film transistors passivated by various gas plasmas", 214th ECS Meeting, 2008, No. 2317, ECS.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Janotti.A et al., "Oxygen Vacancies in ZnO", Appl. Phys. Lett. (Applied Physics Letters) , 2005, vol. 87, pp. 122102-1-122102-3.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262103-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Tsuda.K et al., "Ultra Low Power Consumption Technologies for Mobile TFT-LCDs", IDW '02 : Proceedings of the 9th International Display Workshops, Dec. 4, 2002, pp. 295-298.

Lee.H et al., "Current Status of, Challenges to, and Perspective View of AM-OLED", IDW '06 : Proceedings of the 13th International Display Workshops, Dec. 7, 2006, pp. 663-666.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Mo.Y et al., "Amorphous Oxide TFT Backplanes for Large Size AMOLED Displays", IDW '08 : Proceedings of the 6th International Display Workshops, Dec. 3, 2008, pp. 581-584.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Park.J et al., "High performance amorphous oxide thin film transistors with self-aligned top-gate structure", IEDM 09: Technical Digest of International Electron Devices Meeting, Dec. 7, 2009, pp. 191-194.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

(56) References Cited

OTHER PUBLICATIONS

Park.S et al., "Challenge to Future Displays: Transparent AM-OLED Driven by Peald Grown ZnO TFT", IMID '07 Digest, 2007, pp. 1249-1252.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kurokawa.Y et al., "UHF RFCPUS on Flexible and Glass Substrates for Secure RFID Systems", Journal of Solid-State Circuits, 2008, vol. 43, No. 1, pp. 292-299.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Nomura.K et al., "Amorphous Oxide Semiconductors for High-Performance Flexible Thin-Film Transistors", JPN. J. Appl. Phys. (Japanese Journal of Applied Physics), 2006, vol. 45, No. 5B, pp. 4303-4308.

Kitzerow.H et al., "Observation of Blue Phases in Chiral Networks", Liquid Crystals, 1993, vol. 14, No. 3, pp. 911-916.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Kikuchi.H et al., "Polymer-Stabilized Liquid Crystal Blue Phases", Nature Materials, Sep. 2, 2002, vol. 1, pp. 64-68.

Nakamura.M, "Synthesis of Homologous Compound with New Long-Period Structure", Nirim Newsletter, Mar. 1, 1995, vol. 150, pp. 1-4.

Orita.M et al., "Amorphous transparent conductive oxide InGaO3(ZnO)m (m<4):a Zn4s conductor", Philosophical Magazine, 2001, vol. 81, No. 5, pp. 501-515.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Oba.F et al., "Defect energetics in ZnO: A hybrid Hartree-Fock density functional study", Phys. Rev. B (Physical Review. B), 2008, vol. 77, pp. 245202-1-245202-6.

Janotti.A et al., "Native Point Defects in ZnO", Phys. Rev. B (Physical Review. B), Oct. 4, 2007, vol. 76, No. 16, pp. 165202-1-165202-22.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Hsieh.H et al., "P-29:Modeling of Amorphous Oxide Semiconductor Thin Film Transistors and Subgap Density of States", SID Digest '08 : SID International Symposium of Digest of Technical Papers, May 20, 2008, vol. 39, pp. 1277-1280.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Clark.S et al., "First Principles Methods Using CASTEP", Zeitschrift fur Kristallographie, 2005, vol. 220, pp. 567-570.

Japanese Office Action (Application No. 2010-233517) dated Dec. 16, 2014.

Taiwanese Office Action (Application No. 099135742) dated Aug. 5, 2015.

Taiwanese Office Action (Application No. 105128483) dated Feb. 23, 2017.

\* cited by examiner

TRANSISITOR COMPRISING OXIDE SEMICONDUCTOR

CROSS-REFERENCE TO RELATED APPLICATIONS

This application is a continuation of U.S. application Ser. No. 14/628,439, filed Feb. 23, 2015, now allowed, which is a continuation of U.S. application Ser. No. 12/909,556, filed Oct. 21, 2010, now U.S. Pat. No. 8,963,517, which claims the benefit of foreign priority applications filed in Japan as Serial No. 2009-242758 on Oct. 21, 2009, and Serial No. 2010-012617 on Jan. 22, 2010, all of which are incorporated by reference.

TECHNICAL FIELD

An embodiment of the present invention relates to a voltage regulator circuit including a transistor which includes an oxide semiconductor.

BACKGROUND ART

A technique for forming a thin film transistor (TFT) by using a thin semiconductor film formed over a substrate having an insulating surface has attracted attention. A thin film transistor is used for a display device typified by a liquid crystal television. A silicon-based semiconductor material is known as a material for a thin semiconductor film applicable to a thin film transistor. Other than a silicon-based semiconductor material, an oxide semiconductor has attracted attention.

As a material for the oxide semiconductor, zinc oxide and a material containing zinc oxide as its component are known. Further, a thin film transistor formed using an amorphous oxide (oxide semiconductor) having an electron carrier concentration of less than $10^{18}/cm^3$ is disclosed (Patent Documents 1 to 3).

REFERENCE

Patent Document

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

However, a difference from the stoichiometric composition in the oxide semiconductor arises in a thin film formation process. For example, electrical conductivity of the oxide semiconductor changes due to the excess or deficiency of oxygen. Further, hydrogen that enters the thin oxide semiconductor film during the formation of the thin film forms an oxygen (O)-hydrogen (H) bond and serves as an electron donor, which is a factor of changing electrical conductivity. Furthermore, since the O—H bond is a polar molecule, it serves as a factor of varying the characteristics of an active device such as a thin film transistor manufactured using an oxide semiconductor.

Even when having an electron carrier concentration of less than $10^{18}/cm^3$, an oxide semiconductor is a substantially n-type oxide semiconductor. Therefore, the on-off ratio of the thin film transistors disclosed in Patent Documents 1 to 3 is only the order of $10^3$. Such a low on-off ratio of the thin film transistor is due to large off current.

When a voltage regulator circuit such as a step-up circuit is formed with the use of a transistor whose off current is large, current flows through the transistor even when the transistor is not operated; thus, conversion efficiency to obtain a desired voltage could be lowered, for example.

In view of the above, it is an object of an embodiment of the present invention to provide a thin film transistor whose electric characteristics are stable (for example, a thin film transistor whose off current is significantly reduced). In addition, it is an object to improve conversion efficiency to obtain a desired voltage in a voltage regulator circuit.

According to an embodiment of the present invention, a voltage regulator circuit such as a step-up circuit or a step-down circuit is formed with the use of a transistor including an oxide semiconductor as a channel formation layer. The oxide semiconductor has a lager energy gap than a silicon semiconductor and is an intrinsic or a substantially intrinsic semiconductor that is highly purified through removal of an impurity serving as an electron donor. With this structure, in the transistor, leakage current in an off state (off current) can be reduced. Further, with the reduction in off current of the transistor, conversion efficiency to obtain a desired voltage can be improved.

The concentration of hydrogen contained in the oxide semiconductor is less than or equal to $5\times10^{19}/cm^3$, preferably less than or equal to $5\times10^{18}/cm^3$, more preferably less than or equal to $5\times10^{17}/cm^3$. In addition, hydrogen or an O—H bond contained in the oxide semiconductor is removed. Further, the carrier concentration is less than or equal to $5\times10^{14}/cm^3$, preferably less than or equal to $5\times10^{12}/cm^3$.

The energy gap is set to greater than or equal to 2 eV, preferably greater than or equal to 2.5 eV, more preferably greater than or equal to 3 eV to reduce as much impurities (e.g., hydrogen), which form donors, as possible. Further, the carrier concentration is set to less than or equal to $1\times10^{14}/cm^3$, preferably less than or equal to $1\times10^{12}/cm^3$.

In a transistor including the above oxide semiconductor, an off current for a channel width of 1 μm can be very small compared to a conventional transistor including silicon; for example, the off current can be less than or equal to 10 aA/μm ($1\times10^{-17}$ A/μm), preferably less than or equal to 1 aA/μm ($1\times10^{-18}$ A/μm), more preferably less than or equal to 10 zA/μm ($1\times10^{-20}$ A/μm), still more preferably less than or equal to 1 zA/μm ($1\times10^{-21}$ A/μm). Further, even when the temperature of the transistor is 85° C., the off current for a channel width of 1 μm can be very small compared to a conventional transistor including silicon; for example, the off current can be less than or equal to 100 zA/μm, preferably less than or equal to 10 zA/μm.

With the use of a transistor including an oxide semiconductor layer which is highly purified by sufficiently reducing the hydrogen concentration, a voltage regulator circuit can be achieved in which power consumption due to leakage current is low compared to the case of using a conventional transistor including silicon.

According to an embodiment of the present invention, a voltage regulator circuit includes a transistor and a capacitor. The transistor includes a gate, a source, and a drain, the gate is electrically connected to the source or the drain, a first signal is input to one of the source and the drain, an oxide semiconductor layer is used for a channel formation layer, and an off current is less than or equal to 100 zA/μm. The capacitor includes a first electrode and a second electrode, the first electrode is electrically connected to the other of the source and the drain of the transistor, and a second signal which is a clock signal is input to the second electrode. A voltage of the first signal is stepped up or down to obtain a third signal, and the third signal which has a voltage obtained by stepping up or down the voltage of the first signal is output as an output signal through the other of the source and the drain of the transistor.

According to another embodiment of the present invention, a voltage regulator circuit includes n stages (n is a natural number of greater than or equal to 2) of unit step-up circuits which are electrically connected to each other in series. A unit step-up circuit of a (2M−1)-th stage (M is any one of 1 to n/2, and 2M is a natural number) includes a first transistor and a first capacitor. The first transistor includes a gate, a source, and a drain, wherein the gate is electrically connected to one of the source and the drain, an oxide semiconductor layer is used for a channel formation layer, and an off current is less than or equal to 100 zA/μm. The first capacitor includes a first electrode and a second electrode, wherein the first electrode is electrically connected to the other of the source and the drain of the first transistor, and a clock signal is input to the second electrode. A unit step-up circuit of a 2M-th stage includes a second transistor and a second capacitor. The second transistor includes a gate, a source, and a drain, wherein the gate is electrically connected to one of the source and the drain, an oxide semiconductor layer is used for a channel formation layer, and an off current is less than or equal to 100 zA/μm. The second capacitor includes a first electrode and a second electrode, wherein the first electrode is electrically connected to the other of the source and the drain of the second transistor, and an inverted clock signal is input to the second electrode.

According to another embodiment of the present invention, a voltage regulator circuit includes n stages (n is a natural number of greater than or equal to 2) of unit step-down circuits which are electrically connected to each other in series. A unit step-down circuit of a (2M−1)-th stage (M is any one of 1 to n/2, and 2M is a natural number) includes a first transistor and a first capacitor. The first transistor includes a gate, a source, and a drain, wherein an oxide semiconductor layer is used for a channel formation layer, and an off current is less than or equal to 100 zA/μm. The first capacitor includes a first electrode and a second electrode, wherein the first electrode is electrically connected to the gate the first transistor, and a clock signal is input to the second electrode. A unit step-down circuit of a 2M-th stage includes a second transistor and a second capacitor. The second transistor includes a gate, a source, and a drain, wherein one of the source and the drain is electrically connected to the gate and the source or the drain of the first transistor, an oxide semiconductor layer is used for a channel formation layer, and an off current is less than or equal to 100 zA/μm. The second capacitor includes a first electrode and a second electrode, wherein the first electrode is electrically connected to the gate and the other of the source and the drain of the second transistor, and an inverted clock signal is input to the second electrode.

In accordance with an embodiment of the present invention, leakage current of a transistor can be reduced, and a drop in voltage of an output signal can be reduced, whereby conversion efficiency to obtain a desired voltage can be improved.

BEST MODE FOR CARRYING OUT THE INVENTION

Hereinafter, examples of embodiments of the present invention will be described with reference to the drawings. Note that the present invention is not limited to the description below, and it will be easily understood by those skilled in the art that modes and details thereof can be changed in various ways without departing from the spirit and the scope of the present invention. Thus, the present invention should not be interpreted as being limited to the description of the embodiments.

Embodiment 1

In this embodiment, a voltage regulator circuit which is an embodiment of the present invention will be described.

Figure 1:
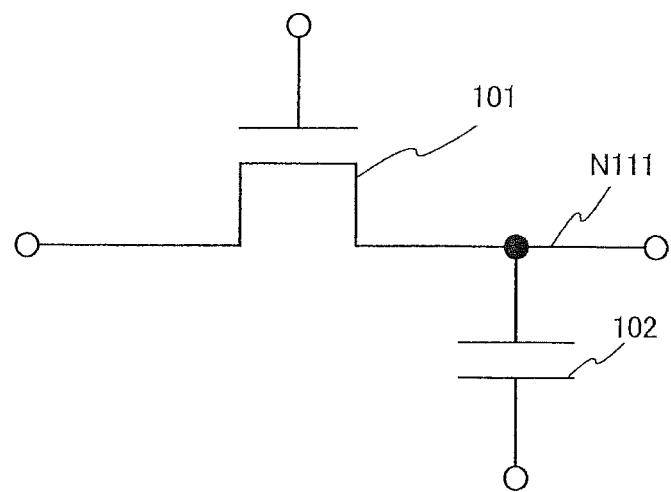
FIG. 1 is a circuit diagram illustrating an example of a structure of a voltage regulator circuit.

An example of a structure of a voltage regulator circuit described in this embodiment has a function of inputting a signal S1 and a signal S2 as input signals, stepping up or stepping down the voltage of the input signal S1, and thereby outputting as an output signal a signal S3 which has a voltage obtained by stepping up or stepping down the voltage of the signal S1. An example of the structure of the voltage regulator circuit in this embodiment is further described with reference to FIG. 1. FIG. 1 is a circuit diagram illustrating an example of the structure of the voltage regulator circuit of this embodiment.

The voltage regulator circuit illustrated in FIG. 1 includes a transistor 101 and a capacitor 102.

In this specification, for example, a field-effect transistor can be used as the transistor.

In addition, in this specification, the field-effect transistor has at least a gate, a source, and a drain. As the field-effect transistor, a thin film transistor (also referred to as a TFT) can be used, for example. The field-effect transistor can have, for example, a top-gate structure or a bottom-gate structure. In addition, the field-effect transistor can have n-type conductivity.

The gate means entire gate electrode and gate wiring or part thereof. The gate wiring is a wiring for electrically connecting a gate electrode of at least one transistor to a different electrode or a different wiring.

The source means entire source region, source electrode, and source wiring or part thereof. The source region is a region whose resistance is lower than that of a channel formation layer in a semiconductor layer. The source electrode means part of a conductive layer, which is connected to the source region. The source wiring is a wiring for electrically connecting a source electrode of at least one transistor to a different electrode or a different wiring.

The drain means entire drain region, drain electrode, and drain wiring or part thereof. The drain region is a region whose resistance is lower than that of a channel formation layer in a semiconductor layer. The drain electrode means part of a conductive layer, which is connected to the drain region. The drain wiring is a wiring for electrically connecting a drain electrode of at least one transistor to a different electrode or a different wiring.

Further, in this specification, a source and a drain of a transistor may interchange with each other depending on the structure, the operating condition, and the like of the transistor; therefore, it is difficult to define which is a source or a drain. Therefore, in this document (the specification, the claims, the drawings, and the like), one of them is referred to as one of the source and the drain, and the other is referred to as the other of the source and the drain.

In addition, the field-effect transistor in this specification is a transistor which includes an oxide semiconductor layer having a function as a channel formation layer. Note that the hydrogen concentration in the channel formation layer is less than or equal to $5\times10^{19}$ atoms/cm$^3$, preferably less than or equal to $5\times10^{18}$ atoms/cm$^3$, more preferably less than or equal to $5\times10^{17}$ atoms/cm$^3$. For example, the hydrogen concentration is measured using secondary ion mass spectroscopy (SIMS). The carrier concentration of the transistor is less than or equal to $1\times10^{14}$/cm$^3$, preferably less than or equal to $1\times10^{12}$/cm$^3$.

In this specification, as a capacitor, a capacitor which includes a first electrode, a second electrode, and a dielectric can be used, for example.

The signal S1 or the signal S3 is input to a gate of the transistor 101. The signal S1 is input to one of a source and a drain of the transistor 101. The voltage of the other of the source and the drain of the transistor 101 is equal to the voltage of the signal S3. The voltage regulator circuit illustrated in FIG. 1 outputs the signal S3 through the other of the source and the drain of the transistor 101.

In the transistor 101, voltage regulation operation is performed differently, depending on which of the signals S1 and S3 is input to the gate. For example, when the signal S1 is input to the gate, the voltage of the signal S3 can be higher than the voltage of the signal S1. Further, when the signal S3 is input to the gate, the voltage of the signal S3 can be lower than the voltage of the signal S1. Step-up means that the voltage of the signal S3 is increased to be higher than the voltage of the signal S1, and step-down means that the voltage of the signal S3 is decreased to be lower than the voltage of the signal S1.

Note that in general, a voltage refers to a difference between potentials of two points (also referred to as a potential difference). However, both the value of voltage and the value of a potential are represented by volts (V) in a circuit diagram or the like in some cases; therefore, it is difficult to distinguish them. Thus, in this specification, a potential difference between a potential at one point and a reference potential is sometimes used as a voltage at the point unless otherwise specified.

Note that as a signal in this specification, an analog signal or a digital signal which uses voltage or the like can be used, for example. Specifically, as a signal which uses voltage (also referred to as a voltage signal), it is preferable to use a signal having at least a first voltage state and a second voltage state. A digital signal which has a high-level voltage state as the first voltage state and a low-level voltage state as the second voltage state can be used, for example. Note that a high-level voltage is also referred to as $V_H$ and a low-level voltage is also referred to as $V_L$. In addition, the voltage in the first voltage state and the voltage in the second voltage state have variation in some cases, which depends on signals. Moreover, since there is an influence of noise or the like, the voltage in the first voltage state and the voltage in the second voltage state do not necessarily have a fixed value and may have a value within a predetermined range.

A first electrode of the capacitor 102 is electrically connected to the other of the source and the drain of the transistor 101, and the signal S2 is input to a second electrode of the capacitor 102. A region where the first electrode of the capacitor 102 and the other of the source and the drain of the transistor 101 are connected to each other is also referred to as a node N111.

The signal S1 serves as a first input signal (also referred to as a signal $IN_{VC1}$) of the voltage regulator circuit.

The signal S2 serves as a second input signal (also referred to as a signal $IN_{VC2}$) of the voltage regulator circuit. A clock signal can be used as the signal S2, for example. The clock signal is a signal in which the first voltage state and the second voltage state are periodically repeated. Values of the first voltage state and the second voltage state of the clock signal can be set as appropriate.

The signal S3 serves as an output signal (also referred to as a signal $OUT_{VC}$) of the voltage regulator circuit.

Figure 2:
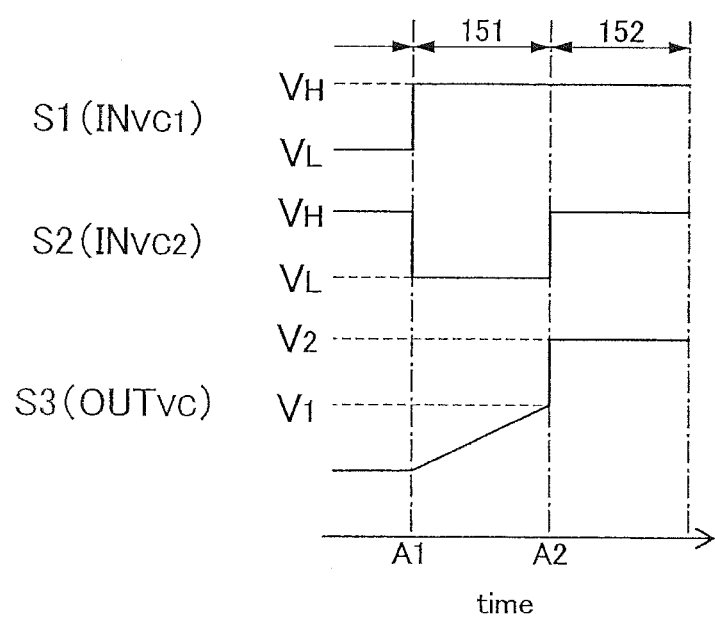
FIG. 2 is a timing chart for explaining an example of an operation of a voltage regulator circuit illustrated in FIG. 1.

Next, an example of an operation (also referred to as a driving method) of the voltage regulator circuit illustrated in FIG. 1 is described with reference to FIG. 2. FIG. 2 is a timing chart for explaining an example of the operation of the voltage regulator circuit illustrated in FIG. 1, and illustrates the waveforms of the voltages of the signal S1, the signal S2, and the signal S3. In the example of the operation of the voltage regulator circuit illustrated in FIG. 1, which is described with reference to FIG. 2, the signal S1 is a binary digital signal having a high level and a low level, the signal S2 is a clock signal in which a high level and a low level are periodically repeated, the transistor 101 is an n-channel transistor, and the signal S1 is input to the gate of the transistor 101.

The operation of the voltage regulator circuit illustrated in FIG. 1 can be described by being divided into a plurality of periods. The operation in each period is described below.

In a period 151, the signal S1 is set to a high level and the signal S2 is set to a low level.

At this time, the source and the drain of the transistor 101 are placed in a conduction state, so that the voltage at the node N111 begins to increase. The voltage at the node N111 is increased to V1. V1 is $V_H - V_{th101}$ (threshold voltage of the transistor 101). When the voltage of the node N111 is increased to the voltage V1, the source and the drain of the transistor 101 are placed in a non-conduction state, which brings the node N111 in a floating state. At this time, a voltage $V1 - V_L$ is applied between the first electrode and the second electrode of the capacitor 102, and the voltage of the signal S3 becomes V1.

In a period 152, the signal S1 is kept at a high level and the signal S2 is set to a high level.

At this time, the transistor 101 is in a non-conduction state, and the node N111 is in a floating state. Since the voltage applied to the second electrode of the capacitor 102 is changed from the voltage $V_L$ to the voltage $V_H$, also the voltage of the first electrode of the capacitor 102 begins to change, in accordance with the voltage of the second electrode of the capacitor 102. The voltage at the node N111 is increased to a value which is higher than the voltage V1, that is, V2. The voltage V2 is $V_H - V_{th101} + V_H$. At this time, a voltage $V2 - V_H$ is applied between the first electrode and the second electrode of the capacitor 102, and the voltage of the signal S3 is V2. In this manner, in the period 152, the voltage of the signal S3 which is an output signal of the voltage regulator circuit corresponds to a value obtained by stepping up the voltage of the signal S1 that is input to the voltage regulator circuit.

As described above, in the voltage regulator circuit according to this embodiment, a voltage signal which is input is changed and a signal with a voltage that is higher or lower than that of the input voltage signal can be output; therefore, power consumption can be reduced.

In addition, in the voltage regulator circuit according to this embodiment, a transistor includes an oxide semiconductor layer serving as a channel formation layer. In the channel formation layer, the hydrogen concentration is less than or equal to $5 \times 10^{19}$ atoms/cm$^3$, preferably less than or equal to $5 \times 10^{18}$ atoms/cm$^3$, more preferably less than or equal to $5 \times 10^{17}$ atoms/cm$^3$, and the carrier concentration is less than or equal to $1 \times 10^{14}$/cm$^3$, preferably less than or equal to $1 \times 10^{12}$/cm$^3$. Since leakage current is small in the transistor, leakage of electric charge stored in a capacitor can be reduced compared to a conventional transistor; thus, a speed at which a desired voltage is achieved can be significantly increased.

In addition, in the voltage regulator circuit according to this embodiment, the capacitor and the transistor can be formed through the same manufacturing steps, which can reduce the number of manufacturing steps.

Embodiment 2

In this embodiment, a step-up circuit will be described as an example of a voltage regulator circuit which is an embodiment of the present invention.

Figure 3:
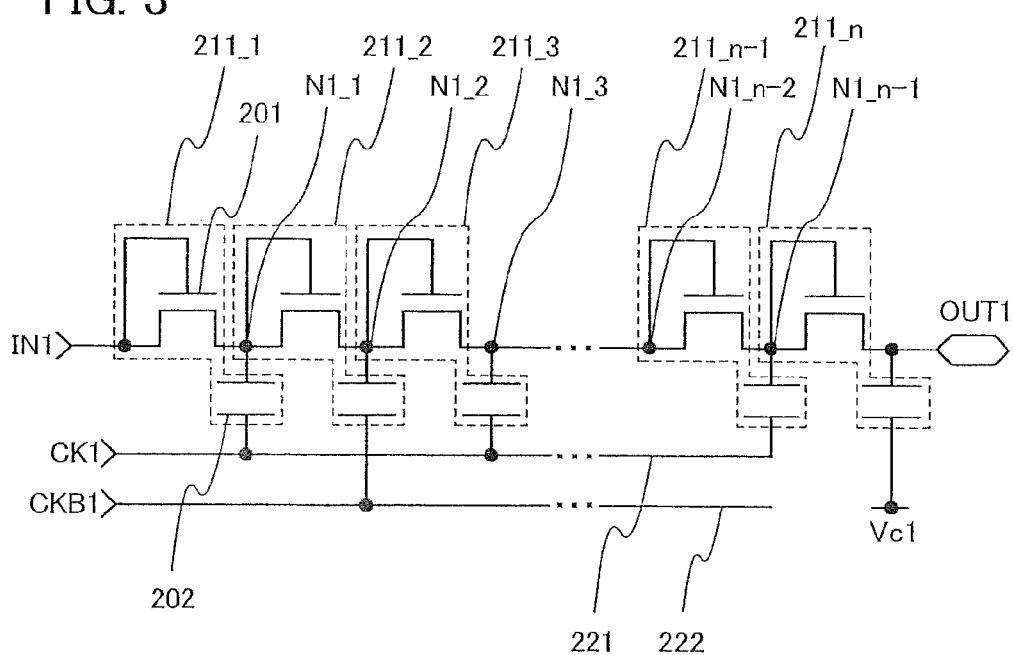
FIG. 3 is a circuit diagram illustrating an example of a structure of a voltage regulator circuit.

An example of the circuit structure of a voltage regulator circuit according to this embodiment will be described with reference to FIG. 3. FIG. 3 is a circuit diagram illustrating an example of the circuit structure of a voltage regulator circuit according to this embodiment.

The voltage regulator circuit illustrated in FIG. 3 includes a unit step-up circuit 211_1 to a unit step-up circuit 211_n (n is a natural number of greater than or equal to 2) and is formed with n stages of unit step-up circuits obtained by electrically connecting the unit step-up circuit 211_1 to the unit step-up circuit 211_n in series.

The unit step-up circuits 211_1 to 211_n each include a transistor 201 and a capacitor 202.

As the transistor 201, a transistor which includes an oxide semiconductor layer serving as a channel formation layer can be used. Note that the hydrogen concentration in the channel formation layer is less than or equal to $5 \times 10^{19}$ atoms/cm$^3$, preferably less than or equal to $5 \times 10^{18}$ atoms/cm$^3$, more preferably less than or equal to $5 \times 10^{17}$ atoms/cm$^3$. For example, the hydrogen concentration is measured by secondary ion mass spectroscopy (SIMS). In addition, the carrier concentration of the transistor 201 is less than or equal to $1 \times 10^{14}$/cm$^3$, preferably less than or equal to $1 \times 10^{12}$/cm$^3$.

In each of the unit step-up circuits 211_1 to 211_n, a gate of the transistor 201 is electrically connected to one of a source and a drain of the transistor 201. That is, the transistor 201 is diode-connected. In addition, a first electrode of the capacitor 202 is electrically connected to the other of the source and the drain of the transistor 201.

In a unit step-up circuit in a K-th stage (K is a natural number of any one of 2 to n), one of a source and a drain of the transistor 201 is electrically connected to the other of a source and a drain of the transistor 201 in a unit step-up circuit in a (K−1)-th stage. A portion where the other of the source and the drain of the transistor 201 in the unit step-up circuit in the (K−1)-th stage and one of the source and the drain of the transistor 201 in the unit step-up circuit in the K-th stage are connected to each other is denoted by a node N1_M (M is any one of 1 to n/2).

In a unit step-up circuit in a (2M−1)-th stage (M is any one of 1 to n/2, and 2M is a natural number), a second electrode of the capacitor 202 is electrically connected to a clock signal line 221. In a unit step-up circuit in a 2M-th stage, a second electrode of the capacitor 202 is electrically connected to a clock signal line 222. A clock signal CK1 is input to the clock signal line 221. A clock signal CKB1 is input to the clock signal line 222. The clock signal CK1 and the clock signal CKB1 have opposite phases. For example, when the clock signal CK1 is a high-level signal, the clock signal CKB1 is a low-level signal. As the clock signal CKB1, for example, a signal obtained by inversion of the clock signal CK1 can be used. The clock signal CKB1 can be generated by inversion of the voltage state of the clock signal CK1 with a NOT circuit such as an inverter, for example. In the clock signal CK1 and the clock signal CKB1, values of a voltage such as a high level and a low level can be determined as appropriate. In addition, the clock signal CK1 can be generated with the use of a buffer circuit and an oscillator circuit such as a ring oscillator, for example. Further, not only the clock signal CK1 and the clock signal CKB1, but also a clock signal having three or more phases can be used.

In a unit step-up circuit in a first stage, that is, the unit step-up circuit 211_1, a signal IN1 is input to one of a source and a drain of the transistor 201.

In a unit step-up circuit in the last stage, that is, the unit step-up circuit 211_n, the voltage of the other of a source and a drain of the transistor 201 is the voltage of a signal OUT1 which is an output signal of the voltage regulator circuit Voltage $V_{c1}$ is applied to a second electrode of the capacitor 202 in the unit step-up circuit 211_n. The voltage $V_{c1}$ can be any voltage. For example, voltage which has the same value as voltage $V_H$ or voltage $V_L$ can be used. In addition, the capacitance of the capacitor 202 in the unit step-up circuit 211_n is preferably larger than that of the capacitors 202 in the other unit step-up circuits. When the capacitance of the capacitor 202 in the unit step-up circuit 211_n is large, the voltage state of the output signal of the unit step-up circuit 211_n, that is, the signal OUT1 which is the output signal of the voltage regulator circuit can be further stabilized.

As described above, one example of the voltage regulator circuit in this embodiment includes n-stages of unit step-up circuits. Each unit step-up circuit includes a diode-connected transistor and a capacitor. As the diode-connected transistor, a transistor which includes a highly purified oxide semiconductor layer as a channel formation layer is used. Thus, the voltage of each node can be held for a longer time, it takes a shorter time to obtain a desired voltage, and voltage conversion efficiency can be improved.

Next, one example of the operation of the voltage regulator circuit illustrated in FIG. 3 is described.

The operation of the voltage regulator circuit illustrated in FIG. 3 can be described by being divided into a plurality of periods. The operation in each period is described below. Note that in a example of the operation of the voltage regulator circuit illustrated in FIG. 3, which is described here, a high-level signal is input as the signal IN1; a clock signal whose level is periodically changed between a high level and a low level is used as the clock signal CK1; a clock signal obtained by inversion of the clock signal CK is used as the clock signal CKB1; the transistor 201 in each unit step-up circuit is an n-channel transistor; and the threshold voltages of the transistors 201 in the unit step-up circuits are the same.

First, in a first period, the clock signal CK1 is set to a low level, and the clock signal CKB1 is set to a high level.

In this case, in the unit step-up circuit 211_1, the diode-connected transistor 201 is placed in a conduction state, so that the voltage of a node N1_1 begins to increase. The voltage of the node N1_1 (also referred to as voltage $V_{N1}$) is increased to $V_{IN1}$ (the voltage of the signal IN1)$-V_{th201}$ (the threshold voltage of the transistor 201). When the voltage of the node N_1 is increased to $V_{IN1}-V_{th201}$, the diode-connected transistor 201 in the unit step-up circuit 211_1 is placed in a non-conduction state, so that the node N1_1 is made to be in a floating state.

Next, in a second period, the clock signal CK1 is set to a high level, and the clock signal CKB1 is set to a low level.

In this case, in the unit step-up circuit 211_1, the transistor 201 is kept in a non-conduction state, the node N1_1 is in a floating state, and voltage applied to a second electrode of the capacitor 202 in the unit step-up circuit 211_1 is changed into $V_H$. Thus, the voltage of the first electrode of the capacitor 202 begins to change in accordance with the change in the voltage of the second electrode of the capacitor 202. The voltage of the node N1_1 is increased to $V_{IN1}-V_{th201}+V_H$. In this case, voltage applied between the first electrode and the second electrode of the capacitor 202 is $V_{IN}-V_{th201}$. In this manner, in the second period, the voltage of the node N1_1 is voltage obtained by stepping up the voltage of the node N1_1 in the first period.

In addition, since the voltage of the node N1_1 becomes $V_{IN}-V_{th201}+V_H$, in the unit step-up circuit 211_2, the diode-connected transistor 201 is placed in a conduction state, so that the voltage of a node N1_2 begins to increase. The voltage of the node N1_2 (also referred to as voltage $V_{N2}$) is increased to $V_{N1}-V_{th201}$. When the voltage of the node N1_2 is increased to $V_{N1}-V_{th201}$, the diode-connected transistor 201 in the unit step-up circuit 211_2 is placed in a non-conduction state, so that the node N1_2 is made to be in a floating state.

Next, in a third period, the clock signal CK1 is set to a low level, and the clock signal CKB1 is set to a high level.

In this case, in the unit step-up circuit 211_2, the transistor 201 is kept in a non-conduction state, the node N1_2 is in a floating state, and voltage applied to a second electrode of the capacitor 202 in the unit step-up circuit 211_2 is changed from $V_L$ into $V_H$. Thus, the voltage of the first electrode of the capacitor 202 begins to change in accordance with the change in the voltage of the second electrode of the capacitor 202. The voltage of the node N1_2 is increased to $V_{N1}-V_{th201}+V_H$. In this case, voltage applied between the first electrode and the second electrode of the capacitor 202 is $V_{N1}-V_{th201}$. In this manner, in the third period, the voltage of the node N1_2 is voltage obtained by stepping up the voltage of the node N1_2 in the second period.

In addition, since the voltage of the node N1_2 becomes $V_{N1}-V_{th201}+V_H$, in the unit step-up circuit 211_3, the diode-connected transistor 201 is placed in a conduction state, so that the voltage of a node N1_3 starts to increase. The voltage of the node N1_3 (also referred to as voltage $V_{N3}$) is increased to $V_{N2}-V_{th201}$. When the voltage of the node N1_3 is increased to $V_{N2}-V_{th201}$, the diode-connected transistor 201 in the unit step-up circuit 211_3 is placed in a non-conduction state, so that the node N1_3 is made to be in a floating state.

Further, in each unit step-up circuit in a third or subsequent stage, operations which are similar to those of the above unit step-up circuits are sequentially performed in accordance with a periodical change of the clock signal CK1 and the clock signal CKB1 between a high level and a low level, and a voltage of each node N1_M is stepped up gradually every time the clock signal CK1 or the clock signal CKB1 is changed periodically between a high level and a low level and stepped up to $V_{IN1}+M(V_H-V_{th201})$ at a maximum. In addition, the voltage of the signal OUT1 is stepped up gradually every time the clock signal CK1 or the clock signal CKB1 is changed periodically between a high level and a low level and stepped up to $V_{IN1}+n(V_H-V_{th201})$ at a maximum. In this manner, in the voltage regulator circuit illustrated in FIG. 3, the voltage of the signal IN1 is stepped up, and the signal OUT1 having the stepped up voltage is output as an output signal.

As described above, in an example of the voltage regulator circuit in this embodiment, when step-up operation is performed in each unit step-up circuit, a signal whose voltage is higher than the voltage of an input signal can be output as an output signal.

Further, in an example of the voltage regulator circuit in this embodiment, the diode-connected transistor in each unit step-up circuit is a transistor which includes a highly purified oxide semiconductor layer as a channel formation layer. Thus, the leakage current of the transistor can be reduced, conversion efficiency to obtain a desired voltage can be improved, the voltage of each node can be held for a longer time, and it takes a shorter time to obtain a desired voltage by step-up operation.

Note that this embodiment can be combined with any of other embodiments as appropriate.

Embodiment 3

In this embodiment, a step-down circuit will be described as another example of a voltage regulator circuit which is an embodiment of the present invention. Note that in this embodiment, the description in Embodiment 2 is employed as appropriate for the same portions as the voltage regulator circuit in Embodiment 2.

Figure 4:
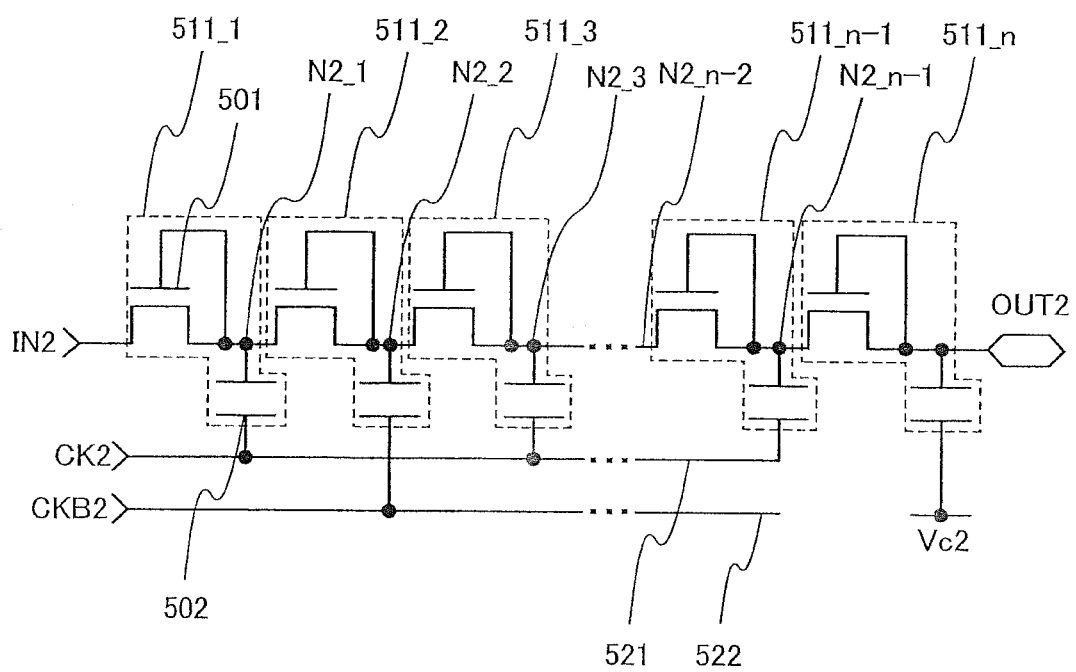
FIG. 4 is a circuit diagram illustrating an example of a structure of a voltage regulator circuit.

An example of the circuit structure of a voltage regulator circuit in this embodiment is described with reference to FIG. 4. FIG. 4 is a circuit diagram illustrating an example of the circuit structure of a voltage regulator circuit in this embodiment.

The voltage regulator circuit illustrated in FIG. 4 includes a unit step-down circuit 511_1 to a unit step-down circuit 511_n (n is a natural number of greater than or equal to 2) and is formed with n stages of unit step-down circuits obtained by electrically connecting the unit step-down circuit 511_1 to the unit step-down circuit 511_n in series.

The unit step-down circuits 511_1 to 511_n each include a transistor 501 and a capacitor 502.

As the transistor 501, a transistor which includes an oxide semiconductor layer serving as a channel formation layer can be used. Note that the hydrogen concentration in the channel formation layer is less than or equal to $5 \times 10^{19}$ atoms/cm$^3$, preferably less than or equal to $5 \times 10^{18}$ atoms/cm$^3$, more preferably less than or equal to $5 \times 10^{17}$ atoms/cm$^3$. For example, the hydrogen concentration is measured by secondary ion mass spectroscopy (SIMS). In addition, the carrier concentration of the transistor 501 is less than or equal to $1 \times 10^{14}$/cm$^3$, preferably less than or equal to $1 \times 10^{12}$/cm$^3$.

In a unit step-down circuit in a K-th stage (K is a natural number of any one of 2 to n), one of a source and a drain of the transistor 501 is electrically connected to the other of a source and a drain of the transistor 501 in a unit step-down circuit in a (K−1)-th stage. A portion where the other of the source and the drain of the transistor 501 in the unit step-down circuit in the (K−1)-th stage and one of the source and the drain of the transistor 501 in the unit step-down circuit in the K-th stage are connected to each other is denoted by a node N2_M.

In each of the unit step-down circuits 511_1 to 511_n, a gate of the transistor 501 is electrically connected to the other of a source and a drain of the transistor 501. That is, the transistor 501 is diode-connected. In addition, a first electrode of the capacitor 502 is electrically connected to the other of the source and the drain of the transistor 501. That is, although the transistor 201 in the voltage regulator circuit illustrated in FIG. 3 has a structure in which the gate is electrically connected to one of the source and the drain, the transistor 501 in the voltage regulator circuit illustrated in FIG. 4 has a structure in which the gate is electrically connected to the other of the source and the drain.

In a unit step-down circuit in a (2M−1)-th stage, a first electrode of the capacitor 502 is electrically connected to the gate of the transistor 501, and a second electrode of the capacitor 502 is electrically connected to a clock signal line 521. In a unit step-down circuit in a 2M-th stage, one of the source and the drain of the transistor 501 is electrically connected to the gate and the source or the drain of the transistor 501 in the (2M−1)-th stage, a first electrode of the capacitor 502 is electrically connected to the gate and the other of the source and the drain of the transistor 501, and a second electrode of the capacitor 502 is electrically connected to a clock signal line 522. A clock signal CK2 is input to the clock signal line 521. A clock signal CKB2 is input to the clock signal line 522. The clock signal CK2 and the clock signal CKB2 have opposite phases. For example, when the clock signal CK2 is a high-level signal, the clock signal CKB2 is a low-level signal. As the clock signal CKB2, for example, a signal obtained by inversion of the clock signal CK2 can be used. The clock signal CKB2 can be generated by inversion of the voltage state of the clock signal CK2 with a NOT circuit such as an inverter, for example. In the clock signal CK2 and the clock signal CKB2, values of a voltage such as a high level and a low level can be determined as appropriate. In addition, the clock signal CK2 can be generated with the use of a buffer circuit and an oscillator circuit such as a ring oscillator, for example. Further, not only the clock signal CK2 and the clock signal CKB2, but also a clock signal having three or more phases can be used.

In a unit step-down circuit in a first stage, that is, the unit step-down circuit 511_1, a signal IN2 is input to one of a source and a drain of the transistor 501.

In a unit step-down circuit in the last stage, that is, the unit step-down circuit 511_n, the voltage of the other of the source and the drain of the transistor 501 is the voltage of a signal OUT2 which is an output signal of the voltage regulator circuit. Voltage $V_{c2}$ is applied to a second electrode of the capacitor 502 in the unit step-down circuit 511_n. The voltage V2 can be any voltage. For example, voltage which has the same value as voltage $V_H$ or voltage $V_L$ can be used. In addition, the capacitance of the capacitor 502 in the unit step-down circuit 511_n is preferably larger than that of the capacitors 502 in the other unit step-down circuits. When the capacitance of the capacitor 502 in the unit step-down circuit 511_n is large, the voltage state of the output signal of the unit step-down circuit 511_n, that is, the signal OUT2 which is the output signal of the voltage regulator circuit can be further stabilized.

As described above, one example of the voltage regulator circuit in this embodiment includes n-stages of unit step-down circuits. Each unit step-down circuit includes a diode-connected transistor and a capacitor. As the diode-connected transistor, a transistor including as a channel formation layer an oxide semiconductor layer in which the hydrogen concentration is reduced and off current is reduced is used. Thus, the voltage of each node can be held for a longer time, it takes a shorter time to obtain a desired voltage, and voltage conversion efficiency can be improved.

Next, one example of the operation of the voltage regulator circuit illustrated in FIG. 4 is described.

The operation of the voltage regulator circuit illustrated in FIG. 4 can be described by being divided into a plurality of periods. The operation in each period is described below. Note that in an example of the operation of the voltage regulator circuit illustrated in FIG. 4, which is described here, a low-level signal is input as the signal IN2; a clock signal whose level is periodically changed between a high level and a low level is used as the clock signal CK2; a clock signal obtained by inversion of the clock signal CK2 is used as the clock signal CKB2; the transistor 501 in each unit step-down circuit is an n-channel transistor, and the threshold voltages of the transistors 501 in the unit step-down circuits are the same.

First, in a first period, the clock signal CK2 is set to a high level, and the clock signal CKB2 is set to a low level.

In this case, in the unit step-down circuit 511_1, the diode-connected transistor 501 is placed in a conduction state, so that the voltage of a node N2_1 begins to decrease. The voltage of the node N2_1 (also referred to as voltage $V_{N2}$) is decreased to $V_{IN2}$ (the voltage of the signal IN2)+ $V_{th501}$ (the threshold voltage of the transistor 501). When the voltage of the node N2_1 is decreased to $V_{IN2}+V_{th501}$, the diode-connected transistor 501 in the unit step-down circuit 511_1 is placed in a non-conduction state, so that the node N2_1 is made to be in a floating state.

Next, in a second period, the clock signal CK2 is set to a low level, and the clock signal CKB2 is set to a high level.

In this case, in the unit step-down circuit 511_1, the transistor 501 is kept in a non-conduction state, the node N2_1 is in a floating state, and voltage applied to a second electrode of the capacitor 502 in the unit step-down circuit 511_1 is changed into $V_L$. Thus, the voltage of the first electrode of the capacitor 502 begins to change in accordance with the change in the voltage of the second electrode of the capacitor 502. The voltage of the node N2_1 is decreased to $V_{IN2}+V_{th501}-V_H$. In this case, voltage applied between the first electrode and the second electrode of the capacitor 502 is $V_{IN2}+V_{th501}$. In this manner, in the second period, the voltage of the node N2_1 is voltage obtained by stepping down the voltage of the node N2_1 in the first period.

In addition, since the voltage of the node N2_1 is decreased to $V_{IN2}+V_{th501}-V_H$, in the unit step-down circuit 511_2, the diode-connected transistor 501 is placed in a conduction state, so that the voltage of a node N2_2 begins to decrease. The voltage of the node N2_2 (also referred to as voltage $V_{N2}$) is decreased to $V_{N2}+V_{th501}$. When the voltage of the node N2_2 is decreased to $V_{N2}+V_{th501}$, the diode-connected transistor 501 in the unit step-down circuit 511_2 is placed in a non-conduction state, so that the node N2_2 is made to be in a floating state.

Next, in a third period, the clock signal CK2 is set to a high level, and the clock signal CKB2 is set to a low level.

In this case, in the unit step-down circuit 511_2, the transistor 501 is kept in a non-conduction state, the node N2_2 is in a floating state, and voltage applied to a second electrode of the capacitor 502 in the unit step-down circuit 511_2 is changed into $V_L$. Thus, the voltage of the first electrode of the capacitor 502 begins to change in accordance with the change in the voltage of the second electrode of the capacitor 502. The voltage of the node N2_2 is decreased to $V_{N2}+V_{th501}-V_H$. In this case, voltage applied between the first electrode and the second electrode of the capacitor 502 is $V_{N2}+V_{th501}$. In this manner, in the third period, the voltage of the node N2_2 is voltage obtained by stepping down the voltage of the node N2_2 in the second period.

In addition, since the voltage of the node N2_2 is decreased to $V_{N2}+V_{th501}-V_H$, in the unit step-down circuit 511_3, the diode-connected transistor 501 is placed in a conduction state, so that the voltage of a node N2_3 begins to decrease. The voltage of the node N2_3 (also referred to as voltage $V_{N3}$) is decreased to $V_{N2}+V_{th501}$. When the voltage of the node N2_3 is decreased to $V_{N2}+V_{th501}$, the diode-connected transistor 501 in the unit step-down circuit 511_3 is placed in a non-conduction state, so that the node N2_3 is made to be in a floating state.

Further, in each unit step-down circuit in a third or subsequent stage, operations which are similar to those of the above unit step-down circuits are sequentially performed in accordance with a periodical change of the clock signal CK2 and the clock signal CKB2 between a high level and a low level, and a voltage of each node N2_M is stepped down gradually every time the clock signal CK2 or the clock signal CKB2 is changed periodically between a high level and a low level and stepped down to $V_{IN2}-M(V_H+V_{th501})$ at a minimum. In addition, the voltage of the signal OUT2 is stepped down gradually every time the clock signal CK2 or the clock signal CKB2 is changed periodically between a high level and a low level and stepped down to $V_{IN2}-n(V_H+V_{th501})$ at a minimum. In this manner, in the voltage regulator circuit illustrated in FIG. 4, the voltage of the signal IN2 is stepped down, and the signal OUT2 having the stepped down voltage is output as an output signal.

As described above, in an example of the voltage regulator circuit in this embodiment, when step-down operation is performed in each unit step-down circuit, a signal whose voltage is lower than the voltage of an input signal can be output as an output signal.

Further, in an example of the voltage regulator circuit in this embodiment, the diode-connected transistor in each unit step-down circuit is a transistor which includes a highly purified oxide semiconductor layer as a channel formation layer. Thus, the leakage current of the transistor can be reduced, conversion efficiency to obtain a desired voltage can be improved, the voltage of each node can be held for a longer time, and it takes a shorter time to obtain a desired voltage by step-down operation.

Note that this embodiment can be combined with any of other embodiments as appropriate.

Embodiment 4

In this embodiment, an example of a thin film transistor which can be used as a transistor included in the voltage regulator circuit disclosed in this specification will be described.

One embodiment of a thin film transistor and a manufacturing method of the thin film transistor of this embodiment is described with reference to FIGS. 5A and 5B and FIGS. 6A to 6E.

Figure 5A:
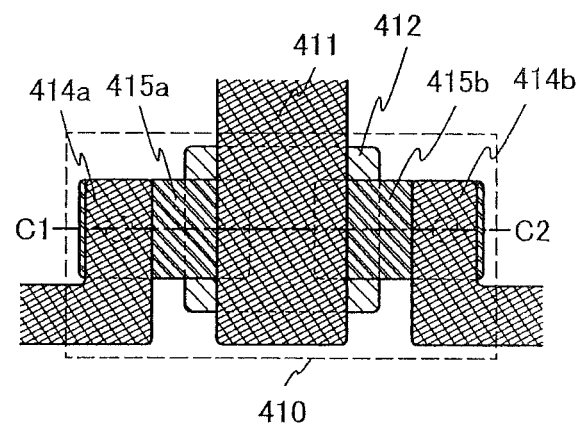
FIGS. 5A and 5B are a top view and a cross-sectional view illustrating a transistor.
Figure 5B:
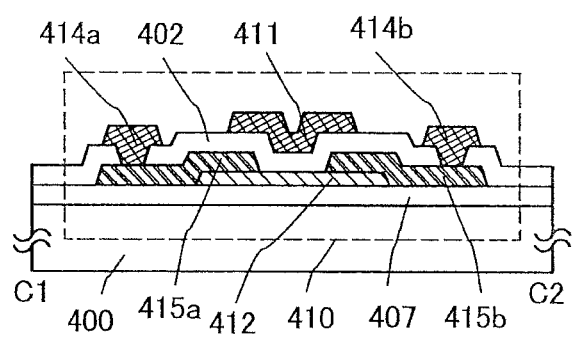

FIGS. 5A and 5B illustrate an example of a planar structure and an example of a cross-sectional structure of a transistor. A thin film transistor 410 illustrated in FIGS. 5A and 5B is one of top gate thin film transistors.

FIG. 5A is a plan view of the thin film transistor 410 having a top-gate structure and FIG. 5B is a cross-sectional view taken along C1-C2 in FIG. 5A.

The thin film transistor 410 includes, over a substrate 400 having an insulating surface, an insulating layer 407, an oxide semiconductor layer 412, a source or drain electrode layer 415a, a source or drain electrode layer 415b, a gate insulating layer 402, and a gate electrode layer 411. A wiring layer 414a and a wiring layer 414b are provided so as to be in contact with and electrically connected to the source or drain electrode layer 415a and the source or drain electrode layer 415b, respectively.

The thin film transistor 410 is described using a single-gate thin film transistor, a multi-gate thin film transistor including a plurality of channel formation regions can be formed when needed.

A process of manufacturing the thin film transistor 410 over the substrate 400 is described below with reference to FIGS. 6A to 6E.

Although there is no particular limitation on a substrate which can be used as the substrate 400 having an insulating surface, it is necessary that the substrate have at least a heat resistance high enough to withstand heat treatment to be performed later. A glass substrate formed of barium borosilicate glass, aluminoborosilicate glass, or the like can be used.

In the case where the temperature at which the heat treatment is to be performed is high, a glass substrate whose strain point is greater than or equal to 730° C. is preferably used. As a glass substrate, a glass material such as aluminosilicate glass, aluminoborosilicate glass, or barium borosilicate glass is used, for example. Note that by containing a larger amount of barium oxide (BaO) than boron oxide, a glass substrate is heat-resistant and of more practical use. Therefore, a glass substrate containing a larger amount of BaO than $B_2O_3$ is preferably used.

Note that instead of the above glass substrate, a substrate formed of an insulator such as a ceramic substrate, a quartz substrate, or a sapphire substrate may be used. Alternatively, crystallized glass or the like may be used. Further alternatively, a plastic substrate or the like can be used as appropriate. In addition, a semiconductor substrate of silicon or the like can be used as the substrate.

First, the insulating layer 407 which serves as a base film is formed over the substrate 400 having an insulating surface. As the insulating layer 407 in contact with the oxide semiconductor layer, an oxide insulating layer such as a silicon oxide layer, a silicon oxynitride layer, an aluminum oxide layer, or an aluminum oxynitride layer is preferably used. Although a plasma CVD method, a sputtering method, or the like can be employed as a method for forming the insulating layer 407, the insulating layer 407 is preferably formed by a sputtering method so that hydrogen is contained in the insulating layer 407 as little as possible.

In this embodiment, a silicon oxide layer is formed as the insulating layer 407 by a sputtering method. The substrate 400 is transferred to a treatment chamber and a high-purity sputtering gas from which hydrogen and moisture are removed and which contains oxygen is introduced, and a silicon oxide layer is formed as the insulating layer 407 over the substrate 400 with the use of a silicon semiconductor target. The substrate 400 may be at a room temperature or may be heated.

For example, a silicon oxide film is formed by an RF sputtering method under the following condition: quartz (preferably, synthetic quartz) is used as a target; the substrate temperature is 108° C.; the distance between the substrate and the target (the T-S distance) is 60 mm; the pressure is 0.4 Pa; the high frequency power is 1.5 kW; and the atmosphere is an atmosphere containing oxygen and argon (the flow ratio of oxygen to argon is 1:1 (each flow rate is 25 sccm). The thickness of the silicon oxide film is 100 nm. Note that instead of quartz (preferably, synthetic quartz), a silicon target can be used as a target used when the silicon oxide film is formed. As a sputtering gas, oxygen or a mixed gas of oxygen and argon is used.

In that case, the insulating layer 407 is preferably formed removing moisture remaining in the treatment chamber. This is for preventing hydrogen, a hydroxyl group, or moisture from being contained in the insulating layer 407.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In a deposition chamber which is evacuated with the cryopump, for example, a hydrogen atom, a compound containing a hydrogen atom, such as water ($H_2O$), or the like is removed, whereby the concentration of an impurity in the insulating layer 407 formed in the deposition chamber can be reduced.

It is preferable to use a high-purity gas from which an impurity such as hydrogen, water, a hydroxyl group, or hydride is removed to a concentration of several ppm or a concentration of several ppb, as a sputtering gas when the insulating layer 407 is formed.

Examples of a sputtering method include an RF sputtering method in which a high-frequency power source is used as a sputtering power source, a DC sputtering method in which a direct current source is used, a pulsed DC sputtering method in which a bias is applied in a pulsed manner, and the like. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a deposition method using a sputtering method, a reactive sputtering method in which a target substance and a sputtering gas component are chemically reacted with each other during deposition to form a thin compound film thereof, or a bias sputtering method in which a voltage is also applied to a substrate during deposition can be used.

Further, the insulating layer 407 may have a layered structure in which for example, a nitride insulating layer such as a silicon nitride layer, a silicon nitride oxide layer, an aluminum nitride layer, or an aluminum nitride oxide layer and the oxide insulating layer are stacked in this order from the substrate 400 side.

For example, a high-purity sputtering gas from which hydrogen and moisture are removed and which contains nitrogen is introduced and a silicon target is used, whereby a silicon nitride layer is formed between a silicon oxide layer and a substrate. In this case, the silicon nitride layer is preferably formed removing moisture remaining in a treatment chamber, similarly to the silicon oxide layer.

The substrate may be heated also at the time of the film deposition of the silicon nitride layer.

In the case where the silicon nitride layer and the silicon oxide layer are stacked to form the insulating layer 407, the silicon nitride layer and the silicon oxide layer can be formed in the same chamber with the same silicon target. First, a sputtering gas containing nitrogen is introduced and a silicon target placed inside the treatment chamber is used to form the silicon nitride layer, and then, the sputtering gas is switched to a sputtering gas containing oxygen and the same silicon target is used to form the silicon oxide layer. Since the silicon nitride layer and the silicon oxide layer can be formed in succession without exposure to the air, an impurity such as hydrogen or moisture can be prevented from being adsorbed on a surface of the silicon nitride layer.

Then, an oxide semiconductor film is formed to a thickness of 2 nm to 200 nm inclusive over the insulating layer 407.

In order for the oxide semiconductor film not to contain an impurity such as hydrogen, a hydroxyl group, or moisture as much as possible, it is preferable to preheat the substrate 400 provided with the insulating layer 407 in a preheating chamber of the sputtering apparatus before the film formation so that an impurity such as hydrogen or moisture adsorbed on the substrate 400 is eliminated, and perform exhaustion. As an exhaustion unit provided in the preheating chamber, a cryopump is preferable. This preheating step is not necessarily performed. Further, this preheating may be similarly performed on the substrate 400 over which the gate insulating layer 402 has not been formed or the substrate 400 over which layers up to the source or drain electrode layer 415a and the source or drain electrode layer 415b have been formed.

Note that before the oxide semiconductor film is formed by a sputtering method, dust attached to a surface of the insulating layer 407 is preferably removed by reverse sputtering in which an argon gas is introduced and plasma is generated. The reverse sputtering refers to a method in which, without application of a voltage to a target side, a high-frequency power source is used for application of a voltage to a substrate side in an argon atmosphere to generate plasma and modify a surface. Note that instead of an argon atmosphere, a nitrogen atmosphere, a helium atmosphere, an oxygen atmosphere, or the like may be used.

The oxide semiconductor film is formed by a sputtering method. Any of the following oxide semiconductor films is used as the oxide semiconductor film: an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, an In—Sn—O-based oxide semiconductor film, a Sn—O-based oxide semiconductor film, and a Zn—O-based oxide semiconductor film. In this embodiment, the oxide semiconductor film is formed by a sputtering method with the use of an In—Ga—Zn—O-based metal oxide target. In addition, the oxide semiconductor film can be formed by a sputtering method in a rare gas (typically argon) atmosphere, an oxygen atmosphere, or an atmosphere of a rare gas (typically argon) and oxygen. In the case of using a sputtering method, a target containing $SiO_2$ at 2 wt % to 10 wt % inclusive may be used for forming a film.

It is preferable that a high-purity gas from which an impurity such as hydrogen, water, a hydroxyl group, or hydride is removed to a concentration of several ppm or a concentration of several ppb be used as the sputtering gas for the deposition of the oxide semiconductor film.

As a target for forming the oxide semiconductor film by a sputtering method, a metal oxide target containing zinc oxide as its main component can be used. As another example of the metal oxide target, for example, a metal oxide target with a composition ratio of $In_2O_3:Ga_2O_3:ZnO=1:1:1$ (molar ratio) can be used. Without limitation to the above target, for example, a metal oxide target with a composition ratio of $In_2O_3:Ga_2O_3:ZnO=1:1:2$ (molar ratio) may be used. The proportion of the volume of a portion except for an area occupied by a space and the like with respect to the total volume of the metal oxide target (also referred to as the fill rate) is 90% to 100% inclusive, preferably, 95% to 99.9% inclusive. With the use of the metal oxide target with high fill rate, a dense oxide semiconductor film is formed.

The substrate is held in a treatment chamber kept under reduced pressure, a sputtering gas from which hydrogen and moisture are removed is introduced into the treatment chamber from which remaining moisture is being removed, and the oxide semiconductor film is formed over the substrate 400 with the use of a metal oxide as a target. To remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced. The substrate may be heated when the oxide semiconductor film is formed.

An example of the deposition condition is as follows: the substrate temperature is room temperature, the distance between the substrate and the target is 60 mm, the pressure is 0.4 Pa, the DC power is 0.5 kW, and the atmosphere is an atmosphere containing oxygen and argon (the flow ratio of oxygen to argon is 15 sccm:30 sccm=1:2). It is preferable that a pulsed DC power source be used because powder substances (also referred to as particles or dust) generated in film formation can be reduced and the film thickness can be uniform. The oxide semiconductor film preferably has a thickness of 5 nm to 30 nm inclusive. Note that the appropriate thickness depends on an oxide semiconductor material used and the thickness may be selected as appropriate in accordance with a material.

Figure 6A:
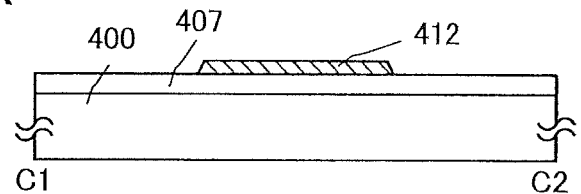
FIGS. 6A to 6E are cross-sectional views illustrating a method for manufacturing a transistor.
Figure 6B:
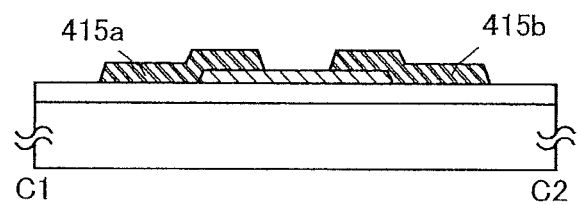

Then, the oxide semiconductor film is processed into an island-shaped oxide semiconductor layer 412 through a first photolithography step (see FIG. 6A). A resist mask for forming the island-shaped oxide semiconductor layer 412 may be formed by an ink-jet method. Formation of the resist mask by an ink-jet method needs no photomask; thus, manufacturing cost can be reduced.

Note that the etching of the oxide semiconductor film may be dry etching, wet etching, or both dry etching and wet etching.

As an etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

In addition, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As a dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. In addition, ITO07N (produced by KANTO CHEMICAL CO., INC.) may be used.

The etchant after the wet etching is removed together with the material etched off by cleaning. The waste liquid including the etchant and the material etched off may be purified and the material may be reused. When a material such as indium contained in the oxide semiconductor layer is collected from the waste liquid after the etching and reused, the resources can be efficiently used and the cost can be reduced.

The etching condition (such as an etchant, etching time, temperature, or the like) is appropriately adjusted depending on the material so that the material can be etched into a desired shape.

In this embodiment, the oxide semiconductor film is processed into the island-shaped oxide semiconductor layer 412 by a wet etching method with a mixed solution of phosphoric acid, acetic acid, and nitric acid as an etchant.

In this embodiment, the oxide semiconductor layer 412 is subjected to first heat treatment. The temperature of the first heat treatment is greater than or equal to 400° C. and less than or equal to 750° C., preferably greater than or equal to 400° C. and less than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, entry of water and hydrogen into the oxide semiconductor layer is prevented; thus, the oxide semiconductor layer is obtained. Through the first heat treatment, dehydration or dehydrogenation of the oxide semiconductor layer 412 can be conducted.

Note that the heat treatment apparatus is not limited to an electric furnace, and a device for heating an object to be processed by thermal conduction or thermal radiation from a heating element such as a resistance heating element may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be processed by heat treatment, like nitrogen or a rare gas such as argon is used.

For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment for a short time.

Note that in the first heat treatment, it is preferable that water, hydrogen, or the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is preferably less than or equal to 1 ppm, more preferably less than or equal to 0.1 ppm).

The oxide semiconductor layer 412 may be crystallized to be a microcrystalline film or a polycrystalline film depending on the conditions of the first heat treatment or the material of the oxide semiconductor layer. For instance, the oxide semiconductor layer 412 may be crystallized to be a microcrystalline oxide semiconductor film having a degree of crystallinity of greater than or equal to 90%, or greater than or equal to 80%. Further, depending on the conditions of the first heat treatment or the material of the oxide semiconductor layer, the oxide semiconductor layer 412 may be an amorphous oxide semiconductor film containing no crystalline component. The oxide semiconductor layer 412 may become an oxide semiconductor film in which a microcrystalline portion (with a grain diameter of 1 nm to 20 nm inclusive, typically 2 nm to 4 nm inclusive) is mixed into an amorphous oxide semiconductor.

In addition, the first heat treatment can be performed on the oxide semiconductor film before being processed into the island-shaped oxide semiconductor layer 412. In that case, the substrate is taken out of the heat treatment apparatus after the first heat treatment, and then a photolithography step is performed.

The heat treatment having an effect of dehydration or dehydrogenation with respect to the oxide semiconductor layer may be performed at any of the following timings: after the oxide semiconductor layer is formed; after a source electrode layer and a drain electrode layer are formed over the oxide semiconductor layer; and after a gate insulating layer is formed over the source electrode layer and the drain electrode layer.

Next, a conductive film is formed over the insulating layer 407 and the oxide semiconductor layer 412. The conductive film may be formed by, for example, a sputtering method or a vacuum evaporation method. As a material of the conductive film, an element selected from Al, Cr, Cu, Ta, Ti, Mo, and W; an alloy containing any of these elements as its component; an alloy film containing any of these elements in combination; and the like can be given. Further, one or more materials selected from manganese, magnesium, zirconium, beryllium, and yttrium may be used. Further, the conductive film may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given. Alternatively, a film of one or a plurality of elements selected from titanium (Ti), tantalum (Ta), tungsten (W), molybdenum (Mo), chromium (Cr), neodymium (Nd), and scandium (Sc) combined with Al, an alloy film containing a plurality of the above elements, or a nitride film thereof may be used.

A second photolithography step is performed. A resist mask is formed over the conductive film and selective etching is performed, so that the source or drain electrode layer 415a and the source or drain electrode layer 415b are formed. Then, the resist mask is removed (see FIG. 6B). Note that the source electrode layer and the drain electrode layer preferably have tapered shapes because coverage with the gate insulating layer stacked thereover can be improved.

In this embodiment, a titanium film is formed to a thickness of 150 nm by a sputtering method for the source or drain electrode layer 415a and the source or drain electrode layer 415b.

Note that materials and etching conditions are adjusted as appropriate so that the oxide semiconductor layer 412 is not removed and the insulating layer 407 under the oxide semiconductor layer 412 is not exposed when the conductive film is etched.

In this embodiment, a titanium film is used as the conductive film, an In—Ga—Zn—O-based oxide semiconductor is used as the oxide semiconductor layer 412, and an ammonia hydrogen peroxide solution (a mixture of ammonia, water, and a hydrogen peroxide solution) is used as an etchant.

Note that in the second photolithography step, only part of the oxide semiconductor layer 412 may be etched, whereby an oxide semiconductor layer having a groove (a depression portion) may be formed. In addition, the resist mask for forming the source or drain electrode layer 415a and the source or drain electrode layer 415b may be formed by an ink-jet method. Formation of the resist mask by an ink-jet method needs no photomask; thus, manufacturing cost can be reduced.

Ultraviolet, a KrF laser beam, or an ArF laser beam is used for light exposure for forming the resist mask in the second photolithography step. A channel length L of the thin film transistor to be formed later depends on a width of a distance between a bottom portion of the source electrode layer and a bottom portion of the drain electrode layer which are adjacent to each other over the oxide semiconductor layer 412. Note that when light exposure is performed in the case where the channel length L is shorter than 25 nm, extreme ultraviolet with extremely short wavelengths of several nanometers to several tens of nanometers is used for light exposure for forming the resist mask in the second photolithography step. Light exposure with extreme ultraviolet leads to a high resolution and a large depth of focus. Accordingly, the channel length L of the thin film transistor to be formed later can be set to 10 nm to 1000 nm inclusive. Thus, the operation speed of a circuit can be increased, and further, an off current can be significantly small so that low power consumption can be achieved.

Figure 6C:
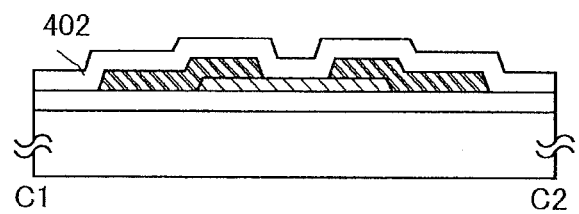

Next, the gate insulating layer 402 is formed over the insulating layer 407, the oxide semiconductor layer 412, the source or drain electrode layer 415a, and the source or drain electrode layer 415b (see FIG. 6C).

The gate insulating layer 402 can be formed with a single-layer structure or a layered structure using any of a silicon oxide layer, a silicon nitride layer, a silicon oxynitride layer, a silicon nitride oxide layer, and an aluminum oxide layer by a plasma CVD method, a sputtering method, or the like. Note that the gate insulating layer 402 is preferably formed by a sputtering method so that the gate insulating layer 402 avoids containing much hydrogen. In the case where a silicon oxide film is formed by a sputtering method, a silicon target or a quartz target is used as a target and a mixed gas of oxygen and argon is used as a sputtering gas.

The gate insulating layer 402 may have a structure where a silicon oxide layer and a silicon nitride layer are stacked from the side of the source or drain electrode layer 415a and the source or drain electrode layer 415b. For example, a silicon oxide layer ($SiO_x$ (x>0)) with a thickness of 5 nm to 300 nm inclusive may be formed as a first gate insulating layer and a silicon nitride layer ($SiN_y$ (y>0)) with a thickness of 50 nm to 200 nm inclusive may be stacked as a second gate insulating layer over the first gate insulating layer by a sputtering method; thus, the gate insulating layer with a thickness of 100 nm may be formed. In this embodiment, a silicon oxide layer is formed to a thickness of 100 nm by an RF sputtering method under the following condition: the pressure is 0.4 Pa; the high frequency power is 1.5 kW; and the atmosphere is an atmosphere containing oxygen and argon (the flow ratio of oxygen to argon is 1:1 (each flow rate is 25 sccm)).

Figure 6D:
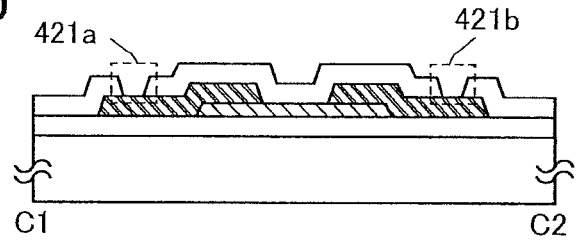

Next, a third photolithography step is performed to form a resist mask, and etching is selectively performed to remove part of the gate insulating layer 402, so that openings 421a and 421b reaching the source or drain electrode layer 415a and the source or drain electrode layer 415b are formed (see FIG. 6D).

Then, after a conductive film is formed over the gate insulating layer 402 and in the openings 421a and 421b, the gate electrode layer 411 and the wiring layers 414a and 414b are formed in a fourth photolithography step. Note that a resist mask may be formed by an ink-jet method. Formation of the resist mask by an ink-jet method needs no photomask; thus, manufacturing cost can be reduced.

Further, the conductive film for forming the gate electrode layer 411 and the wiring layers 414a and 414b can be formed with a single-layer structure or a layered structure using any of metal materials such as molybdenum, titanium, chromium, tantalum, tungsten, aluminum, copper, neodymium, and scandium, and an alloy material containing any of these materials as its main component.

As a two-layer structure of each of the gate electrode layer 411 and the wiring layers 414a and 414b, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. As a three-layer structure, a stack of a tungsten layer or a tungsten nitride layer, an alloy layer of aluminum and silicon or an alloy layer of aluminum and titanium, and a titanium nitride layer or a titanium layer is preferable. Note that the gate electrode layer can be formed from a light-transmitting conductive film. As an example of a material of the light-transmitting conductive film, a light-transmitting conductive oxide or the like can be given.

In this embodiment, a titanium film is formed to a thickness of 150 nm by a sputtering method for the gate electrode layer 411 and the wiring layers 414a and 414b.

Next, second heat treatment (preferably 200° C. to 400° C. inclusive, for example, from 250° C. to 350° C. inclusive) is performed in an inert gas atmosphere or an oxygen gas atmosphere. In this embodiment, the second heat treatment is performed in a nitrogen atmosphere at 250° C. for one hour. The second heat treatment may be performed after a protective insulating layer or a planarization insulating layer is formed over the thin film transistor 410.

Further, heat treatment may be performed at 100° C. to 200° C. inclusive for one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure. When the heat treatment is performed under a reduced pressure, the heating time can be shortened.

Figure 6E:
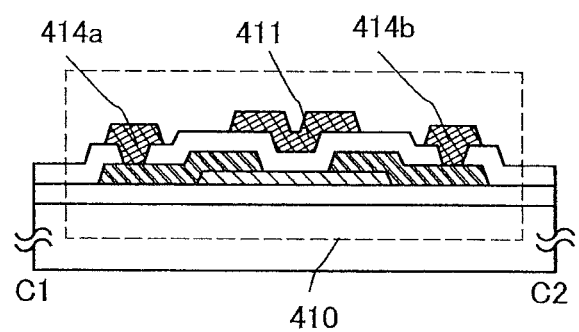

Through the above steps, the thin film transistor 410 including the oxide semiconductor layer 412 in which the concentration of hydrogen, moisture, hydride, or hydroxide is reduced can be formed (see FIG. 6E).

A protective insulating layer or a planarization insulating layer for planarization may be provided over the thin film transistor 410. For example, the protective insulating layer may be formed with a single-layer structure or a layered structure using any of a silicon oxide layer, a silicon nitride layer, a silicon oxynitride layer, a silicon nitride oxide layer, and an aluminum oxide layer.

The planarization insulating layer can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The planarization insulating layer may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the planarization insulating layer, and the planarization insulating layer can be formed, depending on the material, by a method such as a sputtering method, an SOG method, spin coating, dip coating, spray coating, or a droplet discharge method (such as an ink-jet method, screen printing, offset printing, or the like), or a tool (equipment) such as a doctor knife, a roll coater, a curtain coater, or a knife coater.

Moisture remaining in a reaction atmosphere is removed as described above in forming the oxide semiconductor film, whereby the concentration of hydrogen and hydride in the oxide semiconductor film can be reduced. Accordingly, the oxide semiconductor film can be stable.

The capacitor in the voltage regulator circuit according to an embodiment of the present invention can be formed through the same manufacturing steps as the transistor in this embodiment. When the transistor and the capacitor are formed through the same manufacturing steps, the number of manufacturing steps can be reduced.

With the above structure, the transistor can have stable electric characteristics and high reliability. Since leakage current is small in the transistor, by forming the voltage regulator circuit according to an embodiment of the present invention with the use of the transistor, a speed at which a desired voltage is achieved can be significantly increased. Further, by forming the voltage regulator circuit according to an embodiment of the present invention with the use of the transistor, the voltage regulator circuit can have stable electric characteristics and high reliability.

This embodiment can be implemented by being combined with any of other embodiments as appropriate.

Embodiment 5

In this embodiment, another example of a thin film transistor which can be used as a transistor included in the voltage regulator circuit disclosed in this specification will be described. The same portions as those in Embodiment 4 and portions having functions similar to those of the portions in Embodiment 4 and steps similar to those in Embodiment 4 may be handled as in Embodiment 4, and repeated description is omitted. In addition, detailed description of the same portions is also omitted.

One embodiment of a transistor and a manufacturing method of the transistor of this embodiment is described with reference to FIGS. 7A and 7B and FIGS. 8A to 8E.

Figure 7A:
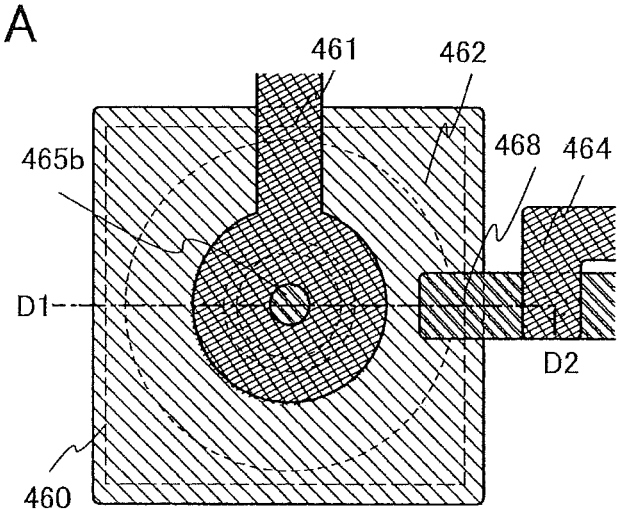
FIGS. 7A and 7B are a top view and a cross-sectional view illustrating a transistor.
Figure 7B:
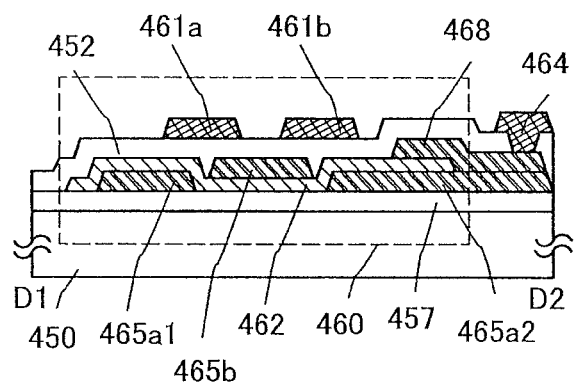

FIGS. 7A and 7B illustrate an example of a planar structure and an example of a cross-sectional structure of a transistor. A thin film transistor 460 illustrated in FIGS. 7A and 7B is one of top gate thin film transistors.

FIG. 7A is a plan view of the thin film transistor 460 having a top-gate structure and FIG. 7B is a cross-sectional view taken along D1-D2 in FIG. 7A.

The thin film transistor 460 includes, over a substrate 450 having an insulating surface, an insulating layer 457, a source or drain electrode layer 465a (465a1 and 465a2), an oxide semiconductor layer 462, a source or drain electrode layer 465b, a wiring layer 468, a gate insulating layer 452, and a gate electrode layer 461 (461a and 461b). The source or drain electrode layer 465a (465a1 and 465a2) is electrically connected to a wiring layer 464 through the wiring layer 468. Although not illustrated, the source or drain electrode layer 465b is electrically connected to a different wiring layer through an opening formed in the gate insulating layer 452.

A process of manufacturing the thin film transistor 460 over the substrate 450 is described below with reference to FIGS. 8A to 8E.

First, the insulating layer 457 which serves as a base film is formed over the substrate 450 having an insulating surface.

In this embodiment, a silicon oxide layer is formed as the insulating layer 457 by a sputtering method. The substrate 450 is transferred to a treatment chamber and a high-purity sputtering gas from which hydrogen and moisture are removed and which contains oxygen is introduced, and a silicon oxide layer is formed as the insulating layer 457 over the substrate 450 with the use of a silicon target or a quartz (preferably synthetic quartz). As a sputtering gas, oxygen or a mixed gas of oxygen and argon is used.

For example, a silicon oxide film is formed by an RF sputtering method under the following condition: quartz (preferably, synthetic quartz) with a purity of 6N is used as a target; the substrate temperature is 108° C.; the distance between the substrate and the target (the T-S distance) is 60 mm; the pressure is 0.4 Pa; the high frequency power is 1.5 kW; and the atmosphere is an atmosphere containing oxygen and argon (the flow ratio of oxygen to argon is 1:1 (each flow rate is 25 sccm). The thickness of the silicon oxide film is 100 nm. Note that instead of quartz (preferably, synthetic quartz), a silicon target can be used as a target when the silicon oxide film is formed.

In that case, the insulating layer 457 is preferably formed removing moisture remaining in the treatment chamber. This is for preventing hydrogen, a hydroxyl group, or moisture from being contained in the insulating layer 457. In the deposition chamber which is evacuated with a cryopump, for example, a hydrogen atom, a compound containing a hydrogen atom, such as water ($H_2O$), or the like is removed, whereby the concentration of an impurity in the insulating layer 457 formed in the deposition chamber can be reduced.

It is preferable to use a high-purity gas from which an impurity such as hydrogen, water, a hydroxyl group, or hydride is removed to a concentration of several ppm or a concentration of several ppb, as a sputtering gas when the insulating layer 457 is formed.

Further, the insulating layer 457 may have a layered structure in which for example, a nitride insulating layer such as a silicon nitride layer, a silicon nitride oxide layer, an aluminum nitride layer, or an aluminum nitride oxide layer and the oxide insulating layer are stacked in this order from the substrate 450 side.

For example, a high-purity sputtering gas from which hydrogen and moisture are removed and which contains nitrogen is introduced and a silicon target is used, whereby a silicon nitride layer is formed between a silicon oxide layer and a substrate. In this case, the silicon nitride layer is preferably formed removing remaining moisture in a treatment chamber, similarly to the silicon oxide layer.

Next, a conductive film is formed over the insulating layer 457 and a first photolithography step is performed. A resist mask is formed over the conductive film and selective etching is performed, so that the source or drain electrode layer 465a1 and 465a2 is formed. Then, the resist mask is removed (see FIG. 8A). It seems in cross section as if the source or drain electrode layer 465a1 and 465a2 is divided;

however, the source or drain electrode layer 465a1 and 465a2 is a continuous layer. Note that the source electrode layer and the drain electrode layer preferably have tapered shapes because coverage with the gate insulating layer stacked thereover can be improved.

As the material of the source or drain electrode layer 465a1 and 465a2, there are an element selected from Al, Cr, Cu, Ta, Ti, Mo, and W, an alloy containing any of these elements as its component, an alloy containing any of these elements in combination, and the like. Further, one or more materials selected from manganese, magnesium, zirconium, beryllium, and yttrium may be used. Further, the conductive film may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given. Alternatively, a film of one or a plurality of elements selected from titanium (Ti), tantalum (Ta), tungsten (W), molybdenum (Mo), chromium (Cr), neodymium (Nd), and scandium (Sc) combined with Al, an alloy film containing a plurality of the above elements, or a nitride film thereof may be used.

In this embodiment, a titanium film is formed to a thickness of 150 nm by a sputtering method for the source or drain electrode layer 465a1 and 465a2.

Then, an oxide semiconductor film is formed to a thickness of 2 nm to 200 nm inclusive over the insulating layer 457.

Figure 8A:
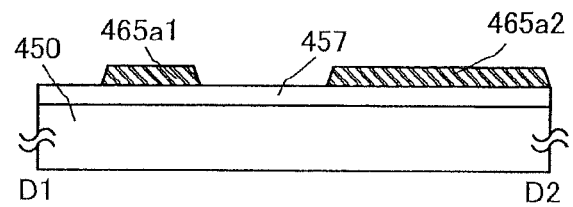
FIGS. 8A to 8E are cross-sectional views illustrating a method for manufacturing a transistor.
Figure 8B:
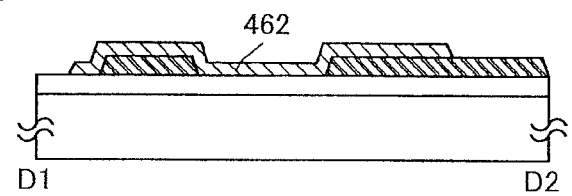
Figure 8C:
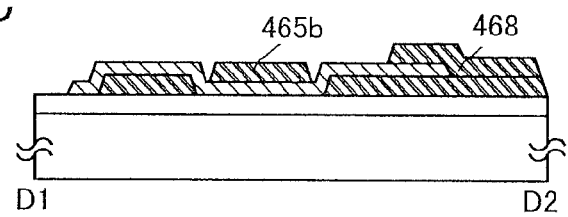
Figure 8D:
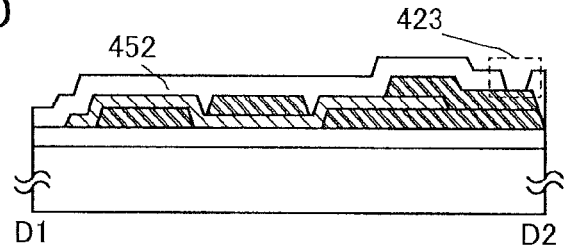

Then, the oxide semiconductor film is processed in a second photolithography step into an island-shaped oxide semiconductor layer 462 (see FIG. 8B). In this embodiment, the oxide semiconductor film is formed by a sputtering method with the use of an In—Ga—Zn—O-based metal oxide target.

The substrate is held in a treatment chamber kept under reduced pressure, a sputtering gas from which hydrogen and moisture are removed is introduced into the treatment chamber from which remaining moisture is being removed, and the oxide semiconductor film is deposited over the substrate 450 with the use of a metal oxide as a target. To remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced. The substrate may be heated when the oxide semiconductor film is formed.

It is preferable to use a high-purity gas from which an impurity such as hydrogen, water, a hydroxyl group, or hydride is removed to a concentration of several ppm or a concentration of several ppb, as a sputtering gas when the oxide semiconductor film is formed.

An example of the deposition condition is as follows: the substrate temperature is room temperature, the distance between the substrate and the target is 60 mm, the pressure is 0.4 Pa, the DC power is 0.5 kW, and the atmosphere is an atmosphere containing oxygen and argon (the flow ratio of oxygen to argon is 15 sccm:30 sccm=1:2). It is preferable that a pulsed DC power source be used because powder substances (also referred to as particles or dust) generated in film formation can be reduced and the film thickness can be uniform. The oxide semiconductor film preferably has a thickness of 5 nm to 30 nm inclusive. Note that the appropriate thickness depends on an oxide semiconductor material used and the thickness may be selected as appropriate in accordance with a material.

In this embodiment, the oxide semiconductor film is processed into the island-shaped oxide semiconductor layer 462 by a wet etching method with a mixed solution of phosphoric acid, acetic acid, and nitric acid as an etchant.

In this embodiment, the oxide semiconductor layer 462 is subjected to first heat treatment. The temperature of the first heat treatment is greater than or equal to 400° C. and less than or equal to 750° C., preferably greater than or equal to 400° C. and less than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, entry of water and hydrogen into the oxide semiconductor layer is prevented; thus, the oxide semiconductor layer is obtained. Through the first heat treatment, dehydration or dehydrogenation of the oxide semiconductor layer 462 can be conducted.

Note that the heat treatment apparatus is not limited to an electric furnace, and may have a device for heating an object to be processed by thermal conduction or thermal radiation from a heating element such as a resistance heating element. For example, an RTA (rapid thermal anneal) apparatus such as a GRTA (gas rapid thermal anneal) apparatus, or an LRTA (lamp rapid thermal anneal) apparatus can be used. For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment for a short time.

Note that in the first heat treatment, it is preferable that water, hydrogen, or the like be not contained in nitrogen or a rare gas such as helium, neon, or argon. Alternatively, the purity of nitrogen or a rare gas such as helium, neon, or argon which is introduced into the heat treatment apparatus is greater than or equal to 6 N (99.9999%), preferably greater than or equal to 7 N (99.99999%) (i.e., the impurity concentration is less than or equal to 1 ppm, preferably less than or equal to 0.1 ppm).

The oxide semiconductor layer 462 may be crystallized to be a microcrystalline film or a polycrystalline film depending on the conditions of the first heat treatment or the material of the oxide semiconductor layer.

In addition, the first heat treatment can be performed on the oxide semiconductor film before being processed into the island-shaped oxide semiconductor layer 462. In that case, the substrate is taken out of the heat treatment apparatus after the first heat treatment, and then a photolithography step is performed.

The heat treatment having an effect of dehydration or dehydrogenation with respect to the oxide semiconductor layer may be performed at any of the following timings: after the oxide semiconductor layer is formed; after a source electrode and a drain electrode are formed over the oxide semiconductor layer; and after a gate insulating layer is formed over the source electrode and the drain electrode.

Next, a conductive film is formed over the insulating layer 457 and the oxide semiconductor layer 462 and a third photolithography step is performed. A resist mask is formed over the conductive film and selective etching is performed, so that the source or drain electrode layer 465b and the wiring layer 468 are formed. Then, the resist mask is removed (see FIG. 8C). The source or drain electrode layer 465b and the wiring layer 468 may be formed using a material and steps similar to those of the source or drain electrode layer 465a1 and 465a2.

In this embodiment, a titanium film is formed to a thickness of 150 nm by a sputtering method for the source or drain electrode layer 465b and the wiring layer 468. In this embodiment, the same titanium film is used for the source or drain electrode layer 465a1 and 465a2 and the source or drain electrode layer 465b, so that the etching rate of the source or drain electrode layer 465al and 465a2 is the same or substantially the same as that of the source or drain electrode layer 465b. Therefore, the wiring layer 468 is provided over a portion of the source or drain electrode layer 465a2, which is not covered with the oxide semiconductor layer 462, to prevent the source or drain electrode layer 465a1 and 465a2 from being etched when the source or drain electrode layer 465b is etched. In the case of using different materials which provide high selectivity ratio of the source or drain electrode layer 465b to the source or drain electrode layer 465a1 and 465a2 in the etching step, the wiring layer 468 which protects the source or drain electrode layer 465a2 in etching is not necessarily provided.

Note that the material and the etching conditions are adjusted as appropriate so that the oxide conductive layer 462 is not removed by etching of the conductive film.

In this embodiment, a titanium film is used as the conductive film, an In—Ga—Zn—O based oxide semiconductor is used as the oxide semiconductor layer 462, and an ammonia hydrogen peroxide solution (a mixture of ammonia, water, and a hydrogen peroxide solution) is used as an etchant.

In the third photolithography step, only part of the oxide semiconductor layer 462 may be etched off, whereby an oxide semiconductor layer having a groove (a depressed portion) may be formed. A resist mask used for forming the source or drain electrode layer 465b and the wiring layer 468 may be formed by an ink-jet method. Formation of the resist mask by an ink-jet method needs no photomask; thus, manufacturing cost can be reduced.

Next, the gate insulating layer 452 is formed over the insulating layer 457, the oxide semiconductor layer 462, the source or drain electrode layer 465a1 and 465a2, the source or drain electrode layer 465b, and the wiring layer 468.

The gate insulating layer 452 can be formed with a single-layer structure or a layered structure using any of a silicon oxide layer, a silicon nitride layer, a silicon oxynitride layer, a silicon nitride oxide layer, and an aluminum oxide layer by a plasma CVD method, a sputtering method, or the like. Note that the gate insulating layer 452 is preferably formed by a sputtering method so that the gate insulating layer 452 avoids containing much hydrogen. In the case where a silicon oxide film is formed by a sputtering method, a silicon target or a quartz target is used as a target and a mixed gas of oxygen and argon is used as a sputtering gas.

The gate insulating layer 452 may have a structure where a silicon oxide layer and a silicon nitride layer are stacked from the side of the source or drain electrode layer 465a1 and 465a2 and the source or drain electrode layer 465b. In this embodiment, a silicon oxide layer is formed to a thickness of 100 nm by an RF sputtering method under the following condition: the pressure is 0.4 Pa; the high frequency power is 1.5 kW; and the atmosphere is an atmosphere containing oxygen and argon (the flow ratio of oxygen to argon is 1:1 (each flow rate is 25 sccm).

Next, a fourth photolithography step is performed. A resist mask is formed and selective etching is performed to remove part of the gate insulating layer 452, so that an opening 423 reaching the wiring layer 468 is formed (see FIG. 8D). Although not illustrated, in forming the opening 423, an opening reaching the source or drain electrode layer 465b may be formed. In this embodiment, the opening reaching the source or drain electrode layer 465b is formed after an interlayer insulating layer is further stacked, and a wiring layer for electrical connection is formed in the opening.

Then, after a conductive film is formed over the gate insulating layer 452 and in the opening 423, the gate electrode layer 461 (461a and 461b) and the wiring layer 464 are formed in a fifth photolithography step. Note that a resist mask may be formed by an ink-jet method. When the resist mask is formed by an ink-jet method, a photomask is not used; therefore, manufacturing costs can be reduced.

The conductive film for forming the gate electrode layer 461 (461a and 461b) and the wiring layer 464 can be formed with a single layer or stacked layers using a metal material such as molybdenum, titanium, chromium, tantalum, tungsten, aluminum, copper, neodymium, or scandium, or an alloy material containing any of these materials as its main component.

In this embodiment, a titanium film is formed to a thickness of 150 nm by a sputtering method for the gate electrode layer 461 (461a and 461b) and the wiring layer 464.

Next, second heat treatment (preferably 200° C. to 400° C. inclusive, for example, from 250° C. to 350° C. inclusive) is performed in an inert gas atmosphere or an oxygen gas atmosphere. In this embodiment, the second heat treatment is performed in a nitrogen atmosphere at 250° C. for one hour. The second heat treatment may be performed after a protective insulating layer or a planarization insulating layer is formed over the thin film transistor 460.

Further, heat treatment may be performed at 100° C. to 200° C. inclusive for one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure. When the heat treatment is performed under a reduced pressure, the heating time can be shortened.

Figure 8E:
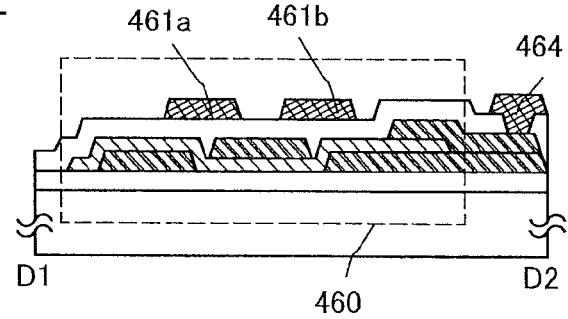

Through the above steps, the thin film transistor 460 including the oxide semiconductor layer 462 in which the concentration of hydrogen, moisture, hydride, or hydroxide is reduced can be formed (see FIG. 8E).

A protective insulating layer or a planarization insulating layer for planarization may be provided over the thin film transistor 460. Although not illustrated, an opening reaching the source or drain electrode layer 465b is formed in the gate insulating layer 452 and the protective insulating layer and/or the planarization insulating layer, and a wiring layer which is electrically connected to the source or drain electrode layer 465b is formed in the opening.

Moisture remaining in a reaction atmosphere is removed as described above in forming the oxide semiconductor film, whereby the concentration of hydrogen and hydride in the oxide semiconductor film can be reduced. Accordingly, the oxide semiconductor film can be stable.

The capacitor in the voltage regulator circuit according to an embodiment of the present invention can be formed through the same manufacturing steps as the transistor in this embodiment. When the transistor and the capacitor are formed through the same manufacturing steps, the number of manufacturing steps can be reduced.

With the above structure, the transistor can have stable electric characteristics and high reliability. Since leakage current is small in the transistor, by forming the voltage regulator circuit according to an embodiment of the present invention with the use of the transistor, a speed at which a desired voltage is achieved can be significantly increased. Further, when the voltage regulator circuit according to an embodiment of the present invention is formed with the use of the transistor, the voltage regulator circuit can have stable electric characteristics and high reliability.

This embodiment can be implemented by being combined with any of other embodiments as appropriate.

Embodiment 6

In this embodiment, another example of a thin film transistor which can be used as a transistor included in the voltage regulator circuit disclosed in this specification will be described. The same portions as those in Embodiment 4 and portions having functions similar to those of the portions in Embodiment 4 and steps similar to those in Embodiment 4 may be handled as in Embodiment 4, and repeated description is omitted. In addition, detailed description of the same portions is also omitted. Each of thin film transistors 425 and 426 described in this embodiment can be used as the thin film transistor included in the voltage regulator circuit in any of Embodiments 1 to 3.

The thin film transistors of this embodiment are described with reference to FIGS. 9A and 9B.

Figure 9A:
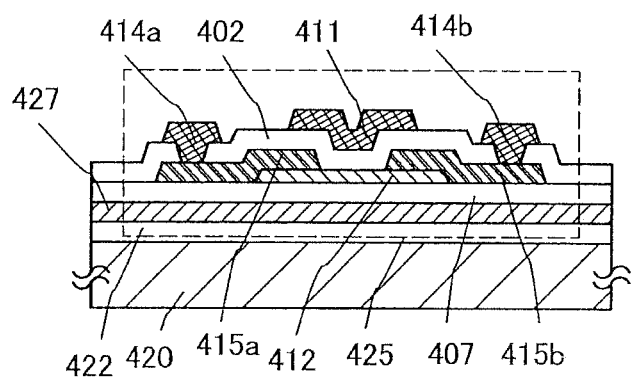
FIGS. 9A and 9B are cross-sectional views each illustrating a transistor.
Figure 9B:
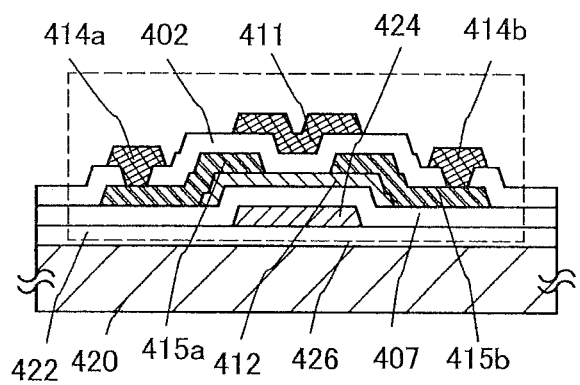

FIGS. 9A and 9B illustrate examples of cross-sectional structures of the thin film transistors. The thin film transistors 425 and 426 in FIGS. 9A and 9B are each one of thin film transistors where an oxide semiconductor layer is sandwiched between a conductive layer and a gate electrode layer.

In addition, in FIGS. 9A and 9B, a silicon substrate is used as a substrate and each of the thin film transistors 425 and 426 is provided over an insulating layer 422 which is formed over a silicon substrate 420.

In FIG. 9A, a conductive layer 427 is formed between the insulating layer 422 and an insulating layer 407 over the silicon substrate 420 so as to overlap with at least the whole oxide semiconductor layer 412.

Note that FIG. 9B illustrates an example where the conductive layer between the insulating layer 422 and the insulating layer 407 is processed like a conductive layer 424 by etching and overlaps with part of the oxide semiconductor layer 412, which includes at least a channel formation region.

The conductive layers 427 and 424 may each be formed using a metal material which can resist temperature for heat treatment to be performed later: an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, a nitride containing any of the above elements as its component, or the like. Further, the conductive layers 427 and 424 may each have either a single-layer structure or a layered structure, and for example, a single layer of a tungsten layer or a stack of a tungsten nitride layer and a tungsten layer can be used.

A potential of the conductive layers 427 and 424 may be the same as or different from that of the gate electrode layer 411 of the thin film transistors 425 and 426. The conductive layers 427 and 424 can each also function as a second gate electrode layer. The potential of the conductive layers 427 and 424 may be a fixed potential such as GND or 0 V.

Electric characteristics of the thin film transistors 425 and 426 can be controlled by the conductive layers 427 and 424.

This embodiment is not limited to the structure in which the second gate electrode layer is formed by providing the conductive layer. When a semiconductor substrate is used as the substrate, the substrate is subjected to thermal oxidation to form a region in the substrate, and the region can also function as the second gate electrode layer.

The capacitor in the voltage regulator circuit according to an embodiment of the present invention can be formed through the same manufacturing steps as the transistor in this embodiment. When the transistor and the capacitor are formed through the same manufacturing steps, the number of manufacturing steps can be reduced.

With the above structure, the transistor can have stable electric characteristics and high reliability. Since leakage current is small in the transistor, by forming the voltage regulator circuit according to an embodiment of the present invention with the use of the transistor, a speed at which a desired voltage is achieved can be significantly increased. Further, when the voltage regulator circuit according to an embodiment of the present invention is formed with the use of the transistor, the voltage regulator circuit can have stable electric characteristics and high reliability.

Note that this embodiment can be implemented by being combined with any of other embodiments as appropriate.

Embodiment 7

In this embodiment, an example of a thin film transistor which can be used as the transistor included in the voltage regulator circuit disclosed in this specification will be described.

One embodiment of a thin film transistor and a manufacturing method of the thin film transistor of this embodiment is described with reference to FIGS. 10A to 10E.

FIGS. 10A to 10E illustrate an example of a manufacturing method of a thin film transistor. A thin film transistor 390 illustrated in FIGS. 10A to 10E is one of bottom gate thin film transistors and is also referred to as an inverted staggered thin film transistor.

The thin film transistor 390 is described using a single-gate thin film transistor; a multi-gate thin film transistor including a plurality of channel formation regions can be formed when needed.

A process of manufacturing the thin film transistor 390 over a substrate 394 is described below with reference to FIGS. 10A to 10E.

First, after a conductive film is formed over the substrate 394 having an insulating surface, a gate electrode layer 391 is formed in a first photolithography step. The gate electrode layer preferably has a tapered shape because coverage with a gate insulating layer stacked thereover can be improved. Note that a resist mask may be formed by an ink-jet method. Formation of the resist mask by an ink-jet method needs no photomask; thus, manufacturing cost can be reduced.

There is no particular limitation on a substrate that can be used as the substrate 394 having an insulating surface as long as it has at least heat resistance to withstand heat treatment performed later. A glass substrate formed using barium borosilicate glass, aluminoborosilicate glass, or the like can be used.

In the case where the temperature at which the heat treatment is to be performed is high, a glass substrate whose strain point is greater than or equal to 730° C. is preferably used. As a glass substrate, a glass material such as aluminosilicate glass, aluminoborosilicate glass, or barium borosilicate glass is used, for example. Note that by containing a larger amount of barium oxide (BaO) than boron oxide ($B_2O_3$), more practical heat-resistant glass can be obtained. Therefore, a glass substrate containing a larger amount of BaO than $B_2O_3$ is preferably used.

Note that, instead of the glass substrate described above, a substrate formed using an insulator such as a ceramic substrate, a quartz substrate, or a sapphire substrate may be used. Alternatively, a crystallized glass substrate or the like may be used. Still alternatively, a plastic substrate or the like can be used as appropriate. In addition, a semiconductor substrate of silicon or the like can be used as the substrate.

An insulating film serving as a base film may be provided between the substrate 394 and the gate electrode layer 391. The base film has a function of preventing diffusion of an impurity element from the substrate 394, and can be formed with a single-layer structure or a layered structure using one or more of a silicon nitride film, a silicon oxide film, a silicon nitride oxide film, and a silicon oxynitride film.

The conductive film for forming the gate electrode layer 391 can be formed with a single layer or stacked layers using a metal material such as molybdenum, titanium, chromium, tantalum, tungsten, aluminum, copper, neodymium, or scandium, or an alloy material which contains any of these materials as its main component.

As a two-layer structure of the gate electrode layer 391, for example, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure in which a titanium nitride layer and a molybdenum layer are stacked, or a two-layer structure in which a tungsten nitride layer and a tungsten layer are stacked is preferable. As a three-layer structure, a stack of a tungsten layer or a tungsten nitride layer, an alloy layer of aluminum and silicon or an alloy layer of aluminum and titanium, and a titanium nitride layer or a titanium layer is preferable. Note that the gate electrode layer may be formed using a light-transmitting conductive film. A light-transmitting conductive oxide can be given as an example of the light-transmitting conductive film.

Then, a gate insulating layer 397 is formed over the gate electrode layer 391.

An oxide semiconductor (a highly purified oxide semiconductor) which is made to be i-type or substantially i-type by removal of an impurity is highly sensitive to an interface state and interface electric charge; thus, an interface between the oxide semiconductor and a gate insulating layer is important. Therefore, the gate insulating layer (GI) which is in contact with the highly purified oxide semiconductor needs high quality.

For example, high-density plasma CVD using microwaves (2.45 GHz) is preferable because a dense high-quality insulating film having high withstanding voltage can be formed. This is because when the highly purified oxide semiconductor is closely in contact with the high-quality gate insulating film, the interface state can be reduced and interface properties can be favorable. Here, as a high-density plasma apparatus, an apparatus which can realize a plasma density of greater than or equal to $1 \times 10^{11}/cm^3$ can be used.

For example, plasma is generated by applying a microwave power of 3 kW to 6 kW, and the insulating film is formed. A monosilane gas ($SiH_4$), nitrous oxide ($N_2O$), and a rare gas are introduced into a chamber as a source gas to generate high-density plasma at a pressure of 10 Pa to 30 Pa, and the insulating film is formed over a substrate having an insulating surface, such as a glass substrate. After that, the supply of a monosilane gas is stopped, and nitrous oxide ($N_2O$) and a rare gas are introduced without exposure to the air, and plasma treatment may be performed on a surface of the insulating film. The plasma treatment performed on the surface of the insulating film by introducing nitrous oxide ($N_2O$) and a rare gas is performed at least after the insulating film is formed. The flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Needless to say, a different deposition method such as a sputtering method or a plasma CVD method can be used as long as a high-quality insulating film can be formed as the gate insulating layer 397. In addition, any insulating film can be used as long as film quality and properties of an interface with an oxide semiconductor of the gate insulating film are modified by heat treatment performed after deposition. In any case, any insulating film can be used as long as film quality as a gate insulating film is high, interface state density with an oxide semiconductor is decreased, and a favorable interface can be formed.

In a gate-bias thermal stress test (BT test) at 85° C. and $2 \times 10^6$ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a shift (a drift) in the threshold voltage ($V_{th}$). As a countermeasure against this, in the transistor which is an embodiment of the present invention, the impurity in the oxide semiconductor, especially, hydrogen, water, or the like is removed as much as possible so that the properties of an interface with the gate insulating layer are favorable as described above. Accordingly, it is possible to obtain a thin film transistor which is stable with respect to the BT test.

As the gate insulating layer 397, a single layer or stacked layer can be formed using one or more of a silicon oxide layer, a silicon nitride layer, a silicon oxynitride layer (also referred to as $SiO_xN_y$, x>y>0), a silicon nitride oxide layer (also referred to as $SiN_xO_y$, x>y>0), and an aluminum oxide layer.

In addition, the gate insulating layer 397 can have a structure in which a silicon oxide layer and a silicon nitride layer are stacked. In this embodiment, for example, a silicon oxynitride layer with a thickness of 100 nm is formed by a high-density plasma CVD method with a pressure of 30 Pa and a microwave power of 6 kW. The flow ratio of a monosilane gas ($SiH_4$) to nitrous oxide ($N_2O$) which are introduced into the chamber is 1:10.

Further, in order that hydrogen, a hydroxyl group and moisture might be contained in the gate insulating layer 397 and an oxide semiconductor film 393 as little as possible, it is preferable that the substrate 394 over which the gate electrode layer 391 is formed or the substrate 394 over which layers up to the gate insulating layer 397 are formed be preheated in a preheating chamber of a sputtering apparatus as pretreatment for film formation so that impurities such as hydrogen and moisture adsorbed to the substrate 394 are eliminated and exhaustion is performed. The temperature for the preheating is 100° C. to 400° C. inclusive, preferably 150° C. to 300° C. inclusive. Note that a cryopump is preferable as an evacuation unit provided in the preheating chamber. Note that this preheating treatment may be omitted. Further, this preheating may be similarly performed on the substrate 394 over which layers up to a source or drain electrode layer 395a and a source or drain electrode layer 395b have been formed, before formation of the oxide insulating layer 396.

Figure 10A:
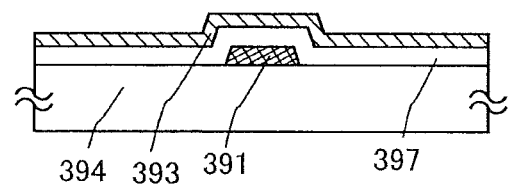
FIGS. 10A to 10E are cross-sectional views illustrating a method for manufacturing a transistor.

Then, an oxide semiconductor film 393 is formed to a thickness of 2 nm to 200 nm inclusive over the gate insulating layer 397 (see FIG. 10A).

Note that before the oxide semiconductor film 393 is formed by a sputtering method, dust attached to a surface of the gate insulating layer 397 is preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to generate plasma in the vicinity of the substrate and modify a surface. Note that instead of an argon atmosphere, a nitrogen atmosphere, a helium atmosphere, an oxygen atmosphere, or the like may be used.

The oxide semiconductor film 393 is formed by a sputtering method. The oxide semiconductor film 393 is formed using an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, an In—Sn—O-based oxide semiconductor film, a Sn—O-based oxide semiconductor film, or a Zn—O-based oxide semiconductor film. In this embodiment, the oxide semiconductor film 393 is formed by a sputtering method with the use of an In—Ga—Zn—O-based metal oxide target. Further, the oxide semiconductor film 393 can be formed by a sputtering method in a rare gas (typically, argon) atmosphere, an oxygen atmosphere, or an atmosphere containing a rare gas (typically, argon) and oxygen. In the case of employing a sputtering method, a target containing $SiO_2$ at 2 wt % to 10 wt % inclusive may be used for film formation.

As a target for forming the oxide semiconductor film 393 by a sputtering method, a metal oxide target containing zinc oxide as its main component can be used. As another example of the metal oxide target, for example, a metal oxide target with a composition ratio of $In_2O_3:Ga_2O_3$:ZnO=1:1:1 (molar ratio) can be used. Without limitation to the above target, for example, a metal oxide target with a composition ratio of $In_2O_3:Ga_2O_3:ZnO$=1:1:2 (molar ratio) may be used. The fill rate of the metal oxide target is 90% to 100% inclusive, preferably, 95% to 99.9% inclusive. With the use of the metal oxide target with high fill rate, the oxide semiconductor film formed is dense.

The substrate is held in a treatment chamber kept under reduced pressure, and the substrate is heated to room temperature or a temperature of less than 400° C. Then, a sputtering gas from which hydrogen and moisture are removed is introduced into the treatment chamber from which remaining moisture is being removed, and the oxide semiconductor film 393 is formed over the substrate 394 with the use of a metal oxide as a target. To remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced. By performing deposition by sputtering while removing moisture remaining in the treatment chamber using a cryopump, a substrate temperature when the oxide semiconductor film 393 is formed can be greater than or equal to room temperature and less than 400° C.

An example of the deposition condition is as follows: the distance between the substrate and the target is 60 mm, the pressure is 0.6 Pa, the DC power is 0.5 kW, and the atmosphere is an oxygen atmosphere (the flow rate of oxygen is 100%). It is preferable that a pulsed DC power source be used because powder substances generated in film formation can be reduced and the film thickness can be uniform. The oxide semiconductor film preferably has a thickness of 5 nm to 30 nm inclusive. Note that the appropriate thickness depends on an oxide semiconductor material used and the thickness may be selected as appropriate in accordance with a material.

Figure 10B:
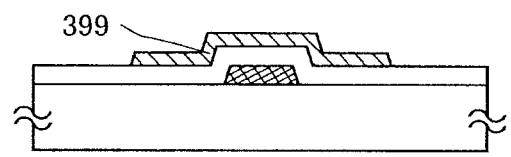
Figure 10C:
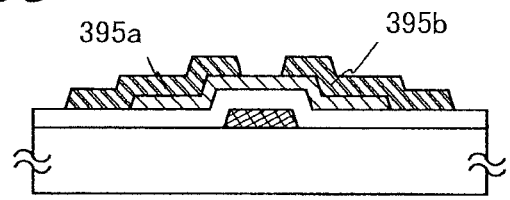

Next, the oxide semiconductor film is processed into an island-shaped oxide semiconductor layer 399 through a second photolithography step (see FIG. 10B). Further, a resist mask for forming the island-shaped oxide semiconductor layer 399 may be formed using an ink-jet method. Formation of the resist mask by an ink-jet method needs no photomask; thus, manufacturing cost can be reduced.

In the case of forming a contact hole in the gate insulating layer 397, the step may be performed in forming the oxide semiconductor layer 399.

Note that the etching of the oxide semiconductor film 393 may be dry etching, wet etching, or both dry etching and wet etching.

As an etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

In addition, a gas containing fluorine (fluorine-based gas such as carbon tetrafluoride ($CF_4$), sulfur fluoride ($SF_6$), nitrogen fluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As a dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. In addition, ITO07N (produced by KANTO CHEMICAL CO., INC.) may be used.

The etchant after the wet etching is removed together with the material etched off by cleaning. The waste liquid including the etchant and the material etched off may be purified and the material may be reused. When a material such as indium contained in the oxide semiconductor layer is collected from the waste liquid after the etching and reused, the resources can be efficiently used and the cost can be reduced.

The etching condition (such as an etchant, etching time, or temperature) is appropriately adjusted depending on the material so that the material can be etched into a desired shape.

Note that it is preferable to perform reverse sputtering before formation of a conductive film in the following step so that a resist residue and the like attached to surfaces of the oxide semiconductor layer 399 and the gate insulating layer 397 can be removed.

Next, a conductive film is formed over the gate insulating layer 397 and the oxide semiconductor layer 399. For example, the conductive film may be formed by a sputtering method or a vacuum evaporation method. As a material of the conductive film, an element selected from Al, Cr, Cu, Ta, Ti, Mo, and W; an alloy containing any of these elements as its component; an alloy containing any of these elements in combination; and the like can be given. Further, one or more materials selected from manganese, magnesium, zirconium, beryllium, and yttrium may be used. Further, the conductive film may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given. Alternatively, a film of one or a plurality of elements selected from titanium (Ti), tantalum (Ta), tungsten (W), molybdenum (Mo), chromium (Cr), neodymium (Nd), and scandium (Sc) combined with Al, an alloy film containing a plurality of the above elements, or a nitride film thereof may be used.

A third photolithography step is performed. A resist mask is formed over the conductive film and selective etching is performed, so that the source and drain electrode layers 395a and 395b are formed. Then, the resist mask is removed (see FIG. 10C).

Ultraviolet, a KrF laser beam, or an ArF laser beam is used for light exposure for forming the resist mask in the third photolithography step. A channel length L of the thin film transistor to be formed later depends on a width of a distance between a bottom portion of the source electrode layer and a bottom portion of the drain electrode layer which are adjacent to each other over the oxide semiconductor layer 399. Note that when light exposure is performed in the case where the channel length L is shorter than 25 nm, extreme ultraviolet with extremely short wavelengths of several nanometers to several tens of nanometers is used for light exposure for forming the resist mask in the third photolithography step. Light exposure with extreme ultraviolet leads to a high resolution and a large depth of focus. Accordingly, the channel length L of the thin film transistor to be formed later can be set to 10 nm to 1000 nm inclusive. Thus, the operation speed of a circuit can be increased, and further, an off current is significantly small, so that low power consumption can be achieved.

Note that the material and the etching conditions are adjusted as appropriate so that the oxide semiconductor layer 399 is not removed by etching of the conductive film.

In this embodiment, a titanium film is used as the conductive film, an In—Ga—Zn—O-based oxide semiconductor film is used as the oxide semiconductor layer 399, and an ammonia hydrogen peroxide solution (a mixture of ammonia, water, and a hydrogen peroxide solution) is used as an etchant.

In the third photolithography step, only part of the oxide semiconductor layer 399 may be etched off, whereby an oxide semiconductor layer having a groove (a depression portion) may be formed. Note that a resist mask used for forming the source and drain electrode layers 395a and 395b may be formed by an ink-jet method. Formation of the resist mask by an ink-jet method needs no photomask; thus, manufacturing cost can be reduced.

In order to reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using one multi-tone mask. Thus, the number of light-exposure masks can be reduced and the number of corresponding photolithography steps can be also reduced, whereby simplification of a process can be realized.

With plasma treatment with a gas such as $N_2O$, $N_2$, or Ar, water or the like adsorbed to a surface of an exposed portion of the oxide semiconductor layer may be removed. Alternatively, plasma treatment may be performed using a mixed gas of oxygen and argon.

Figure 10D:
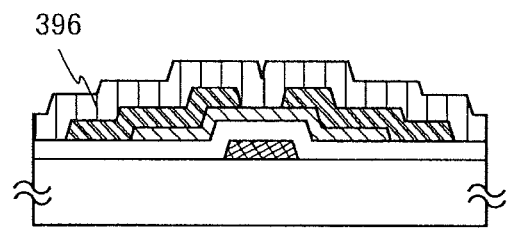

In the case of performing the plasma treatment, the oxide insulating layer 396 is formed without exposure to the air as an oxide insulating layer which serves as a protective insulating film and is in contact with part of the oxide semiconductor layer (see FIG. 10D). In this embodiment, the oxide insulating layer 396 is formed in contact with the oxide semiconductor layer 399 in a region where the oxide semiconductor layer 399 does not overlap with the source electrode layer 395a and the drain electrode layer 395b.

In this embodiment, the substrate 394 over which layers up to the island-shaped oxide semiconductor layer 399, the source electrode layer 395a, and the drain electrode layer 395b have been formed is heated to room temperature or a temperature of less than 100° C. and a high-purity sputtering gas from which hydrogen and moisture are removed and which contains oxygen is introduced, and a silicon semiconductor target is used, whereby a silicon oxide layer having a defect is formed as the oxide insulating layer 396.

For example, the silicon oxide film is formed by a pulsed DC sputtering method in which the purity is 6N, a boron-doped silicon target (the resistivity is 0.01 Ωcm) is used, the distance between the substrate and the target (T-S distance) is 89 mm, the pressure is 0.4 Pa, the DC power is 6 kW, and the atmosphere is an oxygen atmosphere (the oxygen flow rate is 100%). The thickness of the silicon oxide film is 300 nm. Note that instead of a silicon target, quartz (preferably, synthetic quartz) can be used as a target when the silicon oxide film is formed. As a sputtering gas, oxygen or a mixed gas of oxygen and argon is used.

In that case, the oxide insulating layer 396 is preferably formed removing moisture remaining in the treatment chamber. This is for preventing hydrogen, a hydroxyl group, and moisture from being contained in the oxide semiconductor layer 399 and the oxide insulating layer 396.

In order to remove moisture remaining in the treatment chamber, an entrapment vacuum pump is preferably used.

For example, a cryopump, an ion pump, or a titanium sublimation pump is preferably used. Further, an evacuation unit may be a turbo pump provided with a cold trap. In the deposition chamber which is evacuated with the cryopump, for example, a hydrogen atom, a compound containing a hydrogen atom, such as water ($H_2O$), and the like are removed, whereby the concentration of an impurity in the oxide insulating layer 396 formed in the deposition chamber can be reduced.

Note that as the oxide insulating layer 396, a silicon oxynitride layer, an aluminum oxide layer, an aluminum oxynitride layer, or the like may be used instead of the silicon oxide layer.

Further, heat treatment may be performed at 100° C. to 400° C. while the oxide insulating layer 396 and the oxide semiconductor layer 399 are in contact with each other. Since the oxide insulating layer 396 in this embodiment has a lot of defects, with this heat treatment, an impurity such as hydrogen, moisture, a hydroxyl group, or hydride contained in the oxide semiconductor layer 399 can be diffused to the oxide insulating layer 396 so that the impurity in the oxide semiconductor layer 399 can be further reduced.

Figure 10E:
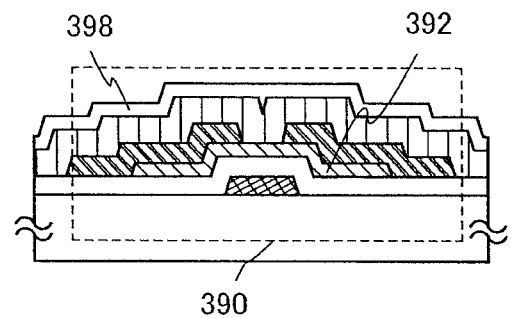

Through the above steps, the thin film transistor 390 including the oxide semiconductor layer 392 in which the concentration of hydrogen, moisture, hydride, or hydroxide is reduced can be formed (see FIG. 10E).

Moisture remaining in a reaction atmosphere is removed as described above in forming the oxide semiconductor film, whereby the concentration of hydrogen and hydride in the oxide semiconductor film can be reduced. Accordingly, the oxide semiconductor film can be stable.

A protective insulating layer may be provided over the oxide insulating layer. In this embodiment, the protective insulating layer 398 is formed over the oxide insulating layer 396. As the protective insulating layer 398, a silicon nitride film, a silicon nitride oxide film, an aluminum nitride film, an aluminum nitride oxide film, or the like is used.

The substrate 394 over which layers up to the oxide insulating layer 396 have been formed is heated to a temperature of 100° C. to 400° C., a high-purity sputtering gas from which hydrogen and moisture are removed and which contains nitrogen is introduced, and a silicon semiconductor target is used, whereby a silicon nitride film is formed as the protective insulating layer 398. In this case, the protective insulating layer 398 is preferably formed removing moisture remaining in a treatment chamber, similarly to the oxide insulating layer 396.

In the case where the protective insulating layer 398 is formed, the substrate 394 is heated to 100° C. to 400° C. in forming the protective insulating layer 398, whereby hydrogen or moisture contained in the oxide semiconductor layer 399 can be diffused to the oxide insulating layer 396. In that case, heat treatment is not necessarily performed after formation of the oxide insulating layer 396.

In the case where the silicon oxide layer is formed as the oxide insulating layer 396 and the silicon nitride layer is stacked thereover as the protective insulating layer 398, the silicon oxide layer and the silicon nitride layer can be formed with the use of a common silicon target in the same treatment chamber. After a sputtering gas containing oxygen is introduced first, a silicon oxide layer is formed using a silicon target mounted in the treatment chamber, and then, the sputtering gas is switched to a sputtering gas containing nitrogen and the same silicon target is used to form a silicon nitride layer. Since the silicon oxide layer and the silicon nitride layer can be formed successively without being exposed to the air, impurities such as hydrogen and moisture can be prevented from adsorbing onto a surface of the silicon oxide layer. In that case, after the silicon oxide layer is formed as the oxide insulating layer 396 and the silicon nitride layer is stacked thereover as the protective insulating layer 398, heat treatment (at a temperature of 100° C. to 400° C.) for diffusing hydrogen or moisture contained in the oxide semiconductor layer to the oxide insulating layer is preferably performed.

After the protective insulating layer 398 is formed, heat treatment may be further performed at 100° C. to 200° C. inclusive for one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure before formation of the oxide insulating layer 396. When the heat treatment is performed under a reduced pressure, the heating time can be shortened. With this heat treatment, the thin film transistor can be normally off. Therefore, reliability of the thin film transistor can be improved.

Moisture remaining in a reaction atmosphere is removed in forming the oxide semiconductor layer including a channel formation region over the gate insulating layer, whereby the concentration of hydrogen and hydride in the oxide semiconductor layer can be reduced.

Since the above steps can be performed at a temperature of less than or equal to 400° C., they can also be applied to manufacturing steps where a glass substrate with a thickness of less than or equal to 1 mm and a side of greater than 1 m is used. In addition, all of the above steps can be performed at a treatment temperature of less than or equal to 400° C.

Figure 11:
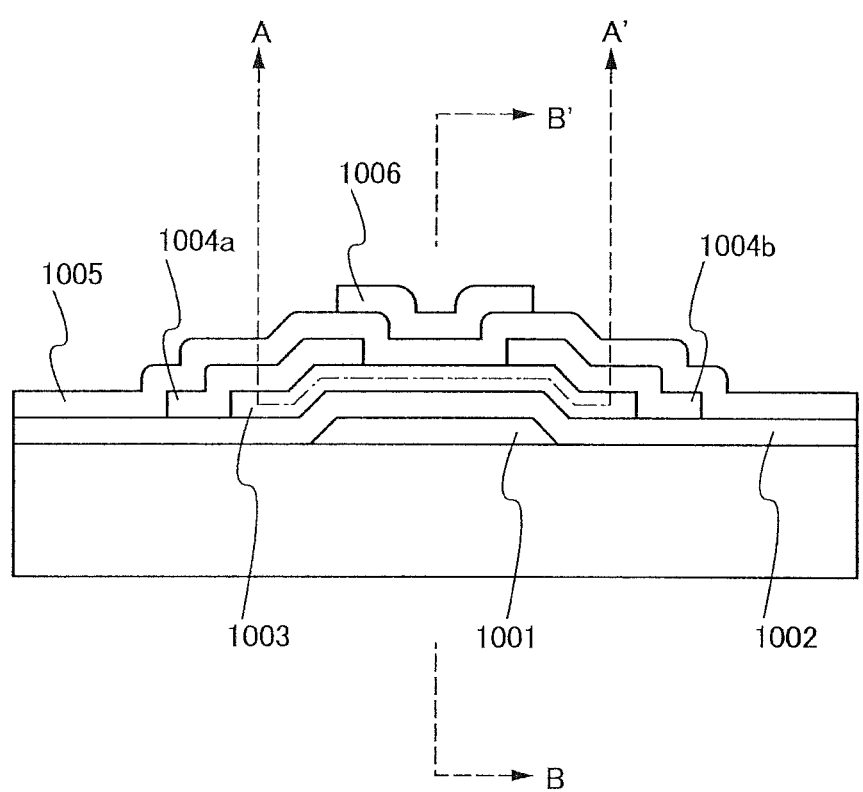
FIG. 11 is a cross-sectional view of an inverted staggered thin film transistor which includes an oxide semiconductor.

FIG. 11 is a longitudinal cross-sectional view of an inverted staggered thin film transistor which includes an oxide semiconductor. An oxide semiconductor layer 1003 is provided over a gate electrode 1001 with a gate insulating film 1002 therebetween, a source electrode 1004a and a drain electrode 1004b are provided thereover, an oxide insulating layer 1005 is provided over the source electrode 1004a and the drain electrode 1004b, and a conductive layer 1006 is provided over the oxide semiconductor layer 1003 with the oxide insulating layer 1005 therebetween.

Figure 12A:
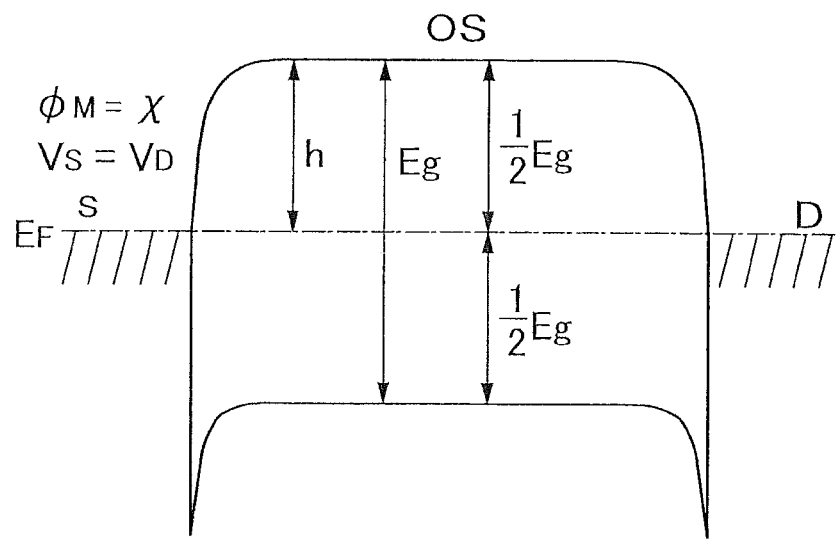
FIGS. 12A and 12B are each an energy band diagram (schematic diagram) of a cross section along A-A' in FIG. 11.
Figure 12B:
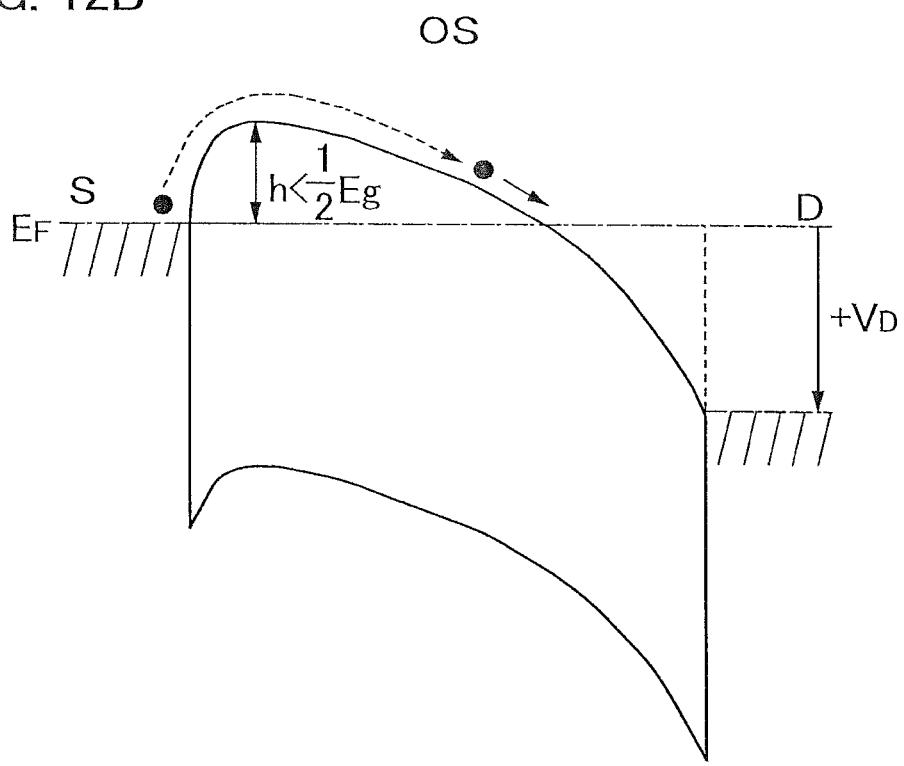

FIGS. 12A and 12B are energy band diagrams (schematic diagrams) of an A-A' section illustrated in FIG. 11. FIG. 12A illustrates the case where the potential of a voltage applied to the source is equal to the potential of a voltage applied to the drain (VD=0 V), and FIG. 12B illustrates the case where a positive potential with respect to the source is applied to the drain (VD>0).

Figure 13A:
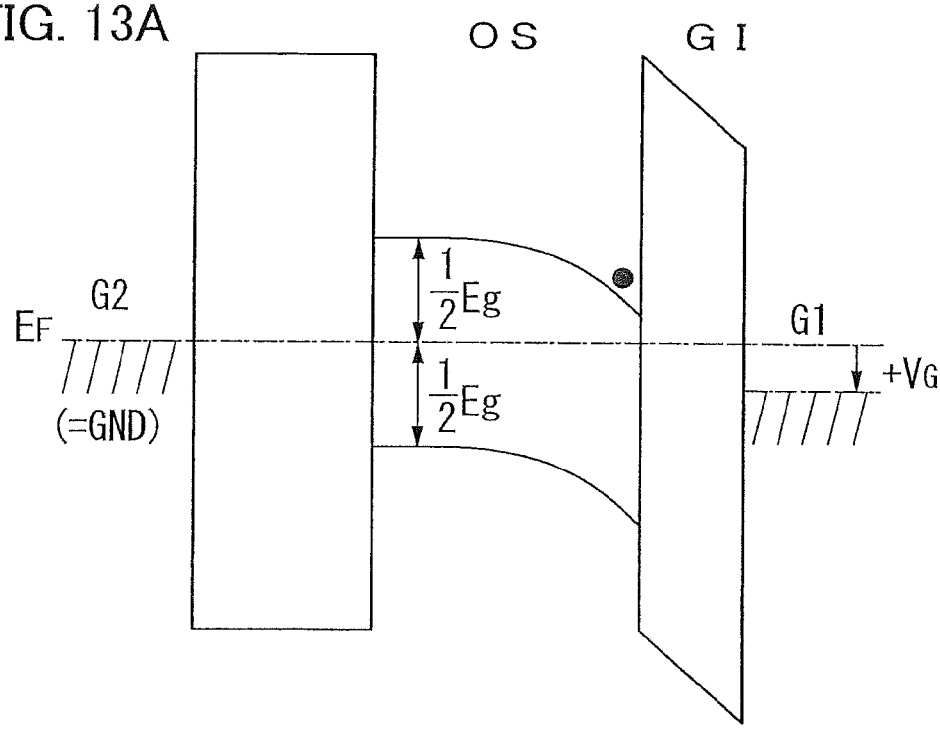
FIG. 13A is an energy band diagram illustrating a state in which positive potential (+VG) is applied to a gate electrode 1001.
Figure 13B:
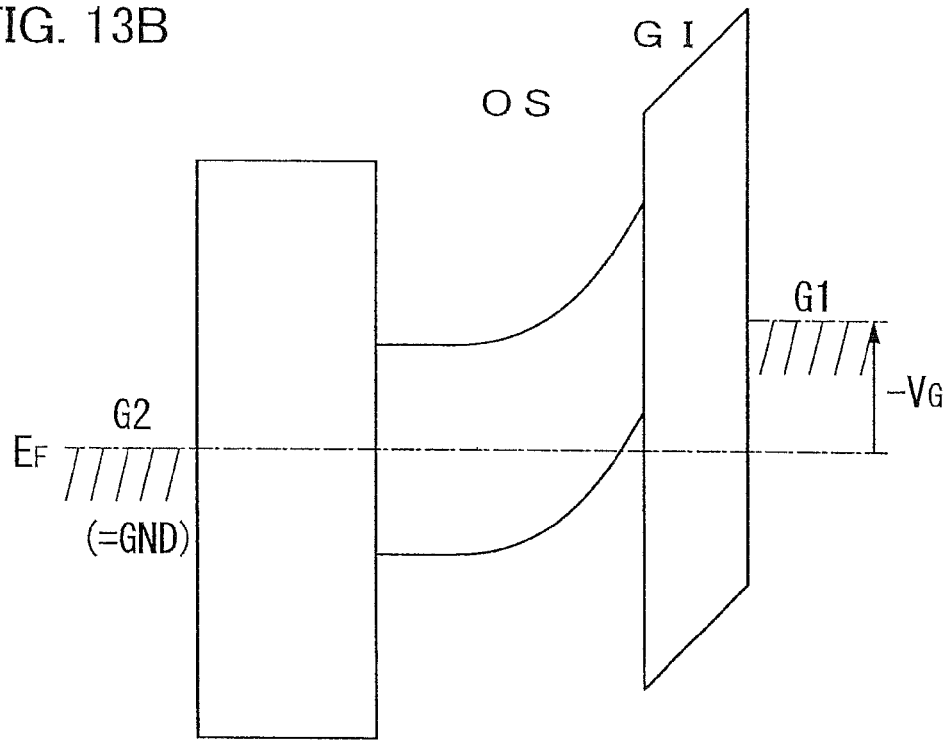
FIG. 13B is an energy band diagram illustrating a state in which negative potential (−VG) is applied to a gate electrode 1001.

FIGS. 13A and 13B are energy band diagrams (schematic diagrams) of a B-B' section illustrated in FIG. 11. FIG. 13A illustrates an on state in which a positive potential (+VG) is applied to the gate (G1) and carriers (electrons) flow between the source and the drain. FIG. 13B illustrates an off state in which a negative potential (−VG) is applied to the gate (G1) and minority carriers do not flow.

Figure 14:
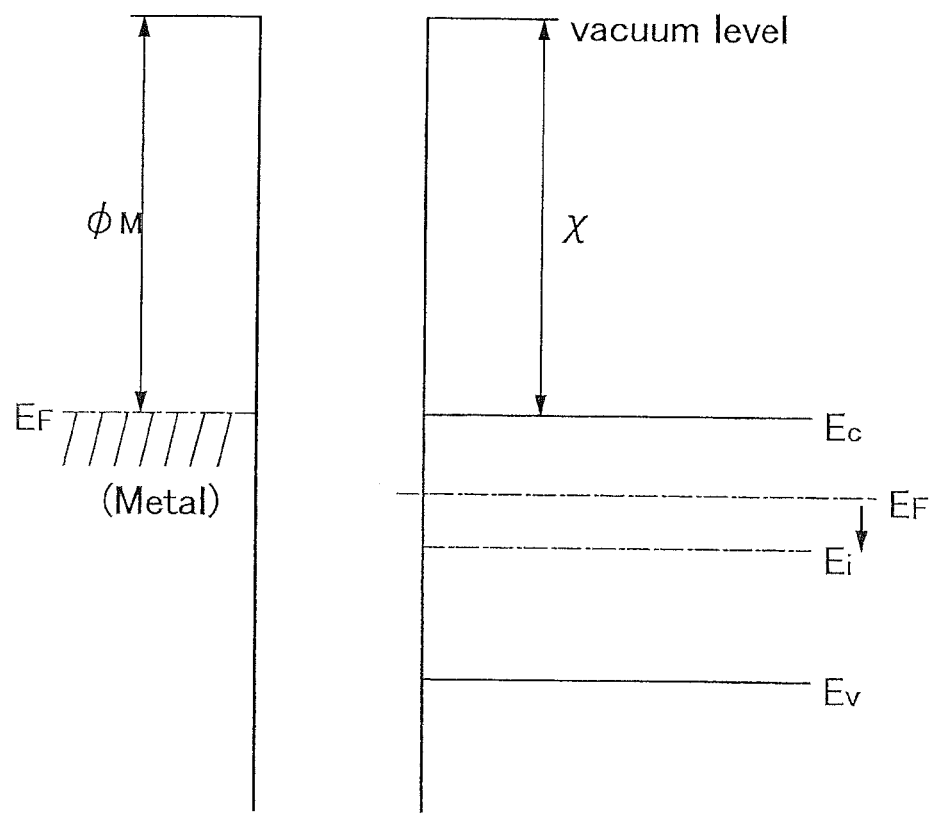
FIG. 14 is an energy band diagram illustrating the relationship between the vacuum level and the work function of a metal (φM) and between the vacuum level and the electron affinity ($\chi$) of an oxide semiconductor.

FIG. 14 illustrates the relationships between the vacuum level and the work function of a metal (φM) and between the vacuum level and the electron affinity (χ) of an oxide semiconductor.

Since a metal degenerates, a Fermi level exists in the conduction band. On the other hand, a conventional oxide semiconductor is typically an n-type semiconductor, in which case the Fermi level (Ef) is away from the intrinsic Fermi level (Ei) located in the middle of a band gap and is located closer to the conduction band. Although it depends on the deposition method, the oxide semiconductor layer contains a certain amount of hydrogen or water, and part of hydrogen or water serves as a donor which supplies electrons, which is known as a factor to make the oxide semiconductor layer n-type.

On the other hand, an oxide semiconductor of the present invention is an intrinsic (i-type) or a substantially intrinsic oxide semiconductor which is obtained by removing hydrogen that is an n-type impurity from an oxide semiconductor and highly purifying the oxide semiconductor such that an impurity other than a main component of the oxide semiconductor is prevented from being contained therein as much as possible. In other words, a feature is that a highly purified i-type (intrinsic) semiconductor, or a semiconductor close thereto, is obtained not by adding an impurity but by removing an impurity such as hydrogen or water as much as possible. This enables the Fermi level (Ef) to be at the same level as the intrinsic Fermi level (Ei).

In the case where the band gap (Eg) of an oxide semiconductor is 3.15 eV, the electron affinity ($\chi$) is said to be 4.3 eV. The work function of titanium (Ti) included in the source electrode and the drain electrode is substantially equal to the electron affinity ($\chi$) of the oxide semiconductor. In that case, a Schottky barrier to electrons is not formed at an interface between the metal and the oxide semiconductor.

In other words, in the case where the work function of the metal ($\varphi M$) and the electron affinity ($\chi$) of the oxide semiconductor are equal to each other and the metal and the oxide semiconductor are in contact with each other, an energy band diagram (a schematic diagram) as illustrated in FIG. 12A is obtained.

In FIG. 12B, a black circle (●) represents an electron, and when a positive potential is applied to the drain, the electron is injected into the oxide semiconductor over the barrier (h) and flows toward the drain. In that case, the height of the barrier (h) changes depends on the gate voltage and the drain voltage; in the case where a positive drain voltage is applied, the height of the barrier (h) is smaller than the height of the barrier in FIG. 12A where no voltage is applied, i.e., ½ of the band gap (Eg).

At this time, the electron moves at the bottom, which is stable in terms of energy, on the oxide semiconductor side at the interface between the gate insulating film and the highly purified oxide semiconductor as illustrated in FIG. 13A.

In addition, in FIG. 13B, when a negative potential (reverse bias) is applied to the gate electrode 1001, the value of current is extremely close to zero because holes that are minority carriers are substantially zero.

For example, even when a thin film transistor has a channel width W of $1 \times 10^{14}$ μm and a channel length of 3 μm, the off current is less than or equal to $10^{-13}$ A and the subthreshold swing (S value) can be 0.1 V/dec (the thickness of the gate insulating film: 100 nm).

Further, the off current of a transistor which includes a highly purified oxide semiconductor is calculated with higher accuracy. The result thereof is described below.

The off current of the transistor which includes a highly purified oxide semiconductor is less than or equal to $1 \times 10^{-13}$ A that is the detection limit of a measurement device as described above. An element for evaluating the characteristics is manufactured and a value of the off current (a value of less than or equal to the detection limit of the measurement device as described above) is obtained with higher accuracy. The result thereof is described below.

First, the element for evaluating the characteristics which is used in a method for measuring current is described with reference to FIG. 15.

Figure 15:
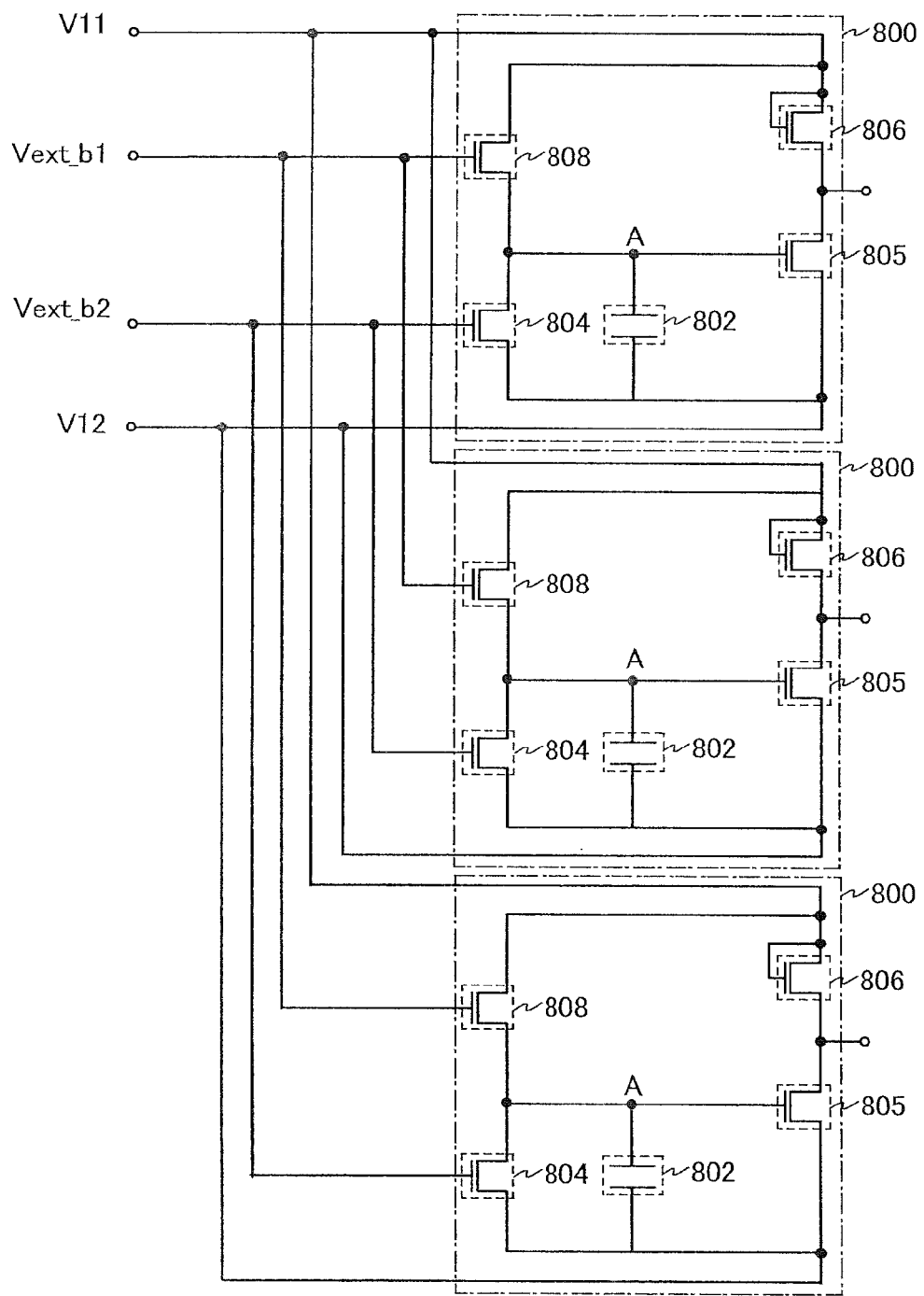
FIG. 15 is a circuit diagram for evaluating the characteristics of a transistor which includes an oxide semiconductor.

In the element for evaluating the characteristics illustrated in FIG. 15, three measurement systems 800 are electrically connected in parallel. The measurement system 800 includes a capacitor 802, a transistor 804, a transistor 805, a transistor 806, and a transistor 808. For example, a transistor which is manufactured in accordance with Embodiment 4 is used as each of the transistor 804 and the transistor 808.

A voltage V11 is input to one of a source and a drain of the transistor 808, and a potential Vext_b1 is input to a gate of the transistor 808. The potential Vext_b1 controls the transistor 808 to be turned on or off.

One of a source and a drain of the transistor 804 is electrically connected to the other of the source and the drain of the transistor 808, a voltage V12 is input to the other of the source and the drain of the transistor 804, and a potential Vext_b2 is input to a gate of the transistor 804. The potential Vext_b2 controls the transistor 804 to be turned on or off.

The capacitor 802 has a first terminal and a second terminal. The first terminal is electrically connected to one of the source and the drain of the transistor 804, and the second terminal is electrically connected to the other of the source and the drain of the transistor 804. A portion where the first terminal of the capacitor 802, the other of the source and the drain of the transistor 808, one of the source and the drain of the transistor 804, and a gate of the transistor 805 are connected to each other is also referred to as a node A.

The voltage V11 is input to one of a source and a drain of the transistor 806, and a gate of the transistor 806 is electrically connected to one of the source and the drain thereof.

One of a source and a drain of the transistor 805 is electrically connected to the other of the source and the drain of the transistor 806, and the voltage V12 is input to the other of the source and the drain of the transistor 805.

In the measurement system 800, a portion where the other of the source and the drain of the transistor 806 and one of the source and the drain of the transistor 805 are connected to each other is an output terminal. The measurement system 800 outputs a potential Vout through the output terminal.

Next, a method for measuring current with the use of the measurement system illustrated in FIG. 15 is described.

First, an initial period in which a potential difference is generated to measure the off current is briefly described. In the initial period, the value of the potential Vext_b1 is set to a value with which the transistor 808 is turned on, and the transistor 808 is turned on, so that the voltage V11 is applied to the node A. Here, the voltage V11 is a high potential, for example. In addition, the transistor 804 is turned off.

After that, the potential Vext_b1 is set to a value with which the transistor 808 is turned off, and the transistor 808 is turned off. Further, after the transistor 808 is turned off, the potential V11 is set to a low potential. The transistor 804 is kept in an off state. The potential V12 is equal to the potential V11. Through the above, the initial period is finished. When the initial period is finished, a potential difference is generated between the node A and one of the source and the drain of the transistor 804. In addition, a potential difference is generated between the node A and the other of the source and the drain of the transistor 808. Accordingly, a small amount of electric charge flows through the transistor 804 and the transistor 808. That is, the off current flows.

Next, a measurement period of the off current is briefly described. In the measurement period, a potential of one of the source and the drain of the transistor 804 (that is, the potential V12) and a potential of the other of the source and the drain of the transistor 808 (that is, the potential V11) are fixed to be low. On the other hand, in the measurement period, the potential of the node A is not fixed (in a floating state). Accordingly, electric charge flows through the transistor 804, and the amount of electric charge stored in the node A is changed as time passes. The potential of the node A is changed depending on the change in the amount of electric charge stored in the node A. That is, the potential Vout that is an output potential of the output terminal is also changed.

Figure 16:
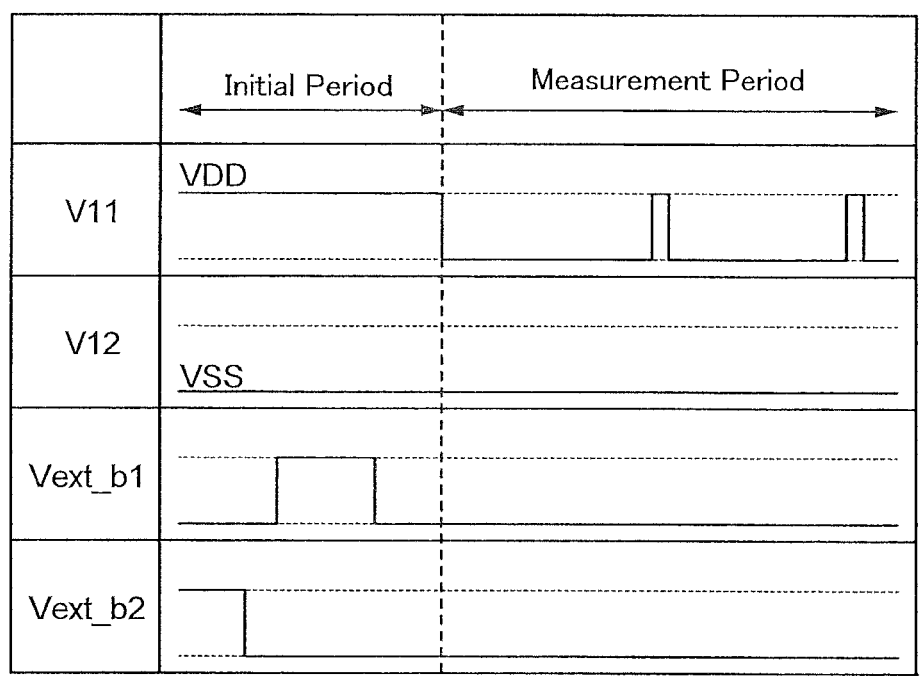
FIG. 16 is a timing chart for evaluating the characteristics of a transistor which includes an oxide semiconductor.

FIG. 16 illustrates details (a timing chart) of the relationship between the potentials in the initial period in which the potential difference is generated and the measurement period after the initial period.

In the initial period, first, the potential Vext_b2 is set to a potential (a high potential) with which the transistor 804 is turned on. Therefore, the potential of the node A becomes V12, that is, a low potential (such as VSS). After that, the potential Vext_b2 is set to a potential (a low potential) with which the transistor 804 is turned off, so that the transistor 804 is turned off. Next, the potential Vext_b1 is set to a potential (a high potential) with which the transistor 808 is turned on. Accordingly, the potential of the node A becomes V11, that is, a high potential (such as VDD). Then, Vext_b1 is set to a potential with which the transistor 808 is turned off, which places the node A in a floating state and finishes the initial period.

In the measurement period after the initial period, the potential V11 and the potential V12 are set such that electric charge flows to the node A or electric charge flows out of the node A. Here, the potential V11 and the potential V12 are low potentials (VSS). Note that at the timing at which the output potential Vout is measured, it is necessary to operate an output circuit and thus temporarily make V11 a high potential (VSS) in some cases. The period in which V11 is a high potential (VDD) is made short in such a degree that the measurement is not influenced.

When the potential difference is generated and the measurement period is started as described above, the amount of electric charge stored in the node A is changed as time passes, which changes the potential of the node A. This means that the potential of the gate of the transistor 805 is changed; thus, the output potential Vout of the output terminal is also changed as time passes.

A method for calculating the off current on the basis of the obtained output potential Vout is described below.

The relationship between a potential $V_A$ of the node A and the output potential Vout is obtained before calculation of the off current. With this, the potential $V_A$ of the node A can be obtained using the output potential Vout. In accordance with the above relationship, the potential $V_A$ of the node A can be expressed as a function of the output potential Vout by the following equation.

$$V_A = F(Vout)$$

Electric charge $Q_A$ of the node A can be expressed by the following equation with the use of the potential $V_A$ of the node A, capacitance $C_A$ connected to the node A, and a constant (const). Here, the capacitance $C_A$ connected to the node A is the sum of the capacitance of the capacitor 802 and other capacitance.

$$Q_A = C_A V_A + \text{const}$$

Current $I_A$ of the node A is a temporal differential of electric charge which flows to the node A (or electric charge which flows out of the node A) and thus is expressed by the following equation.

$$I_A \equiv \frac{\Delta Q_A}{\Delta t} = \frac{C_A^* \Delta F(Vout)}{\Delta t}$$

In this manner, the current $I_A$ of the node A can be obtained from the capacitance $C_A$ connected to the node A and the output potential Vout of the output terminal.

In accordance with the above method, it is possible to measure leakage current (off current) which flows between a source and a drain of a transistor in an off state.

In this embodiment, the transistor 804 and the transistor 808 were manufactured with the use of a highly purified oxide semiconductor. The ratio of the channel length (L) to the channel width (W) of the transistors was L/W=1:5. In addition, in the measurement systems 800 which are arranged in parallel, values of the capacitance of the capacitors 802 were 100 fF, 1 pF, and 3 pF.

Note that VDD was 5 V and VSS was 0 V in the measurement of this embodiment. In the measurement period, Vout was measured while the potential V11 was basically set to VSS and changed to VDD for 100 msec at intervals of 10 sec to 300 sec. Δt which was used in calculation of current I which flows through the element was about 30000 sec.

Figure 17:
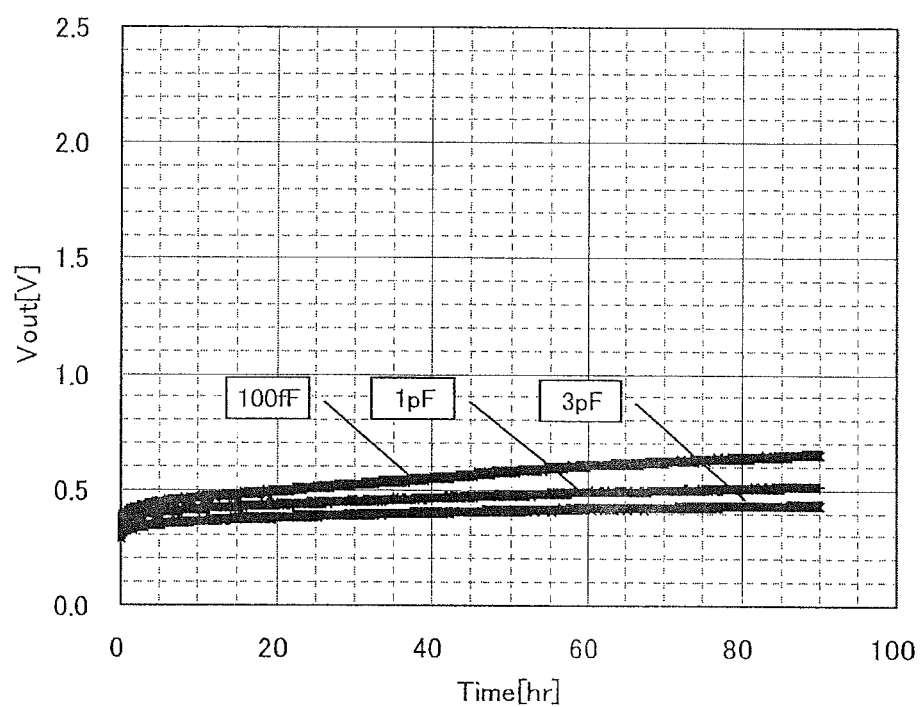
FIG. 17 is a graph showing the characteristics of a transistor which includes an oxide semiconductor.

FIG. 17 shows the relationship between elapsed time Time in measuring the current and the output potential Vout. The potential is changed after about 90 hours.

Figure 18:
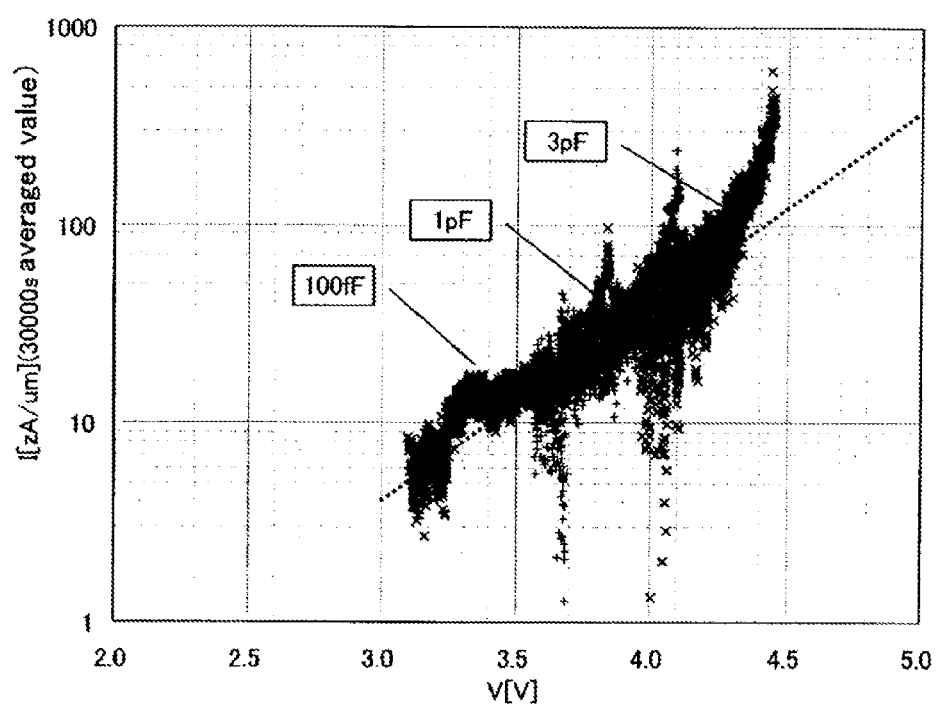
FIG. 18 is a graph showing the characteristics of a transistor which includes an oxide semiconductor.

FIG. 18 shows the off current which is calculated in the above measurement of the current. In FIG. 18, the relationship between source-drain voltage V and off current I is shown. According to FIG. 18, the off current was about 40 zA/μm under the condition where the source-drain voltage was 4 V. In addition, the off current was less than or equal to 10 zA/μm under the condition where the source-drain voltage was 3.1 V. Note that 1 zA represents $10^{-21}$ A.

Figure 19:
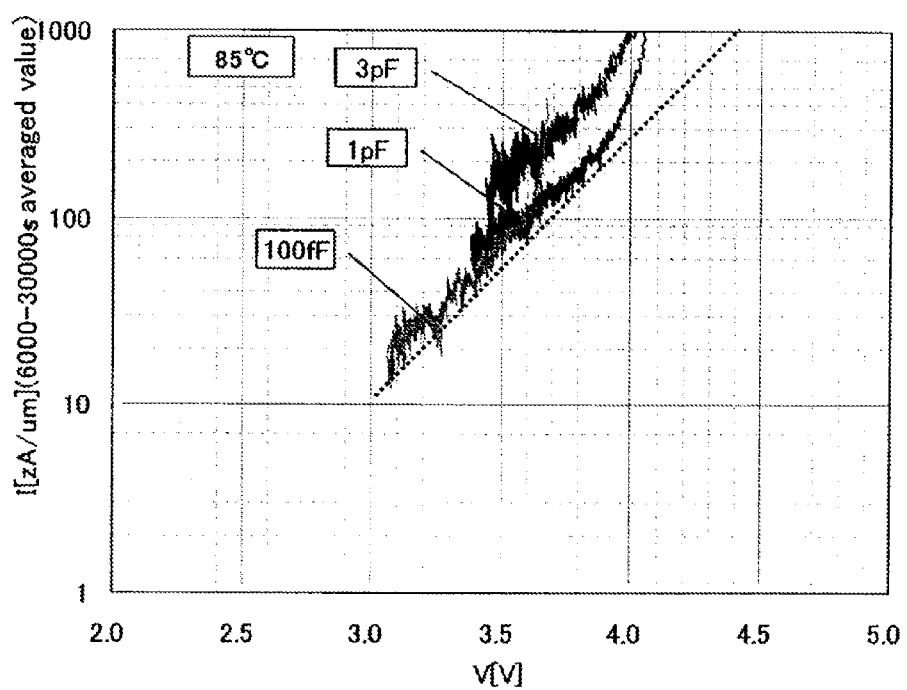
FIG. 19 is a graph showing the characteristics of a transistor which includes an oxide semiconductor.
Figure 20A:
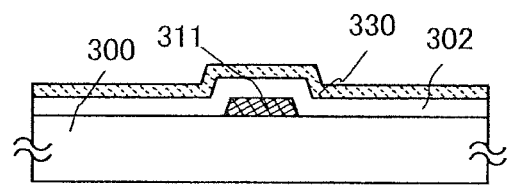
FIGS. 20A to 20E are cross-sectional views illustrating a method for manufacturing a transistor.
Figure 20B:
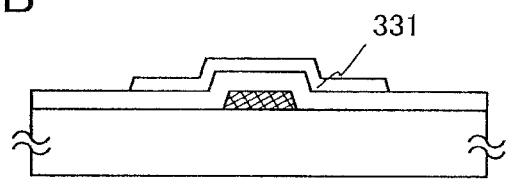
Figure 20C:
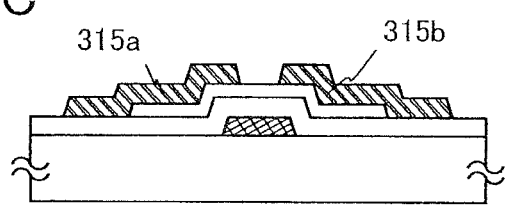
Figure 20D:
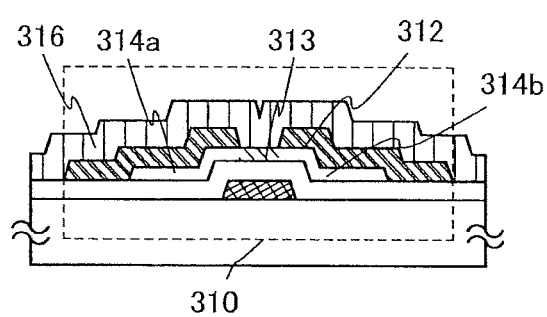
Figure 20E:
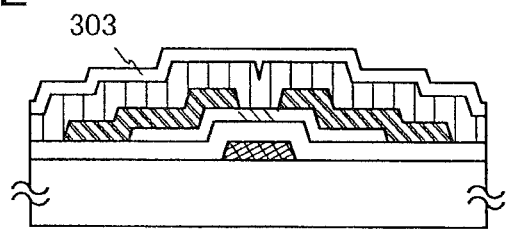
Figure 21A:
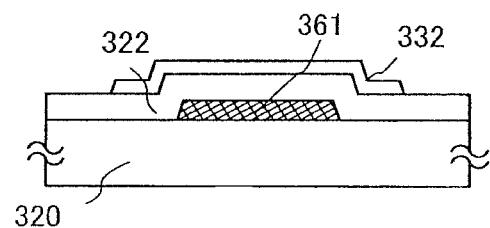
FIGS. 21A to 21D are cross-sectional views illustrating a method for manufacturing a transistor.
Figure 21B:
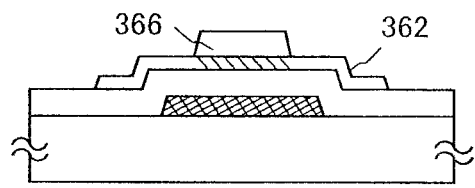
Figure 21C:
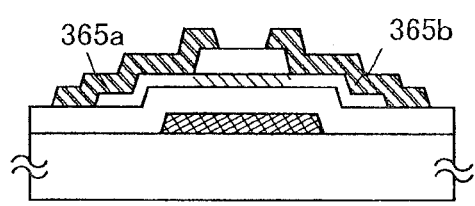
Figure 21D:
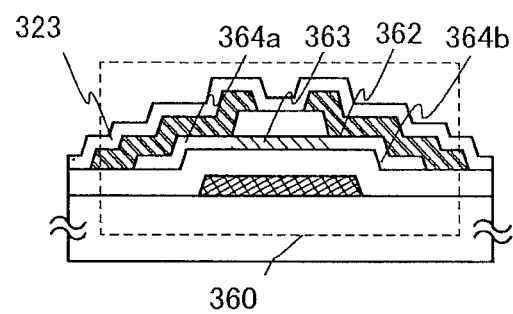

FIG. 19 shows the off current which is calculated in the above measurement of the current when the temperature of the transistor is 85° C. In FIG. 19, the relationship between source-drain voltage V and off current I at 85° C. is shown. According to FIG. 19, the off current was less than or equal to 100 zA/μm under the condition where the source-drain voltage was 3.1 V.

As described above, it was confirmed that off current is low enough in a transistor which includes a highly purified oxide semiconductor.

In this manner, when the oxide semiconductor is highly purified so that impurities except a main component of the oxide semiconductor are contained as little as possible, the operation of the thin film transistor can be favorable.

The capacitor in the voltage regulator circuit according to an embodiment of the present invention can be formed through the same manufacturing steps as the transistor in this embodiment. When the transistor and the capacitor are formed through the same manufacturing steps, the number of manufacturing steps can be reduced.

With the above structure, the transistor can have stable electric characteristics and high reliability. Since leakage current is small in the transistor, by forming the voltage regulator circuit according to an embodiment of the present invention with the use of the transistor, a speed at which a desired voltage is achieved can be significantly increased.

Further, when the voltage regulator circuit according to an embodiment of the present invention is formed with the use of the transistor, the voltage regulator circuit can have stable electric characteristics and high reliability.

This embodiment can be implemented by being combined with any of other embodiments as appropriate.

Embodiment 8

In this embodiment, another example of a thin film transistor which can be used as a transistor included in the voltage regulator circuit disclosed in this specification will be described.

One embodiment of a thin film transistor and a manufacturing method of the thin film transistor of this embodiment is described with reference to FIGS. 20A to 20E.

FIGS. 20A to 20E illustrate an example of a manufacturing method of a thin film transistor. A thin film transistor 310 illustrated in FIGS. 20A to 20E is one of bottom gate thin film transistors and is also referred to as an inverted staggered thin film transistor.

Although the thin film transistor 310 is described as a single-gate thin film transistor, a multi-gate thin film transistor including a plurality of channel formation regions can be formed when needed.

A process for forming the thin film transistor 310 over a substrate 300 is described below with reference to FIGS. 20A to 20E.

First, a conductive film is formed over the substrate 300 having an insulating surface, and a first photolithography step is performed thereon, so that a gate electrode layer 311 is formed. Note that a resist mask may be formed by an ink-jet method. Formation of the resist mask by an ink-jet method needs no photomask; thus, manufacturing costs can be reduced.

There is no particular limitation on a substrate that can be used as the substrate 300 having an insulating surface as long as it has at least heat resistance to withstand heat treatment performed later. A glass substrate formed using barium borosilicate glass, aluminoborosilicate glass, or the like can be used.

In the case where the temperature at which the heat treatment is performed later is high, a glass substrate whose strain point is greater than or equal to 730° C. is preferably used. As a glass substrate, a glass material such as aluminosilicate glass, aluminoborosilicate glass, or barium borosilicate glass is used, for example. Note that by containing a larger amount of barium oxide (BaO) than boron oxide ($B_2O_3$), more practical heat-resistant glass can be obtained. Therefore, a glass substrate containing a larger amount of BaO than $B_2O_3$ is preferably used.

Note that, instead of the glass substrate described above, a substrate formed using an insulator such as a ceramic substrate, a quartz substrate, or a sapphire substrate may be used. Alternatively, a crystallized glass substrate or the like may be used. Still alternatively, a semiconductor substrate of silicon or the like can be used as the substrate.

Further, an insulating film serving as a base film may be provided between the substrate 300 and the gate electrode layer 311. The base film has a function of preventing diffusion of an impurity element from the substrate 300, and can be formed to have a single-layer or layered structure using one or more of a silicon nitride film, a silicon oxide film, a silicon nitride oxide film, and a silicon oxynitride film.

The conductive film for forming the gate electrode layer 311 can be formed with a single layer or stacked layers using a metal material such as molybdenum, titanium, chromium, tantalum, tungsten, aluminum, copper, neodymium, or scandium, or an alloy material which contains any of these materials as its main component.

As a two-layer structure of the gate electrode layer 311, for example, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure in which a titanium nitride layer and a molybdenum layer are stacked, or a two-layer structure in which a tungsten nitride layer and a tungsten layer are stacked is preferable. As a three-layer structure, a stack of a tungsten layer or a tungsten nitride layer, an alloy layer of aluminum and silicon or an alloy layer of aluminum and titanium, and a titanium nitride layer or a titanium layer is preferable.

Then, a gate insulating layer 302 is formed over the gate electrode layer 311.

An oxide semiconductor (a highly purified oxide semiconductor) which is made to be i-type or substantially i-type by removal of an impurity is highly sensitive to an interface state and interface electric charge; thus, an interface between the oxide semiconductor and a gate insulating layer is important. Therefore, the gate insulating layer (GI) which is in contact with the highly purified oxide semiconductor layer needs high quality.

For example, high-density plasma CVD using microwaves (2.45 GHz) is preferable because a dense high-quality insulating film having high withstanding voltage can be formed. This is because when the highly purified oxide semiconductor layer is closely in contact with the high-quality gate insulating layer, the interface state can be reduced and interface properties can be favorable. Here, as a high-density plasma apparatus, an apparatus which can realize a plasma density of greater than or equal to $1\times10^{11}/cm^3$ can be used.

For example, plasma is generated by applying a microwave power of 3 kW to 6 kW, and the insulating film is formed. A monosilane gas ($SiH_4$), nitrous oxide ($N_2O$), and a rare gas are introduced into a chamber as a source gas to generate high-density plasma at a pressure of 10 Pa to 30 Pa, and the insulating film is formed over a substrate having an insulating surface, such as a glass substrate. After that, the supply of a monosilane gas is stopped, and nitrous oxide ($N_2O$) and a rare gas are introduced without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Needless to say, a different deposition method such as a sputtering method or a plasma CVD method can be used as long as a high-quality insulating film can be formed as the gate insulating layer 302. In addition, any insulating film can be used as long as film quality and properties of an interface with an oxide semiconductor of the gate insulating layer are modified by heat treatment performed after deposition. In any case, any insulating film can be used as long as film quality as a gate insulating film is high, interface state density with an oxide semiconductor is decreased, and a favorable interface can be formed.

In a gate-bias thermal stress test (BT test) at 85° C. and $2\times10^6$ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a shift in the threshold voltage ($V_{th}$). As a countermeasure against this, in the transistor which is an embodiment of the present invention, the impurity in the oxide semiconductor, especially, hydrogen, water, or the like is removed as much as possible so that the properties of an interface with the gate insulating layer are favorable as described above. Accordingly, it is possible to obtain a thin film transistor which is stable with respect to the BT test.

As the gate insulating layer 302, a single layer or stacked layers can be formed using one or more of a silicon oxide layer, a silicon nitride layer, a silicon oxynitride layer (also referred to as $SiO_xN_y$, x>y>0), a silicon nitride oxide layer (also referred to as $SiN_xO_y$, x>y>0), and an aluminum oxide layer.

In addition, the gate insulating layer 302 can have a structure in which a silicon oxide layer and a silicon nitride layer are stacked. In this embodiment, for example, a silicon oxynitride layer with a thickness of 100 nm is formed by a high-density plasma CVD method with a pressure of 30 Pa and a microwave power of 6 kW. The flow ratio of a monosilane gas ($SiH_4$) to nitrous oxide ($N_2O$) which are introduced into the chamber is 1:10.

Then, an oxide semiconductor film 330 is formed to a thickness of 2 nm to 200 nm inclusive over the gate insulating layer 302.

Note that before the oxide semiconductor film 330 is formed by a sputtering method, dust attached to a surface of the gate insulating layer 302 is preferably removed by reverse sputtering in which an argon gas is introduced and plasma is generated. Note that instead of an argon atmosphere, a nitrogen atmosphere, a helium atmosphere, an oxygen atmosphere, or the like may be used.

Any of the following is used as the oxide semiconductor film 330: an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, an In—Sn—O-based oxide semiconductor film, a Sn—O-based oxide semiconductor film, and a Zn—O-based oxide semiconductor film. In this embodiment, the oxide semiconductor film 330 is formed by a sputtering method with the use of an In—Ga—Zn—O-based metal oxide target. A cross-sectional view at this stage corresponds to FIG. 20A. In addition, the oxide semiconductor film 330 can be formed by a sputtering method in a rare gas (typically, argon) atmosphere, an oxygen atmosphere, or an atmosphere containing a rare gas (typically, argon) and oxygen. In the case of employing a sputtering method, a target containing $SiO_2$ at 2 wt % to 10 wt % inclusive may be used for film formation.

As a target for forming the oxide semiconductor film 330 by a sputtering method, a metal oxide target containing zinc oxide as its main component can be used. As another example of the metal oxide target, for example, a metal oxide target with a composition ratio of $In_2O_3$:$Ga_2O_3$:ZnO=1:1:1 (molar ratio) can be used. Without limitation to the above target, for example, a metal oxide target with a composition ratio of $In_2O_3$:$Ga_2O_3$:ZnO=1:1:2 (molar ratio) may be used. The fill rate of the metal oxide target is 90% to 100% inclusive, preferably, 95% to 99.9% inclusive. With the use of the metal oxide target with high fill rate, the oxide semiconductor film formed is dense.

It is preferable to use a high-purity gas from which an impurity such as hydrogen, water, a hydroxyl group, or hydride is removed to a concentration of several ppm or a concentration of several ppb, as a sputtering gas when the oxide semiconductor film 330 is formed.

The substrate is held in a treatment chamber kept under reduced pressure, and the substrate temperature is set to 100° C. to 600° C. inclusive, preferably 200° C. to 400° C. inclusive. Film formation is performed while the substrate is heated, whereby the concentration of an impurity contained in the oxide semiconductor layer formed can be reduced. Further, damages due to sputtering can be reduced. Then, a sputtering gas from which hydrogen and moisture are removed is introduced into the treatment chamber from which remaining moisture is being removed, and the oxide semiconductor film 330 is formed over the substrate 300 with the use of a metal oxide as a target. To remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced.

An example of the deposition condition is as follows: the distance between the substrate and the target is 100 mm, the pressure is 0.6 Pa, the DC power is 0.5 kW, and the atmosphere is an oxygen atmosphere (the flow rate of oxygen is 100%). It is preferable that a pulsed DC power source be used because dusts can be reduced and the film thickness can be uniform. The oxide semiconductor film preferably has a thickness of 5 nm to 30 nm inclusive. Note that the appropriate thickness depends on an oxide semiconductor material used and the thickness may be selected as appropriate in accordance with a material.

Then, the oxide semiconductor film 330 is processed into an island-shaped oxide semiconductor layer 331 through a second photolithography step. A resist mask for forming the island-shaped oxide semiconductor layer 331 may be formed by an ink-jet method. Formation of the resist mask by an ink-jet method needs no photomask; thus, manufacturing cost can be reduced.

Next, the oxide semiconductor layer is subjected to first heat treatment. With the first heat treatment, dehydration or dehydrogenation of the oxide semiconductor layer can be conducted. The temperature of the first heat treatment is greater than or equal to 400° C. and less than or equal to 750° C., preferably greater than or equal to 400° C. and less than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, entry of water and hydrogen into the oxide semiconductor layer is prevented; thus, an oxide semiconductor layer 331 is obtained (see FIG. 20B).

Note that the heat treatment apparatus is not limited to an electric furnace, and may have a device for heating an object to be processed by thermal conduction or thermal radiation from a heating element such as a resistance heating element. For example, an RTA (rapid thermal anneal) apparatus such as a GRTA (gas rapid thermal anneal) apparatus, or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be processed by heat treatment, like nitrogen or a rare gas such as argon is used.

For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment for a short time.

Note that in the first heat treatment, it is preferable that water, hydrogen, or the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is preferably less than or equal to 1 ppm, more preferably less than or equal to 0.1 ppm).

Depending on conditions of the first heat treatment or a material of the oxide semiconductor layer, the oxide semiconductor layer may be crystallized to be a microcrystalline film or a polycrystalline film in some cases. For instance, the oxide semiconductor layer may be crystallized to be a microcrystalline oxide semiconductor film having a degree of crystallinity of greater than or equal to 90%, or greater than or equal to 80%. Further, depending on the condition of the first heat treatment or the material of the oxide semiconductor layer, the oxide semiconductor layer may be an amorphous oxide semiconductor film containing no crystalline component. The oxide semiconductor layer may become an oxide semiconductor film in which a microcrystalline portion (with a grain diameter of 1 nm to 20 nm inclusive, typically 2 nm to 4 nm inclusive) is mixed into an amorphous oxide semiconductor.

In addition, the first heat treatment may be performed on the oxide semiconductor film 330 before being processed into the island-like oxide semiconductor layer. In that case, the substrate is taken out of the heat treatment apparatus after the first heat treatment, and then a photolithography step is performed.

The heat treatment having an effect of dehydration or dehydrogenation of the oxide semiconductor layer may be performed at any of the following timings: after the oxide semiconductor layer is formed; after a source electrode and a drain electrode are formed over the oxide semiconductor layer, and after a protective insulating film is formed over the source electrode and the drain electrode.

Further, in the case where a contact hole is formed in the gate insulating layer 302, the formation of the contact hole may be performed before or after the dehydration or dehydrogenation of the oxide semiconductor layer 331.

Note that the etching of the oxide semiconductor film may be dry etching, without limitation to wet etching.

The etching conditions (such as an etchant, etching time, and temperature) are appropriately adjusted depending on the material so that the material can be etched into a desired shape.

Next, a conductive film is formed over the gate insulating layer 302 and the oxide semiconductor layer 331. For example, the conductive film may be formed by a sputtering method or a vacuum evaporation method. As a material of the conductive film, an element selected from Al, Cr, Cu, Ta, Ti, Mo, and W; an alloy containing any of these elements as its component; an alloy containing any of these elements in combination; and the like can be given. Further, one or more materials selected from manganese, magnesium, zirconium, beryllium, and yttrium may be used. Further, the conductive film may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given. Alternatively, a film of one or a plurality of elements selected from titanium (Ti), tantalum (Ta), tungsten (W), molybdenum (Mo), chromium (Cr), neodymium (Nd), and scandium (Sc) combined with Al, an alloy film containing a plurality of the above elements, or a nitride film thereof may be used.

In the case where heat treatment is performed after formation of the conductive film, the conductive film preferably has heat resistance high enough to withstand the heat treatment.

A third photolithography step is performed. A resist mask is formed over the conductive film and selective etching is performed, so that a source electrode layer 315a and a drain electrode layer 315b are formed. Then, the resist mask is removed (see FIG. 20C).

Ultraviolet, a KrF laser beam, or an ArF laser beam is used for light exposure for forming the resist mask in the third photolithography step. A channel length L of the thin film transistor to be formed later depends on a width of a distance between a bottom portion of the source electrode layer and a bottom portion of the drain electrode layer which are adjacent to each other over the oxide semiconductor layer 331. Note that when light exposure is performed in the case where the channel length L is shorter than 25 nm, extreme ultraviolet with extremely short wavelengths of several nanometers to several tens of nanometers is used for light exposure for forming the resist mask in the third photolithography step. Light exposure with extreme ultraviolet leads to a high resolution and a large depth of focus. Accordingly, the channel length L of the thin film transistor to be formed later can be set to 10 nm to 1000 nm inclusive. Thus, the operation speed of a circuit can be increased, and further, an off current is significantly small, so that low power consumption can be achieved.

Note that each material and etching condition are adjusted as appropriate so that the oxide semiconductor layer 331 is not removed by etching of the conductive film.

In this embodiment, a titanium film is used as the conductive film, an In—Ga—Zn—O-based oxide semiconductor is used as the oxide semiconductor layer 331, and an ammonia hydrogen peroxide solution (a mixture of ammonia, water, and a hydrogen peroxide solution) is used as an etchant.

Note that in the third photolithography step, in some cases, only part of the oxide semiconductor layer 331 is etched, whereby an oxide semiconductor layer having a groove (a depression portion) is formed. Note that a resist mask used for forming the source electrode layer 315a and the drain electrode layer 315b may be formed by an ink-jet method. Formation of the resist mask by an ink-jet method needs no photomask; thus, manufacturing cost can be reduced.

Further, oxide conductive layers may be formed between the oxide semiconductor layer and the source and drain electrode layers. The oxide conductive layers and the metal layer for forming the source and drain electrode layers can be formed successively. The oxide conductive layers can function as a source region and a drain region.

When the oxide conductive layers are provided as a source region and a drain region between the oxide semiconductor layer and the source and drain electrode layers, the resistance of the source region and the drain region can be decreased and high-speed operation of the transistor can be realized.

In order to reduce the number of photomasks and manufacturing steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using a multi-tone mask. Thus, the number of light-exposure masks can be reduced and the number of corresponding photolithography steps can be also reduced, whereby simplification of a process can be realized.

Next, plasma treatment is performed using a gas such as $N_2O$, $N_2$, or Ar. This plasma treatment removes water or the like adsorbed on a surface of the oxide semiconductor layer which is exposed. In addition, plasma treatment may be performed using a mixed gas of oxygen and argon.

After the plasma treatment, an oxide insulating layer 316 which functions as a protective insulating film which is in contact with part of the oxide semiconductor layer is formed without exposure to air.

The oxide insulating layer 316 can be formed to a thickness at least 1 nm by a sputtering method or the like as appropriate, which is a method with which an impurity such as water or hydrogen does not enter the oxide insulating layer 316. When hydrogen is contained in the oxide insulating layer 316, entry of the hydrogen to the oxide semiconductor layer or extraction of oxygen in the oxide semiconductor layer by the hydrogen is caused, thereby making the resistance of the back channel of the oxide semiconductor layer low (n-type), so that a parasitic channel might be formed. Therefore, it is important that a formation method in which hydrogen is not used is employed such that the oxide insulating layer 316 contains hydrogen as little as possible.

In this embodiment, a 200-nm-thick silicon oxide film is deposited as the oxide insulating layer 316 by a sputtering method. The substrate temperature in film formation may be room temperature to 300° C. inclusive and is 100° C. in this embodiment. The silicon oxide film can be formed by a sputtering method under a rare gas (typically argon) atmosphere, an oxygen atmosphere, or an atmosphere containing a rare gas (typically argon) and oxygen. Moreover, a silicon oxide target or a silicon target can be used as a target. For example, the silicon oxide film can be formed by a sputtering method using a silicon target in an atmosphere containing oxygen and nitrogen. The oxide insulating layer 316 which is formed in contact with the oxide semiconductor layer in a region which is in an oxygen-deficient state and thus has a lower resistance, i.e., is n-type is formed using an inorganic insulating film that does not contain impurities such as moisture, a hydrogen ion, and OH⁻ and blocks entry of such impurities from the outside, typically, a silicon oxide film, a silicon oxynitride film, an aluminum oxide film, or an aluminum oxynitride film.

In that case, the oxide insulating layer 316 is preferably formed removing moisture remaining in the treatment chamber. This is for preventing hydrogen, a hydroxyl group, or moisture from being contained in the oxide semiconductor layer 331 and the oxide insulating layer 316.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, for example, a hydrogen atom, a compound containing a hydrogen atom, such as water ($H_2O$), and the like are removed, whereby the concentration of an impurity in the oxide insulating layer 316 formed in the deposition chamber can be reduced.

It is preferable to use a high-purity gas from which an impurity such as hydrogen, water, a hydroxyl group, or hydride is removed to a concentration of several ppm or a concentration of several ppb, as a sputtering gas when the oxide insulating layer 316 is formed.

Next, second heat treatment (preferably 200° C. to 400° C. inclusive, for example, from 250° C. to 350° C. inclusive) may be performed in an inert gas atmosphere or an oxygen gas atmosphere. For example, the second heat treatment is performed in a nitrogen atmosphere at 250° C. for one hour. With the second heat treatment, heat is applied while part of the oxide semiconductor layer (a channel formation region) is in contact with the oxide insulating layer 316.

Through the above steps, the oxide semiconductor layer comes to be in an oxygen-deficient state and have lower resistance, that is, be n-type when heat treatment for dehydration or dehydrogenation is performed on the formed oxide semiconductor film. Then, the oxide insulating layer is formed in contact with the oxide semiconductor layer. Accordingly, part of the oxide semiconductor layer is selectively in an oxygen excess state. As a result, a channel formation region 313 overlapping with the gate electrode layer 311 becomes i-type. At that time, a high-resistance source region 314a which has higher carrier concentration than at least the channel formation region 313 and overlaps with the source electrode layer 315a and a high-resistance drain region 314b which has higher carrier concentration than at least the channel formation region 313 and overlaps with the drain electrode layer 315b are formed in a self-aligned manner. Through the above steps, the thin film transistor 310 is formed (see FIG. 20D).

Furthermore, the heat treatment may be performed at 100° C. to 200° C. inclusive for one hour to 30 hours inclusive in the air. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed before formation of the oxide insulating film under a reduced pressure. When the heat treatment is performed under a reduced pressure, the heat treatment time can be shortened. With such heat treatment, a normally-off thin film transistor can be obtained. Therefore, reliability of the thin film transistor can be improved. Further, when a silicon oxide layer containing a number of defects is used as the oxide insulating layer, the impurity contained in the oxide semiconductor layer can be reduced more effectively by the above heat treatment.

By the formation of the high-resistance drain region 314*b* (or the high-resistance source region 314*a*) in part of the oxide semiconductor layer, which overlaps with the drain electrode layer 315*b* (or the source electrode layer 315*a*), reliability of the thin film transistor can be improved. Specifically, by forming the high-resistance drain region 314*b*, a structure can be attained in which conductivity can be varied stepwise from the drain electrode layer 315*b* to the high-resistance drain region 314*b* and the channel formation region 313. Therefore, in the case where the thin film transistor operates with the drain electrode layer 315*b* connected to a wiring for supplying a high power supply potential VDD, the high-resistance drain region 314*b* serves as a buffer and a high electric field is not applied locally even if the high electric field is applied between the gate electrode layer 311 and the drain electrode layer 315*b*, so that the withstanding voltage of the transistor can be improved.

Further, the high-resistance source region or the high-resistance drain region in the oxide semiconductor layer is formed in the entire thickness direction in the case where the thickness of the oxide semiconductor layer is less than or equal to 15 nm. In the case where the thickness of the oxide semiconductor layer is 30 nm to 50 nm inclusive, in part of the oxide semiconductor layer, that is, in a region in the oxide semiconductor layer which is in contact with the source electrode layer or the drain electrode layer and the vicinity thereof the resistance is reduced and a region in the oxide semiconductor layer, which is close to the gate insulating film, can be made to be i-type.

A protective insulating layer may be additionally formed over the oxide insulating layer 316. For example, a silicon nitride film is formed by an RF sputtering method. An RF sputtering method has superiority in mass production and thus is a preferable method for forming the protective insulating layer. The protective insulating layer is formed using an inorganic insulating film which does not contain an impurity such as moisture, a hydrogen ion, or OH⁻ and blocks entry of these from the outside; for example, a silicon nitride film, an aluminum nitride film, a silicon nitride oxide film, an aluminum nitride oxide film, or the like is used. In this embodiment, a protective insulating layer 303 is formed using a silicon nitride film as the protective insulating layer (see FIG. 20E).

In this embodiment, as the protective insulating layer 303, a silicon nitride film is formed by heating the substrate 300 over which layers up to and including the oxide insulating layer 316 are formed, to a temperature of 100° C. to 400° C., introducing a high-purity sputtering gas which contains nitrogen and from which hydrogen and moisture are removed, and using a target of a silicon semiconductor. In this case, the protective insulating layer 303 is preferably formed removing moisture remaining in a treatment chamber, similarly to the oxide insulating layer 316.

A planarization insulating layer for planarization may be provided over the protective insulating layer 303.

Further, a conductive layer may be formed so as to overlap with the oxide semiconductor layer, over the protective insulating layer 303 (in the case of providing a planarization insulating layer, over the planarization insulating layer). A potential of the conductive layer may be the same as or different from that of the gate electrode layer 311 of the thin film transistor 310. The conductive layer can also function as a second gate electrode layer. The potential of the conductive layer may be a fixed potential such as GND or 0 V.

Electric characteristics of the thin film transistor 310 can be controlled by the conductive layer.

The capacitor in the voltage regulator circuit according to an embodiment of the present invention can be formed through the same manufacturing steps as the transistor in this embodiment. When the transistor and the capacitor are formed through the same manufacturing steps, the number of manufacturing steps can be reduced.

With the above structure, the transistor can have stable electric characteristics and high reliability. Since leakage current is small in the transistor, by forming the voltage regulator circuit according to an embodiment of the present invention with the use of the transistor, a speed at which a desired voltage is achieved can be significantly increased. Further, when the voltage regulator circuit according to an embodiment of the present invention is formed with the use of the transistor, the voltage regulator circuit can have stable electric characteristics and high reliability.

This embodiment can be implemented by being combined with any of other embodiments as appropriate.

Embodiment 9

In this embodiment, another example of a thin film transistor which can be used as a transistor included in the voltage regulator circuit disclosed in this specification will be described.

One embodiment of a thin film transistor and a manufacturing method of the thin film transistor of this embodiment is described with reference to FIGS. 21A to 21D.

FIGS. 21A to 21D illustrate an example of a manufacturing method of a thin film transistor. A thin film transistor 360 illustrated in FIGS. 21A to 21D is a kind of bottom-gate structure called a channel-protective type (channel-stop type) and is also called an inverted staggered thin film transistor.

Although the thin film transistor 360 is described as a single-gate thin film transistor, a multi-gate thin film transistor including a plurality of channel formation regions can be formed when needed.

A process for manufacturing the thin film transistor 360 over a substrate 320 is described below with reference to FIGS. 21A to 21D.

First, a conductive film is formed over the substrate 320 having an insulating surface, and a first photolithography step is performed thereon, so that a gate electrode layer 361 is formed. Note that a resist mask may be formed by an ink-jet method. Formation of the resist mask by an ink-jet method needs no photomask; thus, manufacturing cost can be reduced.

The conductive film for forming the gate electrode layer 361 can be formed in a single layer or a stacked layer using a metal material such as molybdenum, titanium, chromium, tantalum, tungsten, aluminum, copper, neodymium, or scandium, or an alloy material which contains any of these materials as its main component.

Next, a gate insulating layer 322 is formed over the gate electrode layer 361.

An oxide semiconductor (a highly purified oxide semiconductor) which is made to be i-type or substantially i-type by removal of an impurity is highly sensitive to an interface state and interface electric charge; thus, an interface between the oxide semiconductor and a gate insulating layer is important. Therefore, the gate insulating layer (GI) which is in contact with the highly purified oxide semiconductor layer needs high quality.

For example, high-density plasma CVD using microwaves (2.45 GHz) is preferable because a dense high-quality insulating film having high withstanding voltage can be formed. This is because when the highly purified oxide semiconductor is closely in contact with the high-quality gate insulating film, the interface state can be reduced and interface properties can be favorable. Here, as a high-density plasma apparatus, an apparatus which can realize a plasma density of greater than or equal to $1 \times 10^{11}/cm^3$ can be used.

For example, plasma is generated by applying a microwave power of 3 kW to 6 kW, and the insulating film is formed. A monosilane gas ($SiH_4$), nitrous oxide ($N_2O$), and a rare gas are introduced into a chamber as a source gas to generate high-density plasma at a pressure of 10 Pa to 30 Pa, and the insulating film is formed over a substrate having an insulating surface, such as a glass substrate. After that, the supply of a monosilane gas is stopped, and nitrous oxide ($N_2O$) and a rare gas are introduced without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Needless to say, a different deposition method such as a sputtering method or a plasma CVD method can be used as long as a high-quality insulating film can be formed as the gate insulating layer 322. In addition, any insulating film can be used as long as film quality and properties of an interface with an oxide semiconductor of the gate insulating film are modified by heat treatment performed after deposition. In any case, any insulating film can be used as long as film quality as a gate insulating film is high, interface state density with an oxide semiconductor is decreased, and a favorable interface can be formed.

In a gate-bias thermal stress test (BT test) at 85° C. and $2 \times 10^6$ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a shift in the threshold voltage ($V_{th}$). As a countermeasure against this, in the transistor which is an embodiment of the present invention, the impurity in the oxide semiconductor, especially, hydrogen, water, or the like is removed as much as possible so that the properties of an interface with the gate insulating layer are favorable as described above. Accordingly, it is possible to obtain a thin film transistor which is stable with respect to the BT test.

As the gate insulating layer 322, a single layer or stacked layer can be formed using one or more of a silicon oxide layer, a silicon nitride layer, a silicon oxynitride layer (also referred to as $SiO_xN_y$, x>y>0), a silicon nitride oxide layer (also referred to as $SiN_xO_y$, x>y>0), and an aluminum oxide layer.

In addition, the gate insulating layer 322 can have a structure in which a silicon oxide layer and a silicon nitride layer are stacked. In this embodiment, for example, a silicon oxynitride layer with a thickness of 100 nm is formed by a high-density plasma CVD method with a pressure of 30 Pa and a microwave power of 6 kW. The flow ratio of a monosilane gas ($SiH_4$) to nitrous oxide ($N_2O$) which are introduced into the chamber is 1:10.

Next, an oxide semiconductor film is formed to a thickness of 2 nm to 200 nm inclusive over the gate insulating layer 322, and then, the oxide semiconductor film is processed into an island-shaped oxide semiconductor layer through a second photolithography step. In this embodiment, the oxide semiconductor film is formed by a sputtering method with the use of an In—Ga—Zn—O-based metal oxide target.

In that case, the oxide semiconductor film is preferably formed removing moisture remaining in the treatment chamber. This is for preventing hydrogen, a hydroxyl group, or moisture from being contained in the oxide semiconductor film.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, for example, a hydrogen atom, a compound containing a hydrogen atom, such as water ($H_2O$), and the like are removed, whereby the concentration of an impurity in the oxide semiconductor film formed in the deposition chamber can be reduced.

It is preferable to use a high-purity gas from which an impurity such as hydrogen, water, a hydroxyl group, or hydride is removed to a concentration of several ppm or a concentration of several ppb, as a sputtering gas when the oxide semiconductor film is formed.

Next, dehydration or dehydrogenation of the oxide semiconductor layer is performed. The temperature of first heat treatment for dehydration or dehydrogenation is greater than or equal to 400° C. and less than or equal to 750° C., preferably greater than or equal to 400° C. and less than the strain point of the substrate. In this embodiment, the substrate is put in an electric furnace which is a kind of heat treatment apparatus and heat treatment is performed on the oxide semiconductor layer in a nitrogen atmosphere at 450° C. for one hour, and then water or hydrogen is prevented from entering the oxide semiconductor layer. In this manner, an oxide semiconductor layer 332 is obtained (see FIG. 21A).

Next, plasma treatment is performed using a gas such as $N_2O$, $N_2$, or Ar. This plasma treatment removes water or the like adsorbed on a surface of the oxide semiconductor layer which is exposed. In addition, plasma treatment may be performed using a mixed gas of oxygen and argon.

Next, an oxide insulating layer is formed over the gate insulating layer 322 and the oxide semiconductor layer 332. After that, a resist mask is formed through a third photolithography step, the oxide insulating layer is selectively etched to form an oxide insulating layer 366, and then, the resist mask is removed.

In this embodiment, a 200-nm-thick silicon oxide film is deposited as the oxide insulating layer 366 by a sputtering method. The substrate temperature in film formation may be room temperature to 300° C. inclusive and is 100° C. in this embodiment. The silicon oxide film can be formed by a sputtering method under a rare gas (typically argon) atmosphere, an oxygen atmosphere, or an atmosphere containing a rare gas (typically argon) and oxygen. Moreover, a silicon oxide target or a silicon target can be used as a target. For example, the silicon oxide film can be formed by a sputtering method using a silicon target in an atmosphere containing oxygen and nitrogen. The oxide insulating layer 366 which is formed in contact with the oxide semiconductor layer in a region which is in an oxygen-deficient state and thus has a lower resistance, i.e., becomes n-type is formed using an inorganic insulating film that does not contain impurities such as moisture, a hydrogen ion, and OH⁻ and blocks entry of such impurities from the outside, typically, a silicon oxide film, a silicon oxynitride film, an aluminum oxide film, or an aluminum oxynitride film.

In that case, the oxide insulating layer 366 is preferably formed removing moisture remaining in the treatment chamber. This is for preventing hydrogen, a hydroxyl group, or moisture from being contained in the oxide semiconductor layer 332 and the oxide insulating layer 366.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, for example, a hydrogen atom, a compound containing a hydrogen atom, such as water ($H_2O$), and the like are removed, whereby the concentration of an impurity in the oxide insulating layer 366 formed in the deposition chamber can be reduced.

It is preferable to use a high-purity gas from which an impurity such as hydrogen, water, a hydroxyl group, or hydride is removed to a concentration of several ppm or a concentration of several ppb, as a sputtering gas when the oxide insulating layer 366 is formed.

Next, second heat treatment may be performed in an inert gas atmosphere or an oxygen gas atmosphere (preferably 200° C. to 400° C. inclusive, for example 250° C. to 350° C. inclusive). For example, the second heat treatment is performed in a nitrogen atmosphere at 250° C. for one hour. When the second heat treatment is performed, heat is applied while part of the oxide semiconductor layer (a channel formation region) is in contact with the oxide insulating layer 366.

In this embodiment, the oxide semiconductor layer 332 which is partly exposed by providing the oxide insulating layer 366 is further subjected to heat treatment in a nitrogen atmosphere or an inert gas atmosphere or under a reduced pressure. By the heat treatment in a nitrogen atmosphere or an inert gas atmosphere or under a reduced pressure, the resistance of the exposed region of the oxide semiconductor layer 332, which is not covered by the oxide insulating layer 366, can be decreased. For example, the heat treatment is performed at 250° C. in a nitrogen atmosphere for one hour.

With the heat treatment on the oxide semiconductor layer 332 provided with the oxide insulating layer 366 in a nitrogen atmosphere, the resistance of the exposed region of the oxide semiconductor layer 332 is decreased, so that an oxide semiconductor layer 362 including regions with different resistances (indicated as a shaded region and a white region in FIG. 21B) is formed.

Next, a conductive film is formed over the gate insulating layer 322, the oxide semiconductor layer 362, and the oxide insulating layer 366. After that, a resist mask is formed through a fourth photolithography step, the conductive film is selectively etched to form a source electrode layer 365a and a drain electrode layer 365b, and then, the resist mask is removed (see FIG. 21C).

As a material of the source and drain electrode layers 365a and 365b, an element selected from Al, Cr, Cu, Ta, Ti, Mo, and W; an alloy containing any of the above elements as its component; an alloy containing any of these elements in combination; and the like can be given. Further, the conductive film may have a single-layer structure or a stacked-layer structure of two or more layers.

Through the above steps, the oxide semiconductor layer comes to be in an oxygen-deficient state and thus has a lower resistance, that is, comes to be n-type when heat treatment for dehydration or dehydrogenation is performed on the formed oxide semiconductor film. Then, the oxide insulating layer is formed in contact with the oxide semiconductor layer. Accordingly, part of the oxide semiconductor layer is selectively in an oxygen excess state. As a result, the channel formation region 363 overlapping with the gate electrode layer 361 becomes i-type. At that time, a high-resistance source region 364a which has higher carrier concentration than at least the channel formation region 363 and overlaps with the source electrode layer 365a and a high-resistance drain region 364b which has higher carrier concentration than at least the channel formation region 363 and overlaps with the drain electrode layer 365b are formed in a self-aligned manner. Through the above steps, the thin film transistor 360 is formed.

Further, heat treatment may be performed at 100° C. to 200° C. inclusive for one hour to 30 hours inclusive in air. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed before formation of the oxide insulating film under a reduced pressure. When the heat treatment is performed under the reduced pressure, the heat treatment time can be shortened. With such heat treatment, hydrogen is introduced from the oxide semiconductor layer to the oxide insulating layer, thus, a normally-off thin film transistor can be obtained. Therefore, reliability of the thin film transistor can be improved.

By the formation of the high-resistance drain region 364b (or the high-resistance source region 364a) in part of the oxide semiconductor layer, which overlaps with the drain electrode layer 365b (or the source electrode layer 365a), reliability of the thin film transistor can be improved. Specifically, with the formation of the high-resistance drain region 364b, the conductivity can be gradually varied from the drain electrode layer 365b to the high-resistance drain region 364b and the channel formation region 363. Therefore, in the case where the thin film transistor operates with the drain electrode layer 365b connected to a wiring for supplying a high power supply potential VDD, the high-resistant drain region 364b serves as a buffer and a high electric field is not applied locally even if the high electric field is applied between the gate electrode layer 361 and the drain electrode layer 365b, so that the withstanding voltage of the transistor can be improved.

A protective insulating layer 323 is formed over the source electrode layer 365a, the drain electrode layer 365b, and the oxide insulating layer 366. In this embodiment, the protective insulating layer 323 is formed using a silicon nitride film (see FIG. 21D).

An oxide insulating layer may be formed over the source electrode layer 365a, the drain electrode layer 365b, and the oxide insulating layer 366, and the protective insulating layer 323 may be stacked over the oxide insulating layer.

With the above structure, the transistor can have stable electric characteristics and high reliability. Since leakage current is small in the transistor, by forming the voltage regulator circuit according to an embodiment of the present invention with the use of the transistor, a speed at which a desired voltage is achieved can be significantly increased. Further, when the voltage regulator circuit according to an embodiment of the present invention is formed with the use of the transistor, the voltage regulator circuit can have stable electric characteristics and high reliability.

The capacitor in the voltage regulator circuit according to an embodiment of the present invention can be formed through the same manufacturing steps as the transistor in this embodiment. When the transistor and the capacitor are formed through the same manufacturing steps, the number of manufacturing steps can be reduced.

Note that this embodiment can be implemented by being combined with any of other embodiments as appropriate.

Embodiment 10

In this embodiment, another example of a thin film transistor which can be used as a transistor included in the voltage regulator circuit disclosed in this specification will be described.

One embodiment of a thin film transistor and a manufacturing method of the thin film transistor of this embodiment is described with reference to FIGS. 22A to 22D.

A thin film transistor 350 is described using a single-gate thin film transistor, a multi-gate thin film transistor including a plurality of channel formation regions can be formed when needed.

A manufacturing process of the thin film transistor 350 over a substrate 340 is described below with reference to FIGS. 22A to 22D.

First, a conductive film is formed over the substrate 340 having an insulating surface, and a first photolithography step is performed thereon, so that a gate electrode layer 351 is formed. In this embodiment, a 150-nm-thick tungsten film is formed by a sputtering method as the gate electrode layer 351.

Next, a gate insulating layer 342 is formed over the gate electrode layer 351.

An oxide semiconductor (a highly purified oxide semiconductor) which is made to be i-type or substantially i-type by removal of an impurity is highly sensitive to an interface state and interface electric charge; thus, an interface between the oxide semiconductor and a gate insulating layer is important. Therefore, the gate insulating layer (GI) which is in contact with the highly purified oxide semiconductor needs high quality.

For example, high-density plasma CVD using microwaves (2.45 GHz) is preferable because a dense high-quality insulating film having high withstanding voltage can be formed. This is because when the highly purified oxide semiconductor is closely in contact with the high-quality gate insulating film, the interface state can be reduced and interface properties can be favorable. Here, as a high-density plasma apparatus, an apparatus which can realize a plasma density of greater than or equal to $1\times10^{11}/cm^3$ can be used.

For example, plasma is generated by applying a microwave power of 3 kW to 6 kW, and the insulating film is formed. A monosilane gas ($SiH_4$), nitrous oxide ($N_2O$), and a rare gas are introduced into a chamber as a source gas to generate high-density plasma at a pressure of 10 Pa to 30 Pa, and the insulating film is formed over a substrate having an insulating surface, such as a glass substrate. After that, the supply of a monosilane gas is stopped, and nitrous oxide ($N_2O$) and a rare gas are introduced without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

Needless to say, a different deposition method such as a sputtering method or a plasma CVD method can be used as long as a high-quality insulating film can be formed as the gate insulating layer 342. In addition, any insulating film can be used as long as film quality and properties of an interface with an oxide semiconductor of the gate insulating film are modified by heat treatment performed after deposition. In any case, any insulating film can be used as long as film quality as a gate insulating film is high, interface state density with an oxide semiconductor is decreased, and a favorable interface can be formed.

In a gate-bias thermal stress test (BT test) at 85° C. and $2\times10^6$ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a shift in the threshold voltage ($V_{th}$). As a countermeasure against this, in the transistor which is an embodiment of the present invention, the impurity in the oxide semiconductor, especially, hydrogen, water, or the like is removed as much as possible so that the properties of an interface with the gate insulating layer are favorable as described above. Accordingly, it is possible to obtain a thin film transistor which is stable with respect to the BT test.

As the gate insulating layer 342, a single layer or stacked layer can be formed using one or more of a silicon oxide layer, a silicon nitride layer, a silicon oxynitride layer (also referred to as $SiO_xN_y$, x>y>0), a silicon nitride oxide layer (also referred to as $SiN_xO_y$, x>y>0), and an aluminum oxide layer.

In addition, the gate insulating layer 342 can have a structure in which a silicon oxide layer and a silicon nitride layer are stacked. In this embodiment, for example, a silicon oxynitride layer with a thickness of 100 nm is formed by a high-density plasma CVD method with a pressure of 30 Pa and a microwave power of 6 kW. The flow ratio of a monosilane gas ($SiH_4$) to nitrous oxide ($N_2O$) which are introduced into the chamber is 1:10.

Next, a conductive film is formed over the gate insulating layer 342. After that, a resist mask is formed over the conductive film through a second photolithography step, the conductive film is selectively etched to form a source electrode layer 355a and a drain electrode layer 355b, and then, the resist mask is removed (see FIG. 22A).

Figure 22A:
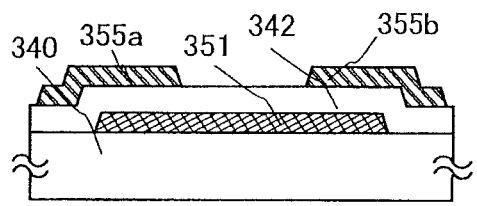
FIGS. 22A to 22D are cross-sectional views illustrating a method for manufacturing a transistor.
Figure 22B:
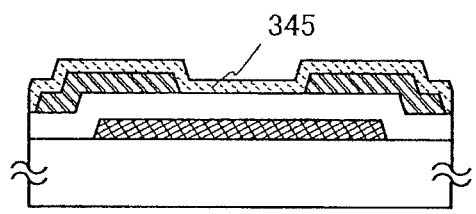
Figure 22C:
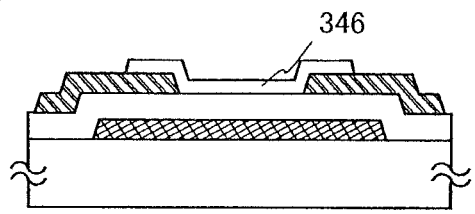
Figure 22D:
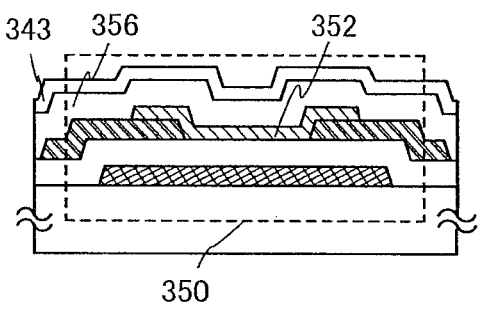

Next, an oxide semiconductor film 345 is formed (see FIG. 22B). In this embodiment, the oxide semiconductor film 345 is formed by a sputtering method with the use of an In—Ga—Zn—O-based metal oxide target. The oxide semiconductor film 345 is processed into an island-shaped oxide semiconductor layer through a third photolithography step.

In that case, the oxide semiconductor film 345 is preferably formed removing moisture remaining in the treatment chamber. This is for preventing hydrogen, a hydroxyl group, or moisture from being contained in the oxide semiconductor film 345.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, for example, a hydrogen atom, a compound containing a hydrogen atom, such as water ($H_2O$), and the like are removed, whereby the concentration of an impurity in the oxide semiconductor film 345 formed in the deposition chamber can be reduced.

It is preferable to use a high-purity gas from which an impurity such as hydrogen, water, a hydroxyl group, or hydride is removed to a concentration of several ppm or a concentration of several ppb, as a sputtering gas when the oxide semiconductor film 345 is formed.

Next, dehydration or dehydrogenation of the oxide semiconductor layer is performed. The temperature of first heat treatment for dehydration or dehydrogenation is greater than or equal to 400° C. and less than or equal to 750° C., preferably greater than or equal to 400° C. and less than the strain point of the substrate. In this embodiment, the substrate is put in an electric furnace which is a kind of heat treatment apparatus and heat treatment is performed on the oxide semiconductor layer in a nitrogen atmosphere at 450° C. for one hour, and then water or hydrogen is prevented from entering the oxide semiconductor layer. In this manner, an oxide semiconductor layer 346 is obtained (see FIG. 22C).

For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment for a short time.

Next, an oxide insulating layer 356 serving as a protective insulating film is formed in contact with the oxide semiconductor layer 346.

The oxide insulating layer 356 has a thickness of at least 1 nm and can be formed by a method by which an impurity such as water or hydrogen does not enter the oxide insulating layer 356, such as a sputtering method, as appropriate. When hydrogen is contained in the oxide insulating layer 356, entry of the hydrogen to the oxide semiconductor layer or extraction of oxygen in the oxide semiconductor layer by the hydrogen is caused, thereby making the resistance of the back channel of the oxide semiconductor layer low (n-type), so that a parasitic channel could be formed. Therefore, it is important that a formation method in which hydrogen is not used is employed such that the oxide insulating layer 356 contains hydrogen as little as possible.

In this embodiment, a 200-nm-thick silicon oxide film is deposited as the oxide insulating layer 356 by a sputtering method. The substrate temperature in film formation may be room temperature to 300° C. inclusive and is 100° C. in this embodiment. The silicon oxide film can be formed by a sputtering method under a rare gas (typically argon) atmosphere, an oxygen atmosphere, or an atmosphere containing a rare gas (typically argon) and oxygen. Moreover, a silicon oxide target or a silicon target can be used as a target. For example, the silicon oxide film can be formed by a sputtering method using a silicon target in an atmosphere containing oxygen and nitrogen. The oxide insulating layer 356 which is formed in contact with the oxide semiconductor layer which is changed into an oxygen-deficient state and has lower resistance, that is, becomes an n-type oxide semiconductor layer is formed using an inorganic insulating film that does not contain an impurity such as moisture, a hydrogen ion, or OH⁻ and blocks entry of such impurity from the outside, typically a silicon oxide film, a silicon oxynitride oxide film, an aluminum oxide film, or an aluminum oxynitride film.

In that case, the oxide insulating layer 356 is preferably formed removing moisture remaining in the treatment chamber. This is for preventing hydrogen, a hydroxyl group, or moisture from being contained in the oxide semiconductor layer 346 and the oxide insulating layer 356.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, for example, a hydrogen atom, a compound containing a hydrogen atom, such as water ($H_2O$), and the like are removed, whereby the concentration of an impurity in the oxide insulating layer 356 formed in the deposition chamber can be reduced.

It is preferable to use a high-purity gas from which an impurity such as hydrogen, water, a hydroxyl group, or hydride is removed to a concentration of several ppm or a concentration of several ppb, as a sputtering gas when the oxide insulating layer 356 is formed.

Next, second heat treatment (preferably at 200° C. to 400° C. inclusive, for example, 250° C. to 350° C. inclusive) is performed in an inert gas atmosphere or an oxygen gas atmosphere. For example, the second heat treatment is performed in a nitrogen atmosphere at 250° C. for one hour. When the second heat treatment is performed, heat is applied while the oxide semiconductor layer is in contact with the oxide insulating layer 356.

As described above, by performing heat treatment for dehydration or dehydrogenation, the oxide semiconductor layer is made to be in an oxygen-deficient state, and thus, the oxide semiconductor layer becomes lower-resistance type, that is, n-type. When the oxide insulating layer is formed in contact with the oxide semiconductor layer, the oxide semiconductor layer is made to be in an oxygen-excess state. As a result, a high-resistance i-type oxide semiconductor layer 352 is formed. Though the above-described steps, the thin film transistor 350 is formed.

Furthermore, the heat treatment may be performed at 100° C. to 200° C. inclusive for one hour to 30 hours inclusive in air. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. When the heat treatment is performed under the reduced pressure, the heat treatment time can be shortened. With such heat treatment, hydrogen is introduced from the oxide semiconductor layer to the oxide insulating layer; thus, a normally-off thin film transistor can be obtained. Therefore, reliability of the thin film transistor can be improved.

A protective insulating layer may be formed over the oxide insulating layer 356. For example, a silicon nitride film is formed by an RF sputtering method. In this embodiment, a protective insulating layer 343 is formed using a silicon nitride film as the protective insulating layer (see FIG. 22D).

A planarization insulating layer for planarization may be provided over the protective insulating layer 343.

With the above structure, the transistor can have stable electric characteristics and high reliability. Since leakage current is small in the transistor, by forming the voltage regulator circuit according to an embodiment of the present invention with the use of the transistor, a speed at which a desired voltage is achieved can be significantly increased. Further, when the voltage regulator circuit according to an embodiment of the present invention is formed with the use of the transistor, the voltage regulator circuit can have stable electric characteristics and high reliability.

The capacitor in the voltage regulator circuit according to an embodiment of the present invention can be formed through the same manufacturing steps as the transistor in this embodiment. When the transistor and the capacitor are formed through the same manufacturing steps, the number of manufacturing steps can be reduced.

This embodiment can be implemented by being combined with any of other embodiments as appropriate.

Embodiment 11

In this embodiment, another example of a thin film transistor which can be applied to a transistor included in the voltage regulator circuit disclosed in this specification will be described.

Figure 23:
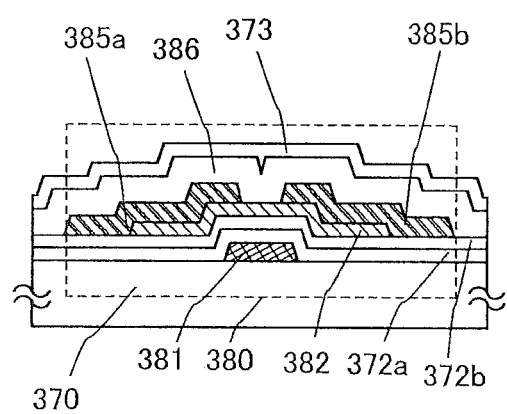
FIG. 23 is a cross-sectional view illustrating a transistor.

In this embodiment, an example which is partly different from Embodiment 8 in manufacturing process of a thin film transistor will be described with reference to FIG. 23. FIG. 23 is the same as FIGS. 20A to 20E except for part of the steps. Thus, the same parts as in FIGS. 20A to 20E are denoted by the same reference numerals and detailed description on the parts is omitted.

First, a gate electrode layer 381 is formed over a substrate 370, and a first gate insulating layer 372a and a second gate insulating layer 372b are stacked thereover. In this embodiment, a gate insulating layer has a two layer structure in which a nitride insulating layer and an oxide insulating layer are used as the first gate insulating layer 372a and the second gate insulating layer 372b, respectively.

As the oxide insulating layer, a silicon oxide layer, a silicon oxynitride layer, an aluminum oxide layer, an aluminum oxynitride layer, or the like may be used. As the nitride insulating layer, a silicon nitride layer, a silicon nitride oxide layer, an aluminum nitride layer, an aluminum nitride oxide layer, or the like may be used.

In this embodiment, the gate insulating layer may have a structure where a silicon nitride layer and a silicon oxide layer are stacked from the gate electrode layer 381 side. A silicon nitride layer ($SiN_y$ ($y>0$)) with a thickness of 50 nm to 200 nm inclusive (50 nm in this embodiment) is formed by a sputtering method as the first gate insulating layer 372a and a silicon oxide layer ($SiO_x$ ($x>0$)) with a thickness of 5 nm to 300 nm inclusive (100 nm in this embodiment) is stacked as the second gate insulating layer 372b over the first gate insulating layer 372a; thus, the gate insulating layer with a thickness of 150 nm is formed.

Next, an oxide semiconductor film is formed and is processed into an island-shaped oxide semiconductor layer through a photolithography step. In this embodiment, the oxide semiconductor film is formed by a sputtering method with the use of an In—Ga—Zn—O-based metal oxide target.

In that case, the oxide semiconductor film is preferably formed removing moisture remaining in the treatment chamber. This is for preventing hydrogen, a hydroxyl group, or moisture from being contained in the oxide semiconductor film.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, for example, a hydrogen atom, a compound containing a hydrogen atom, such as water ($H_2O$), and the like are removed, whereby the concentration of an impurity in the oxide semiconductor film formed in the deposition chamber can be reduced.

It is preferable to use a high-purity gas from which an impurity such as hydrogen, water, a hydroxyl group, or hydride is removed to a concentration of several ppm or a concentration of several ppb, as a sputtering gas when the oxide semiconductor film is formed.

Next, dehydration or dehydrogenation of the oxide semiconductor layer is performed. The temperature of first heat treatment at which dehydration or dehydrogenation is performed is 400° C. to 750° C. inclusive, preferably 425° C. to 750° C. inclusive. Note that in the case where the temperature is greater than or equal to 425° C., the heat treatment time may be one hour or less, whereas in the case where the temperature is lower than 425° C., the heat treatment time is longer than one hour. Here, the substrate is put in an electric furnace, which is a kind of heat treatment apparatus, and heat treatment of the oxide semiconductor layer is performed in a nitrogen atmosphere. Then, water or hydrogen is prevented from entering the oxide semiconductor layer. After that, cooling is performed by introduction of a high-purity oxygen gas, a high-purity $N_2O$ gas, or ultra-dry air (having a dew point of less than or equal to −40° C., preferably less than or equal to −60° C.) into the same furnace. It is preferable that water, hydrogen, or the like be not contained in an oxygen gas or a $N_2O$ gas. Alternatively, the purity of an oxygen gas or a $N_2O$ gas which is introduced into the heat treatment apparatus is greater than or equal to 6 N (99.9999%), preferably greater than or equal to 7 N (99.99999%) (i.e., the impurity concentration of the oxygen gas or the $N_2O$ gas is less than or equal to 1 ppm, preferably less than or equal to 0.1 ppm).

The heat treatment apparatus is not limited to the electric furnace, and for example may be an RTA (rapid thermal annealing) apparatus such as a GRTA (gas rapid thermal annealing) apparatus or an LRTA (lamp rapid thermal annealing) apparatus. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. In addition, without limitation to an LRTA apparatus and a lamp, a device that heats the product to be processed by thermal conduction or thermal radiation from a heater such as a resistance heater may be used. GRTA is a method for performing heat treatment using a high-temperature gas. As the gas, an inert gas which does not react with an object to be processed by heat treatment, for example, nitrogen or a rare gas such as argon, is used. The heat treatment may be performed at 600° C. to 750° C. for several minutes using an RTA method.

In addition, after the first heat treatment for dehydration or dehydrogenation, heat treatment may be performed at 200° C. to 400° C. inclusive, preferably 200° C. to 300° C. inclusive in an oxygen gas atmosphere or an $N_2O$ gas atmosphere.

The first heat treatment for the oxide semiconductor layer can be performed before the oxide semiconductor film is processed into the island-shaped oxide semiconductor layer. In that case, the substrate is taken out of the heat treatment apparatus after the first heat treatment, and then a photolithography step is performed.

The entire oxide semiconductor film is made to contain an excess amount of oxygen through the above steps, whereby the oxide semiconductor film has higher resistance, that is, becomes i-type. Accordingly, an oxide semiconductor layer 382 whose entire region has i-type conductivity is formed.

Next, a conductive film is formed over the oxide semiconductor layer 382, a resist mask is formed by a photolithography step, and the conductive film is selectively etched to form a source electrode layer 385a and a drain electrode layer 385b, and then, an oxide insulating layer 386 is formed by a sputtering method.

In that case, the oxide insulating layer 386 is preferably formed removing moisture remaining in the treatment chamber. This is for preventing hydrogen, a hydroxyl group, or moisture from being contained in the oxide semiconductor layer 382 and the oxide insulating layer 386.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, for example, a hydrogen atom, a compound containing a hydrogen atom, such as water ($H_2O$), and the like are removed, whereby the concentration of an impurity in the oxide insulating layer 386 formed in the deposition chamber can be reduced.

It is preferable to use a high-purity gas from which an impurity such as hydrogen, water, a hydroxyl group, or hydride is removed to a concentration of several ppm or a concentration of several ppb, as a sputtering gas when the oxide insulating layer 386 is formed.

Through the above-described steps, the thin film transistor 380 can be formed.

Next, in order to reduce variation in electric characteristics of the thin film transistor, heat treatment (preferably at greater than or equal to 150° C. and less than 350° C.) may be performed in an inert gas atmosphere or a nitrogen gas atmosphere. For example, the heat treatment is performed at 250° C. in a nitrogen atmosphere for one hour.

Furthermore, the heat treatment may be performed at 100° C. to 200° C. inclusive for one hour to 30 hours inclusive in air. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. When the heat treatment is performed under the reduced pressure, the heat treatment time can be shortened. With such heat treatment, hydrogen is introduced from the oxide semiconductor layer to the oxide insulating layer; thus, a normally-off thin film transistor can be obtained. Therefore, reliability of the thin film transistor can be improved.

A protective insulating layer 373 is formed over the oxide insulating layer 386. In this embodiment, as the protective insulating layer 373, a silicon nitride film with a thickness of 100 nm is formed by a sputtering method.

The protective insulating layer 373 and the first gate insulating layer 372a each formed using a nitride insulating layer do not contain impurities such as moisture, hydrogen, hydride, and hydroxide and have an effect of blocking entry of these from the outside.

Therefore, in a manufacturing process after the formation of the protective insulating layer 373, entry of an impurity such as moisture from the outside can be prevented, so that the reliability of the device can be improved.

Further, part of the insulating layers between the protective insulating layer 373 formed using a nitride insulating layer and the first gate insulating layer 372a may be removed so that the protective insulating layer 373 and the first gate insulating layer 372a may be in contact with each other.

Accordingly, impurities such as moisture, hydrogen, hydride, and hydroxide in the oxide semiconductor layer are reduced as much as possible and entry of such impurities is prevented, so that the concentration of impurities in the oxide semiconductor layer can be maintained to be low.

A planarization insulating layer for planarization may be provided over the protective insulating layer 373.

Further, a conductive layer may be formed so as to overlap with the oxide semiconductor layer, over the protective insulating layer 373. A potential of the conductive layer may be the same as or different from that of the gate electrode layer 381 of the thin film transistor 380. The conductive layer can also function as a second gate electrode layer. The potential of the conductive layer may be a fixed potential such as GND or 0 V.

Electric characteristics of the thin film transistor 380 can be controlled by the conductive layer.

With the above structure, the transistor can have stable electric characteristics and high reliability. Since leakage current is small in the transistor, by forming the voltage regulator circuit according to an embodiment of the present invention with the use of the transistor, a speed at which a desired voltage is achieved can be significantly increased. Further, when the voltage regulator circuit according to an embodiment of the present invention is formed with the use of the transistor, the voltage regulator circuit can have stable electric characteristics and high reliability.

Note that this embodiment can be implemented by being combined with any of other embodiments as appropriate.

Embodiment 12

In this embodiment, examples of an electronic device to which the voltage regulator circuit according to an embodiment of the present invention can be applied will be described with reference to FIGS. 24A and 24B.

Figure 24A:
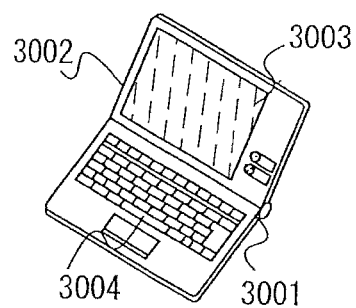
FIGS. 24A and 24B are external views each illustrating an electronic device.

FIG. 24A illustrates a laptop personal computer, which includes a main body 3001, a housing 3002, a display portion 3003, a keyboard 3004, and the like. The voltage regulator circuit described in any of Embodiments 1 to 3 can be used to generate a power supply voltage which is supplied to the laptop personal computer illustrated in FIG. 24A.

Figure 24B:
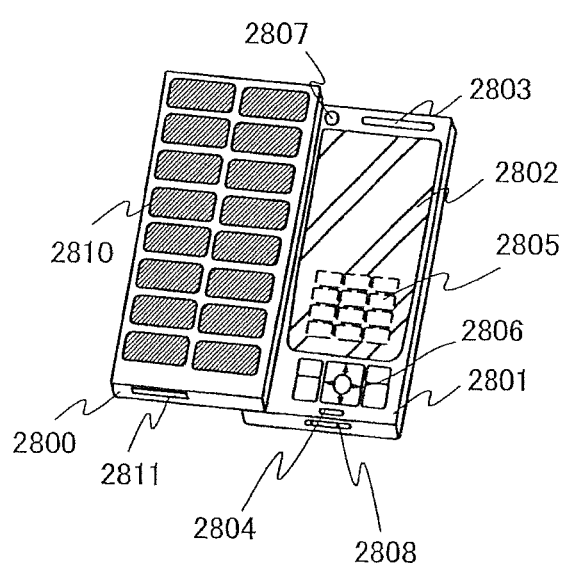

FIG. 24B illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2800 includes a solar cell 2810 for charging of the portable phone, an external memory slot 2811, and the like. Further, an antenna is incorporated in the housing 2801.

Further, the display panel 2802 is provided with a touch panel. A plurality of operation keys 2805 which are displayed as images are illustrated by dashed lines in FIG. 24B. In the mobile phone illustrated in FIG. 24B, the step-up circuit (the voltage regulator circuit described in any of Embodiments 1 to 3) is mounted in order to step up a voltage which is output from the solar cell 2810 to a voltage which is necessary for each circuit.

As described above, the voltage regulator circuit which is an embodiment of the present invention can be applied to a variety of electronic devices and can efficiently supply power supply voltage to the electronic device.

Note that this embodiment can be combined with any of other embodiments as appropriate.

This application is based on Japanese Patent Application serial no. 2009-242758 filed with Japan Patent Office on Oct. 21, 2009 and Japanese Patent Application serial no. 2010-012617 filed with Japan Patent Office on Jan. 22, 2010, the entire contents of which are hereby incorporated by reference.

The invention claimed is:

1. A semiconductor device comprising:
a transistor including a channel formation region, a gate, a source, and a drain, the channel formation region comprising an oxide semiconductor material, wherein an off current of the transistor is less than or equal to 100 zA/μm at a temperature of 85° C.; and
a capacitor including a first electrode and a second electrode, wherein the first electrode is electrically connected to one of the source and the drain of the transistor.

2. The semiconductor device according to claim 1, wherein the off current of the transistor is less than or equal to 10 zA/μm.

3. The semiconductor device according to claim 1, wherein a carrier concentration of the oxide semiconductor material is less than or equal to $5 \times 10^{14}/cm^3$.

4. The semiconductor device according to claim 1, wherein the oxide semiconductor material comprises gallium, indium and zinc.

5. The semiconductor device according to claim 1, wherein the semiconductor device is a voltage regulator circuit.

6. The semiconductor device according to claim 1, wherein the oxide semiconductor material is an In—Ga—Zn—O based oxide semiconductor.

7. A semiconductor device comprising:
a first transistor and a second transistor, each of the first transistor and the second transistor including a channel formation region, a gate, a source, and a drain, the channel formation region comprising an oxide semiconductor material, wherein an off current of the first transistor and the second transistor is less than or equal to 100 zA/μm at a temperature of 85° C.;
a first capacitor; and
a second capacitor,
wherein the gate of the first transistor is electrically connected to one of the source and the drain of the first transistor,
wherein a first electrode of the first capacitor is electrically connected to the other of the source and the drain of the first transistor,
wherein the other of the source and the drain of the first transistor is electrically connected to the gate of the second transistor and one of the source and the drain of the second transistor, and
wherein a first electrode of the second capacitor is electrically connected to the other of the source and the drain of the second transistor.

8. The semiconductor device according to claim 7, wherein the off current of the first transistor and the second transistor is less than or equal to 10 zA/μm.

9. The semiconductor device according to claim 7, wherein a carrier concentration of the oxide semiconductor material is less than or equal to $5 \times 10^{14}/cm^3$.

10. The semiconductor device according to claim 7, wherein the semiconductor device is a voltage regulator circuit.

11. The semiconductor device according to claim 7, wherein the oxide semiconductor material is an In—Ga—Zn—O based oxide semiconductor.

12. A semiconductor device comprising:
a transistor including a channel formation region, a gate, a source, and a drain, the channel formation region comprising an oxide semiconductor material, wherein an off current of the transistor is less than or equal to 100 zA/μm at a temperature of 85° C.; and
a capacitor including a first electrode and a second electrode, wherein the first electrode is electrically connected to one of the source and the drain of the transistor,
wherein a concentration of hydrogen contained in the oxide semiconductor material is less than or equal to $5 \times 10^{19}/cm^3$.

13. The semiconductor device according to claim 12, wherein the off current of the transistor is less than or equal to 10 zA/μm.

14. The semiconductor device according to claim 12, wherein a carrier concentration of the oxide semiconductor material is less than or equal to $5 \times 10^{14}/cm^3$.

15. The semiconductor device according to claim 12, wherein the semiconductor device is a voltage regulator circuit.

16. The semiconductor device according to claim 12, wherein the oxide semiconductor material is an In—Ga—Zn—O based oxide semiconductor.

17. The semiconductor device according to claim 12, wherein the oxide semiconductor material comprises gallium, indium and zinc.

* * * * *